(12) United States Patent
Gilchrist et al.

(10) Patent No.: US 9,230,841 B2
(45) Date of Patent: Jan. 5, 2016

(54) SUBSTRATE PROCESSING APPARATUS

(71) Applicant: Brooks Automation, Inc., Chelmsford, MA (US)

(72) Inventors: Ulysses Gilchrist, Reading, MA (US); Robert T. Caveney, Windham, NH (US); Jayaraman Krishnasamy, Billerica, MA (US); Mitchell Drew, Rye, NH (US); Jairo T. Moura, Marlboro, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 14/579,067

(22) Filed: Dec. 22, 2014

(65) Prior Publication Data

US 2015/0110584 A1     Apr. 23, 2015

Related U.S. Application Data

(63) Continuation of application No. 13/417,837, filed on Mar. 12, 2012, now Pat. No. 8,918,203.

(60) Provisional application No. 61/451,912, filed on Mar. 11, 2011.

(51) Int. Cl.
    *G06F 7/00*        (2006.01)
    *H01L 21/677*    (2006.01)
    *B25J 9/04*        (2006.01)
      (Continued)

(52) U.S. Cl.
CPC ........... *H01L 21/67706* (2013.01); *B25J 9/042* (2013.01); *B25J 9/043* (2013.01); *B25J 11/0095* (2013.01); *B25J 18/04* (2013.01); *H01L 21/67742* (2013.01); *Y10S 901/15* (2013.01); *Y10S 901/27* (2013.01); *Y10T 74/20305* (2015.01); *Y10T 74/20329* (2015.01)

(58) Field of Classification Search
USPC ......................................................... 700/228
See application file for complete search history.

(56) References Cited

U.S. PATENT DOCUMENTS

| 4,365,527 A | 12/1982 | Kruse |
| 4,597,708 A | 7/1986 | Wheeler et al. |
| 4,823,629 A | 4/1989 | Ha |

(Continued)

FOREIGN PATENT DOCUMENTS

| JP | 2011016981 | 1/1999 |
| JP | 2002158272 | 5/2002 |

(Continued)

*Primary Examiner* — Kyle Logan
(74) *Attorney, Agent, or Firm* — Perman & Green, LLP; Colin C. Durham

(57) ABSTRACT

A substrate processing apparatus including a frame, a first SCARA arm connected to the frame, including an end effector, configured to extend and retract along a first radial axis; a second SCARA arm connected to the frame, including an end effector, configured to extend and retract along a second radial axis, the SCARA arms having a common shoulder axis of rotation; and a drive section coupled to the SCARA arms is configured to independently extend each SCARA arm along a respective radial axis and rotate each SCARA arm about the common shoulder axis of rotation where the first radial axis is angled relative to the second radial axis and the end effector of a respective arm is aligned with a respective radial axis, wherein each end effector is configured to hold at least one substrate and the end effectors are located on a common transfer plane.

29 Claims, 48 Drawing Sheets

(51) Int. Cl.
*B25J 11/00* (2006.01)
*B25J 18/04* (2006.01)

(56) References Cited

U.S. PATENT DOCUMENTS

| | | | |
|---|---|---|---|
| 5,151,008 A | 9/1992 | Ishida et al. | |
| 5,209,765 A | 5/1993 | Kolpak et al. | |
| 5,332,375 A | 7/1994 | Kuechler | |
| 5,713,717 A | 2/1998 | Cho | |
| 5,899,658 A | 5/1999 | Hofmeister | |
| 6,205,368 B1 | 3/2001 | Hirahara et al. | |
| 6,275,748 B1 | 8/2001 | Bacchi et al. | |
| 6,360,144 B1 | 3/2002 | Bacchi et al. | |
| 6,364,599 B1 | 4/2002 | Suwa et al. | |
| 6,450,755 B1 | 9/2002 | Cameron et al. | |
| 6,485,250 B2 | 11/2002 | Hofmeister | |
| 6,547,510 B1 * | 4/2003 | Beaulieu | 414/744.5 |
| 6,705,177 B2 | 3/2004 | Okuno et al. | |
| 6,746,195 B2 | 6/2004 | Shirai | |
| 7,114,907 B2 | 10/2006 | Ogawa et al. | |
| 7,244,088 B2 | 7/2007 | Lero et al. | |
| 7,458,763 B2 | 12/2008 | van der Meulen | |
| 7,563,068 B2 | 7/2009 | Niewmierzycki et al. | |
| 7,578,649 B2 | 8/2009 | Caveney et al. | |
| 7,618,226 B2 | 11/2009 | Takizawa et al. | |
| 7,645,112 B2 | 1/2010 | Minami et al. | |
| 7,837,425 B2 | 11/2010 | Saeki et al. | |
| 7,891,935 B2 | 2/2011 | Kremerman | |
| 7,946,800 B2 | 5/2011 | Hosek et al. | |
| 2002/0098072 A1 | 7/2002 | Sundar | |
| 2004/0001750 A1 * | 1/2004 | Kremerman | 414/744.1 |
| 2004/0050670 A1 | 3/2004 | Davis | |
| 2004/0199287 A1 | 10/2004 | Hosek et al. | |
| 2004/0240971 A1 * | 12/2004 | Tezuka et al. | 414/217 |
| 2005/0118010 A1 | 6/2005 | Ogawa et al. | |
| 2005/0217053 A1 | 10/2005 | Kim et al. | |
| 2006/0099063 A1 | 5/2006 | Pietrantonio et al. | |
| 2006/0210387 A1 | 9/2006 | Saeki et al. | |
| 2006/0245905 A1 | 11/2006 | Hudgens | |
| 2007/0071581 A1 * | 3/2007 | Gilchrist et al. | 414/217 |
| 2007/0116549 A1 | 5/2007 | Rice et al. | |
| 2007/0142962 A1 | 6/2007 | Takizawa et al. | |
| 2008/0019816 A1 | 1/2008 | Sato | |
| 2008/0063504 A1 | 3/2008 | Kroetz et al. | |
| 2008/0260500 A1 | 10/2008 | Meulen | |
| 2008/0298945 A1 | 12/2008 | Cox et al. | |
| 2009/0087288 A1 | 4/2009 | Hofmeister et al. | |
| 2010/0178135 A1 | 7/2010 | Laceky et al. | |
| 2010/0178147 A1 | 7/2010 | Kremerman et al. | |
| 2011/0113899 A1 | 5/2011 | Dahler et al. | |
| 2011/0120253 A1 | 5/2011 | Tara et al. | |
| 2011/0135437 A1 | 6/2011 | Takeshita et al. | |

FOREIGN PATENT DOCUMENTS

| | | |
|---|---|---|
| JP | 2002172571 | 6/2002 |
| JP | 2005189259 | 7/2005 |
| JP | 2007130733 | 5/2007 |
| JP | 2008272864 | 11/2008 |

* cited by examiner

DUAL EXTEND OR RETRACT

STATION THETA

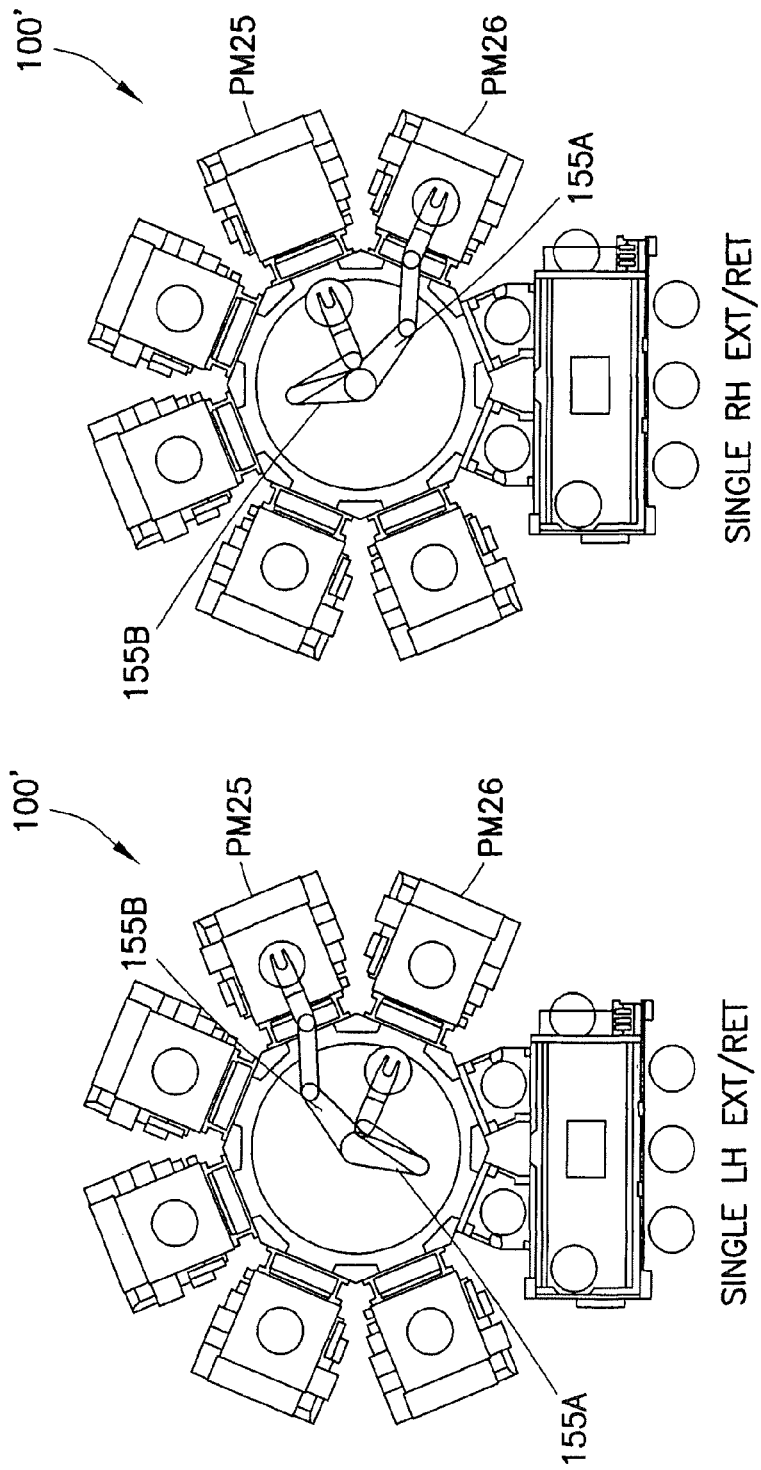
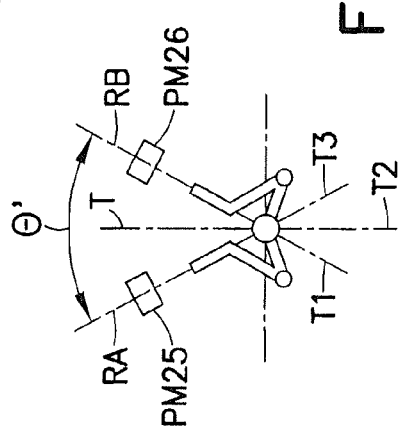
FIG.2J SINGLE RH EXT/RET
FIG.2I SINGLE LH EXT/RET
FIG.2F

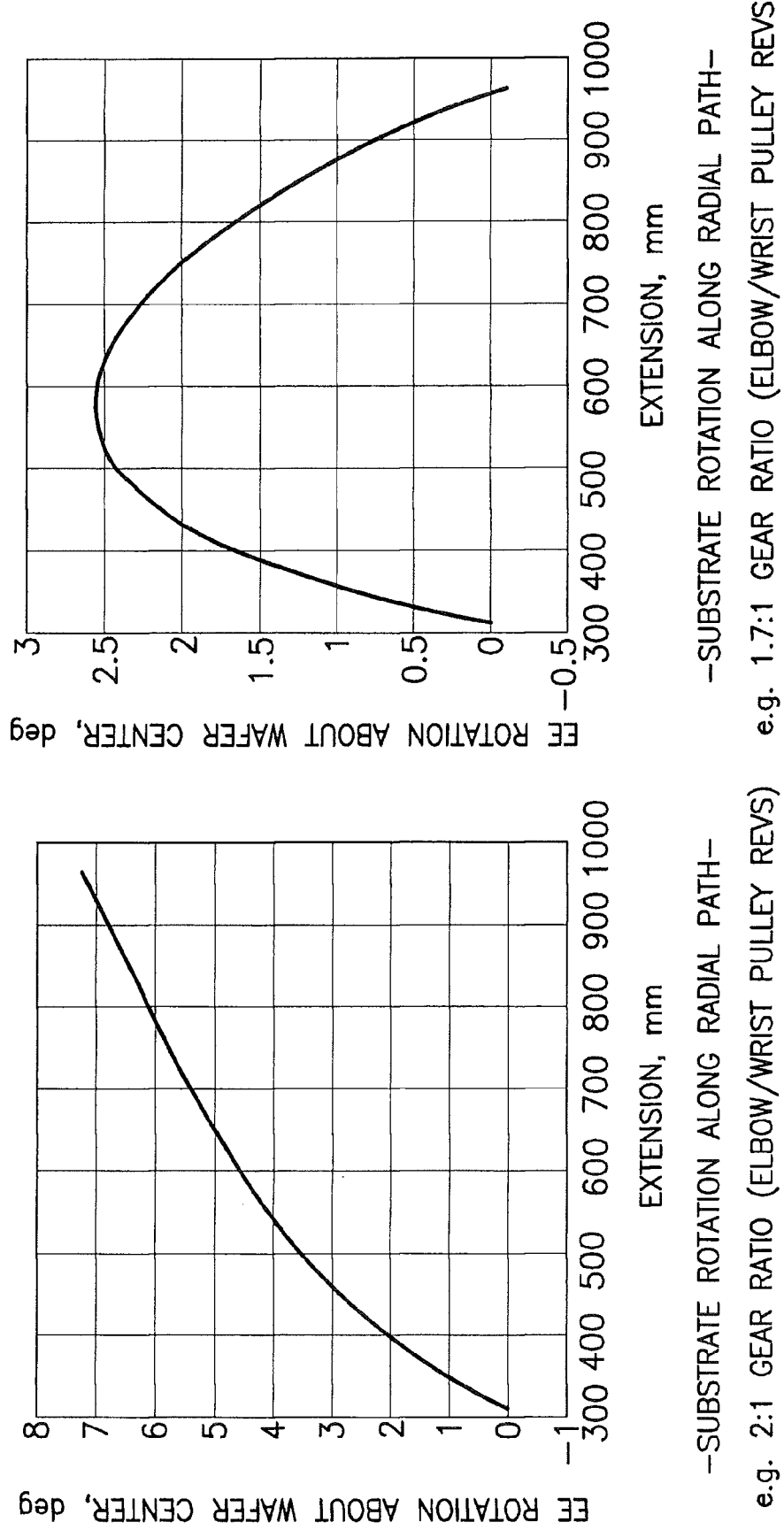

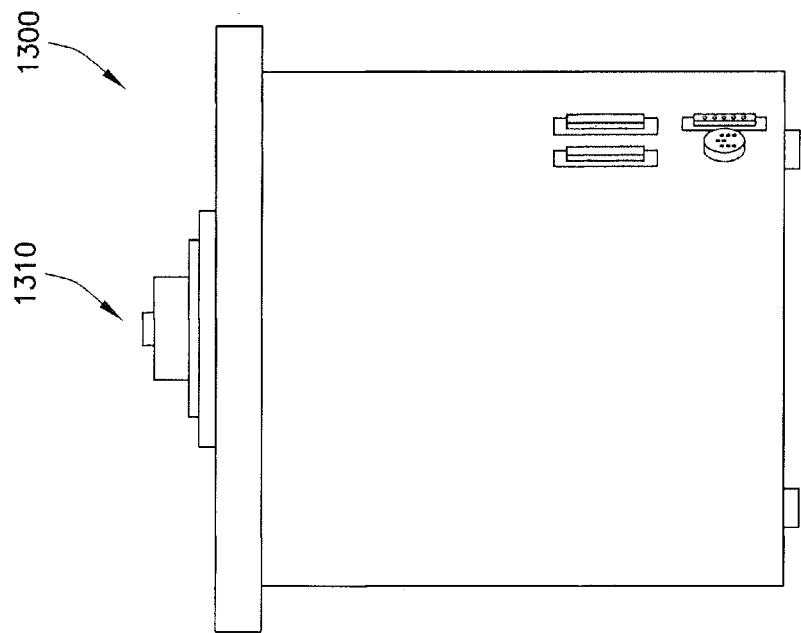
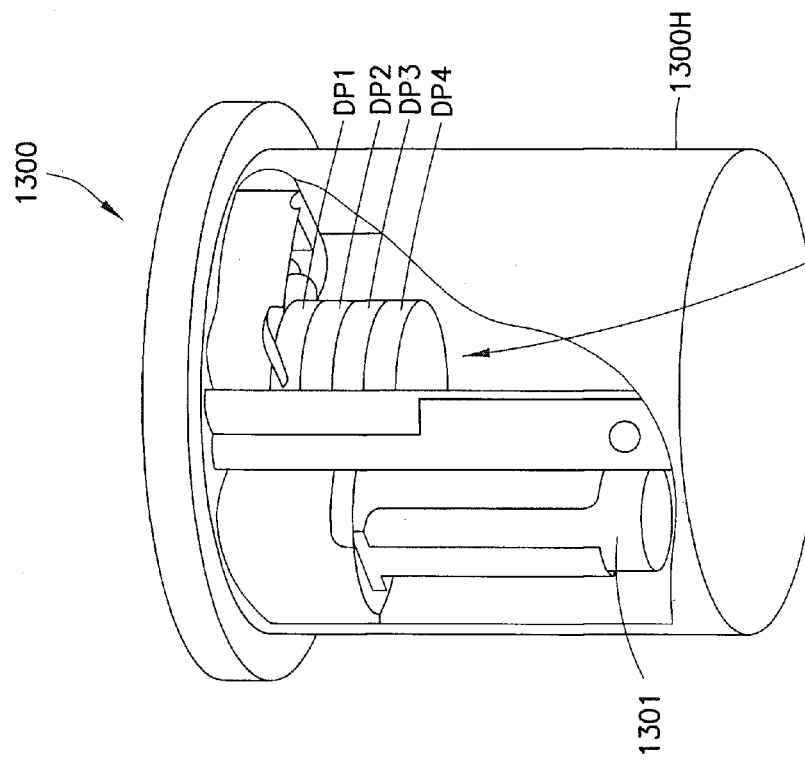
FIG.3D
FIG.3C

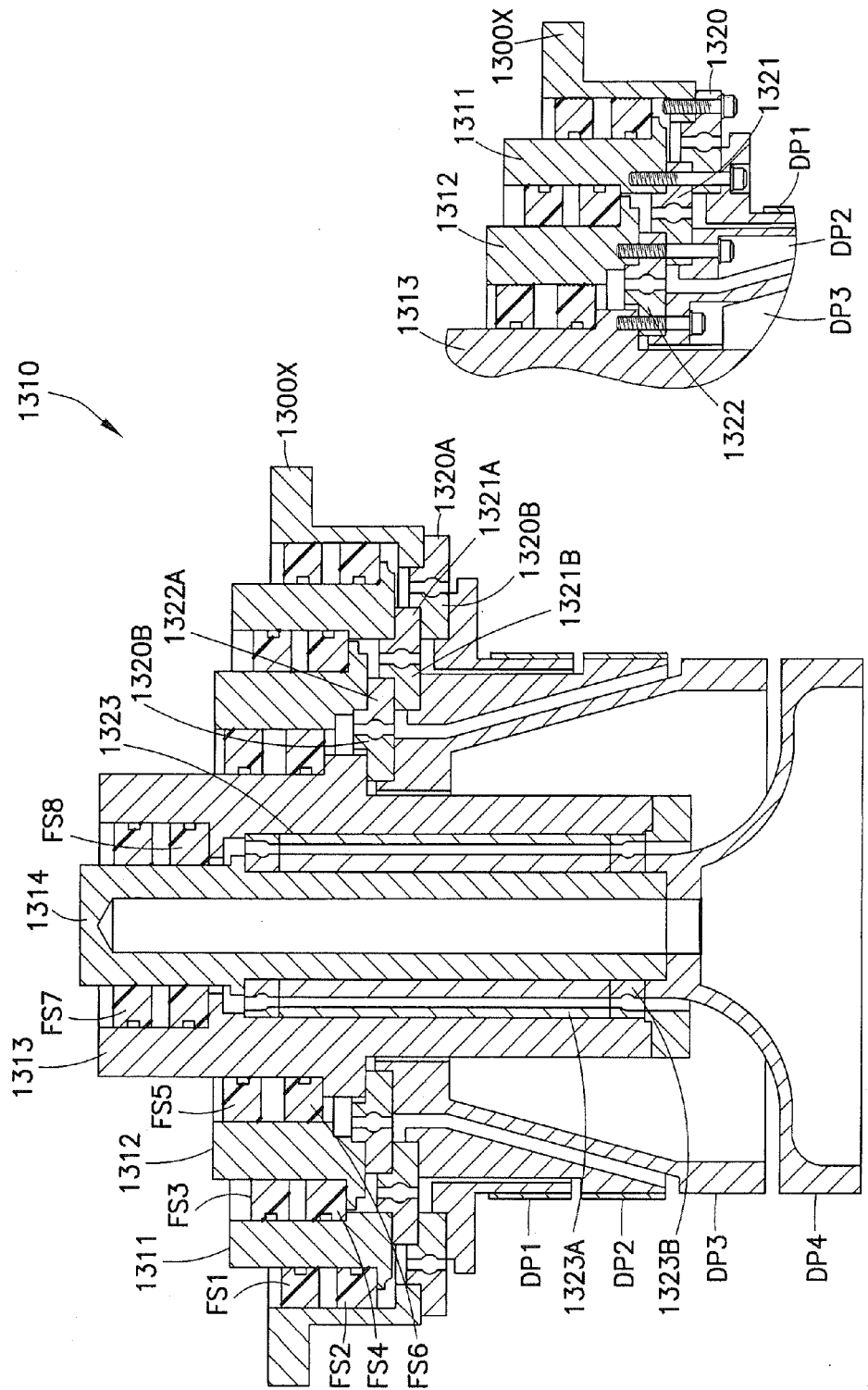

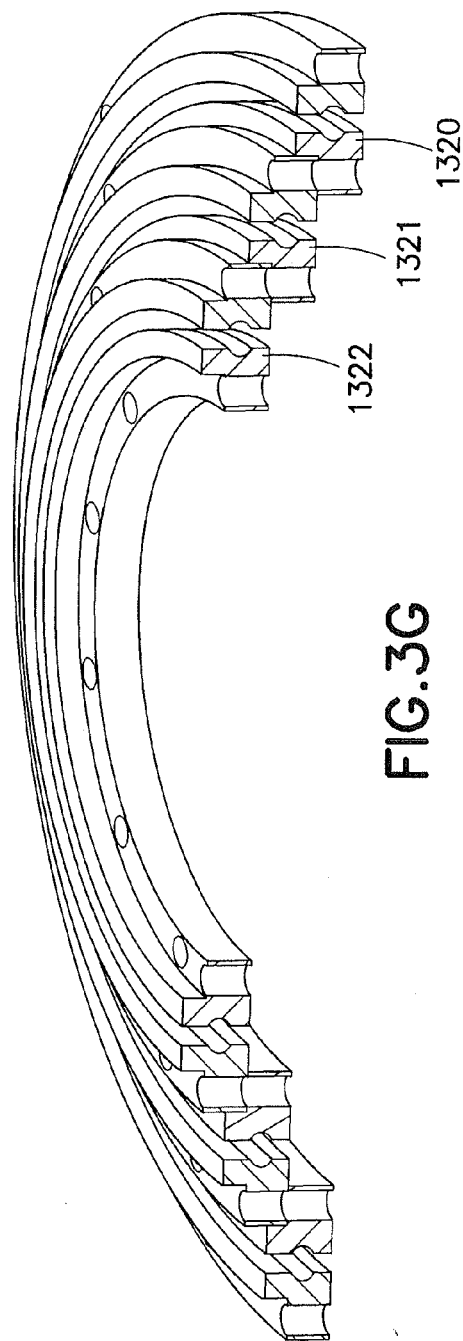
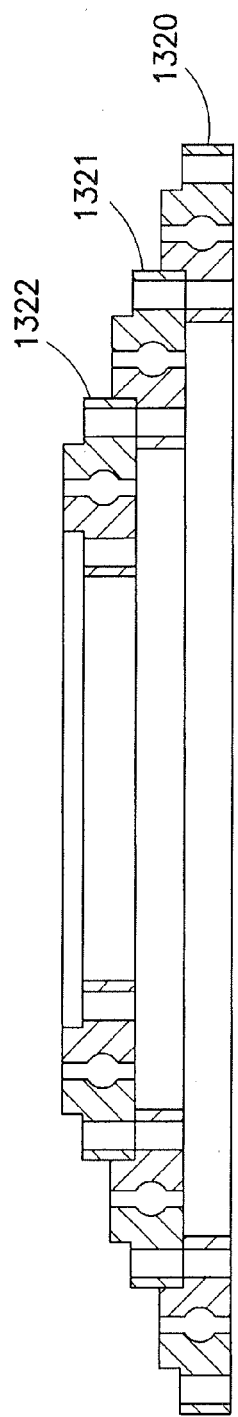
FIG.3G
FIG.3H

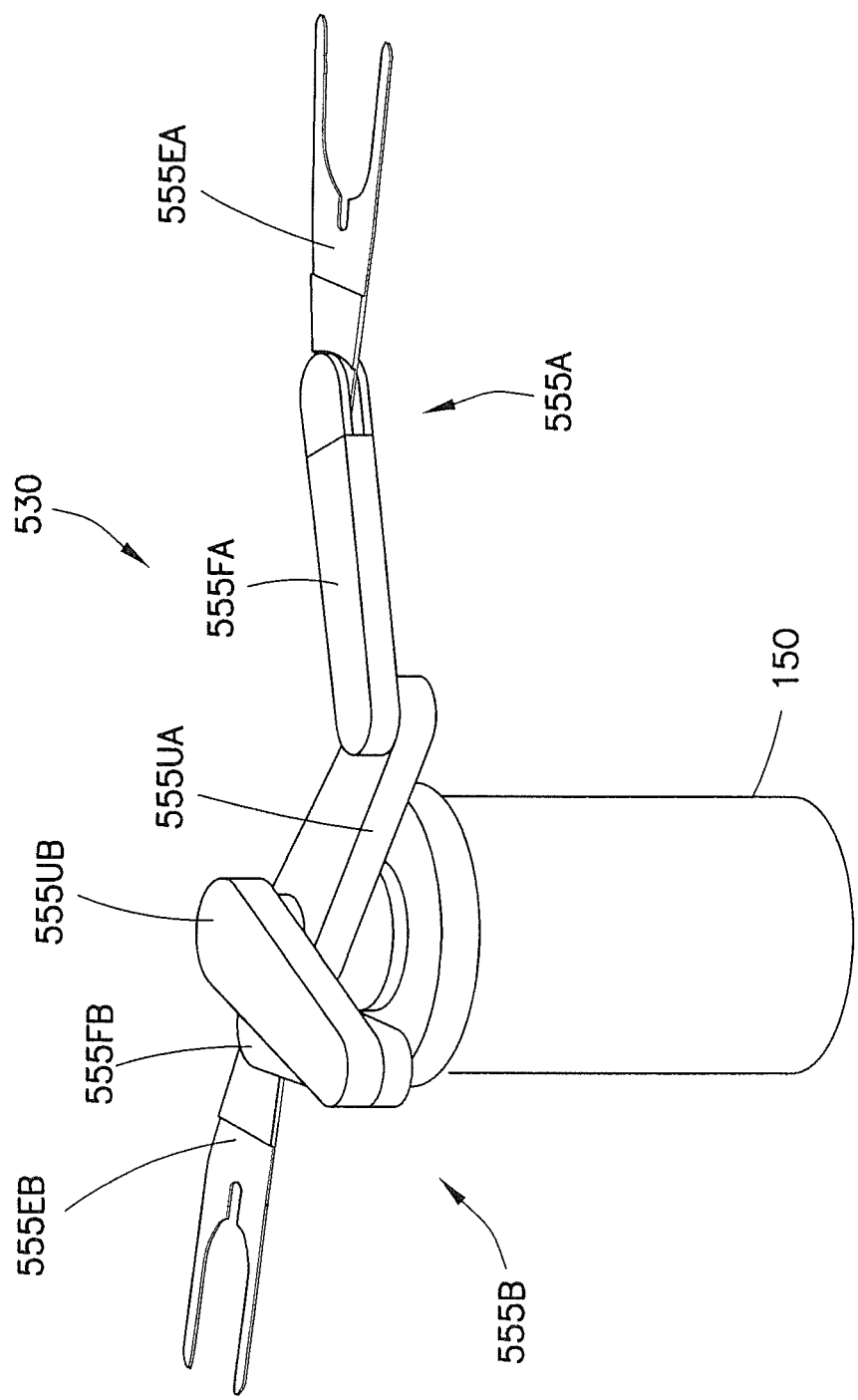

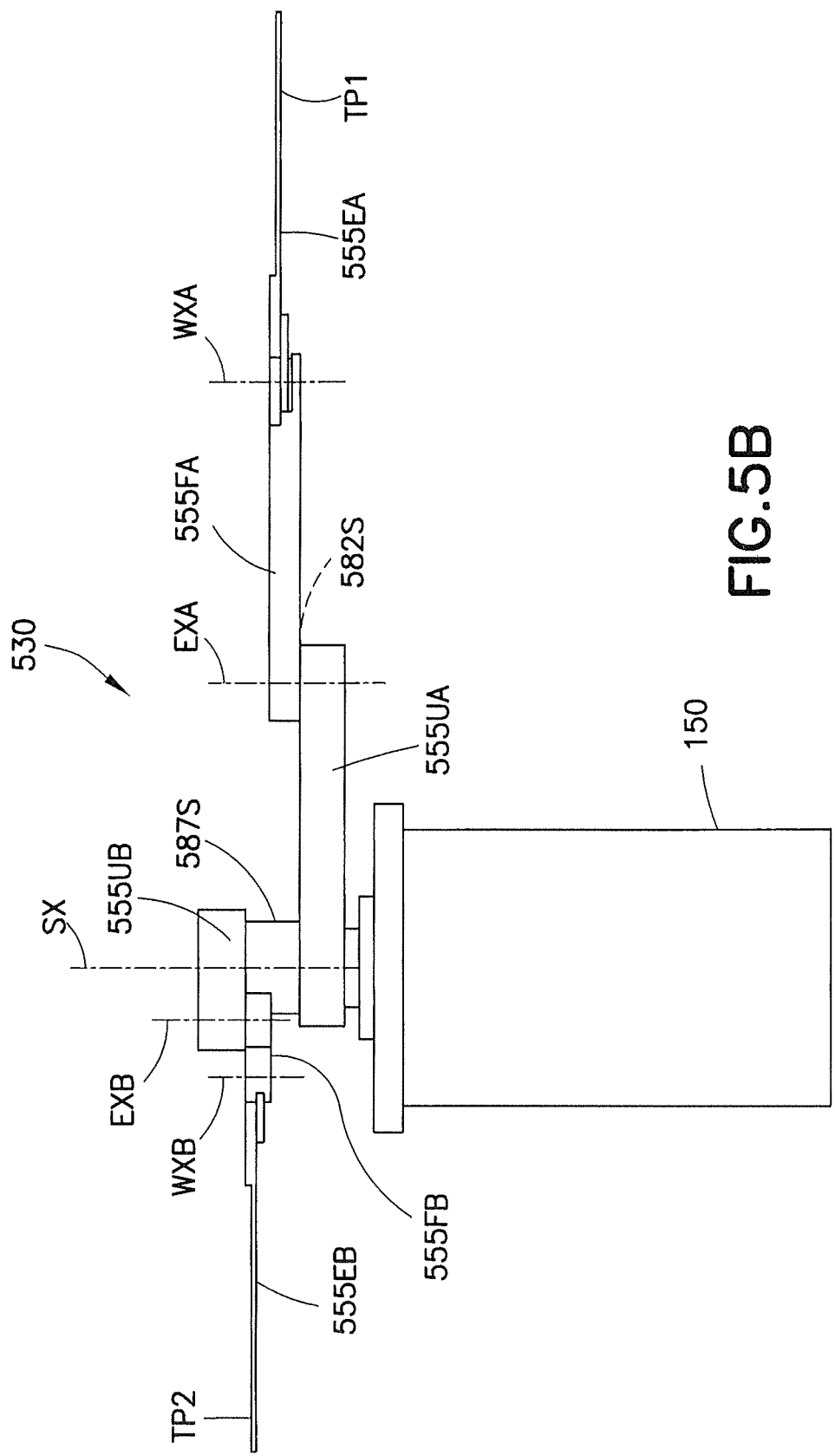

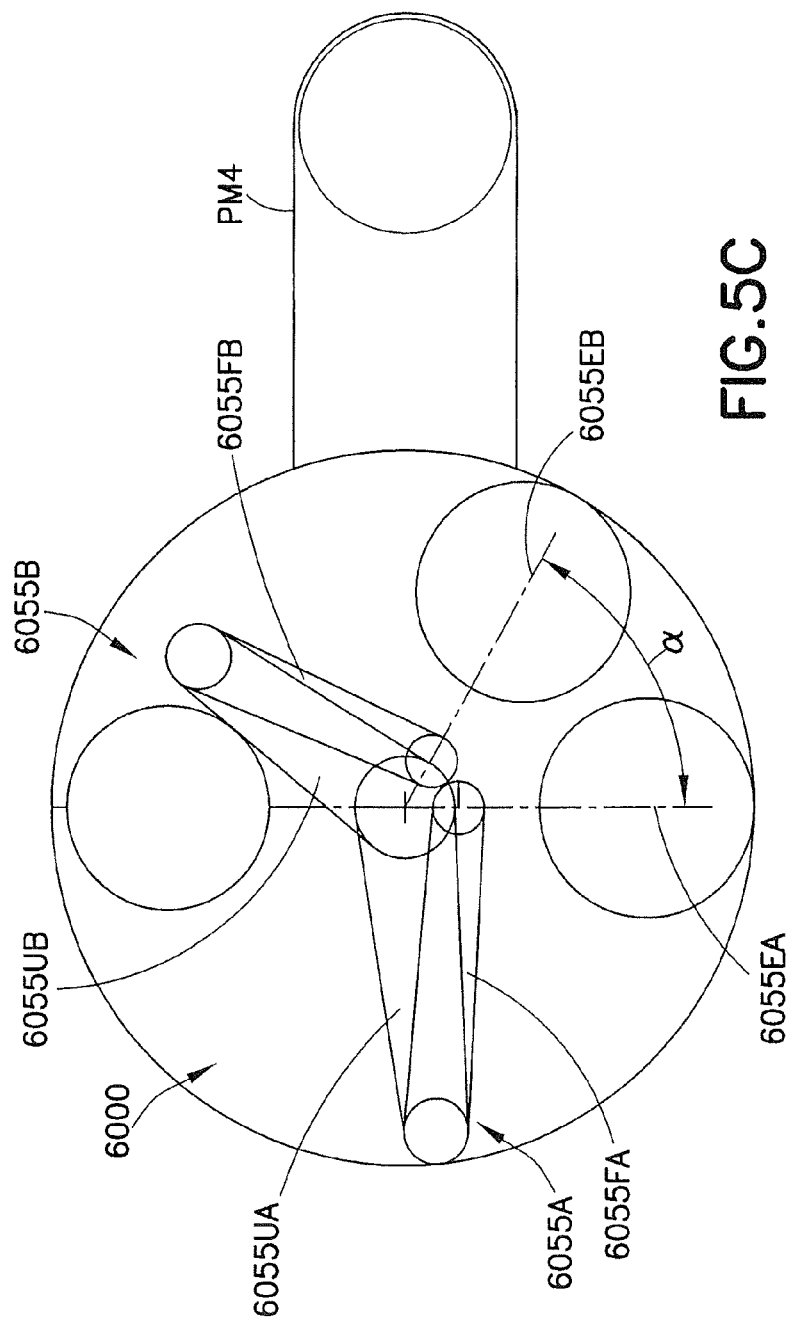
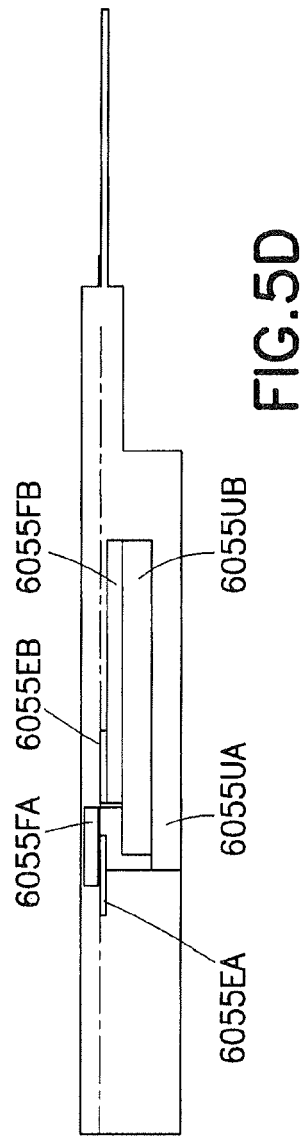
FIG.5C
FIG.5D

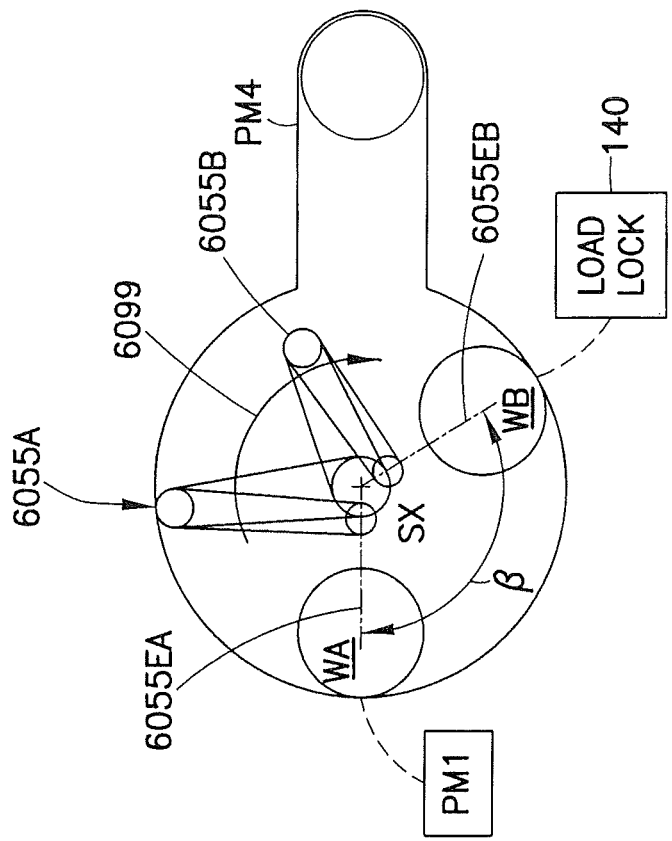
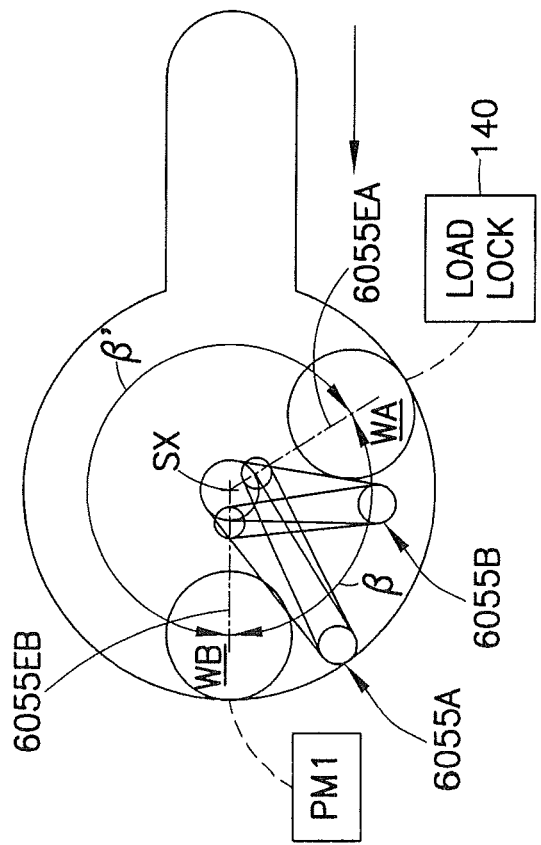
FIG.5F
FIG.5G

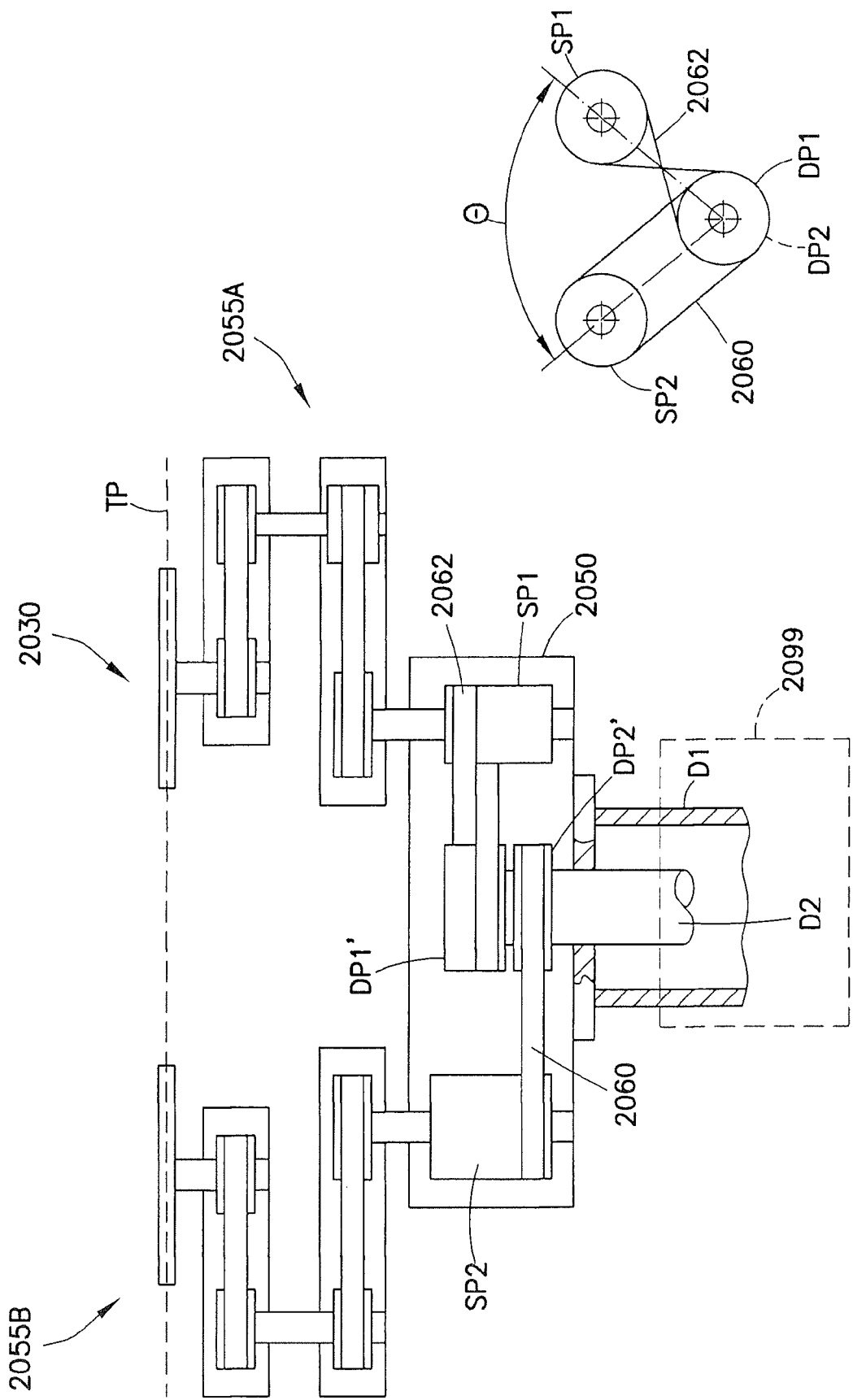

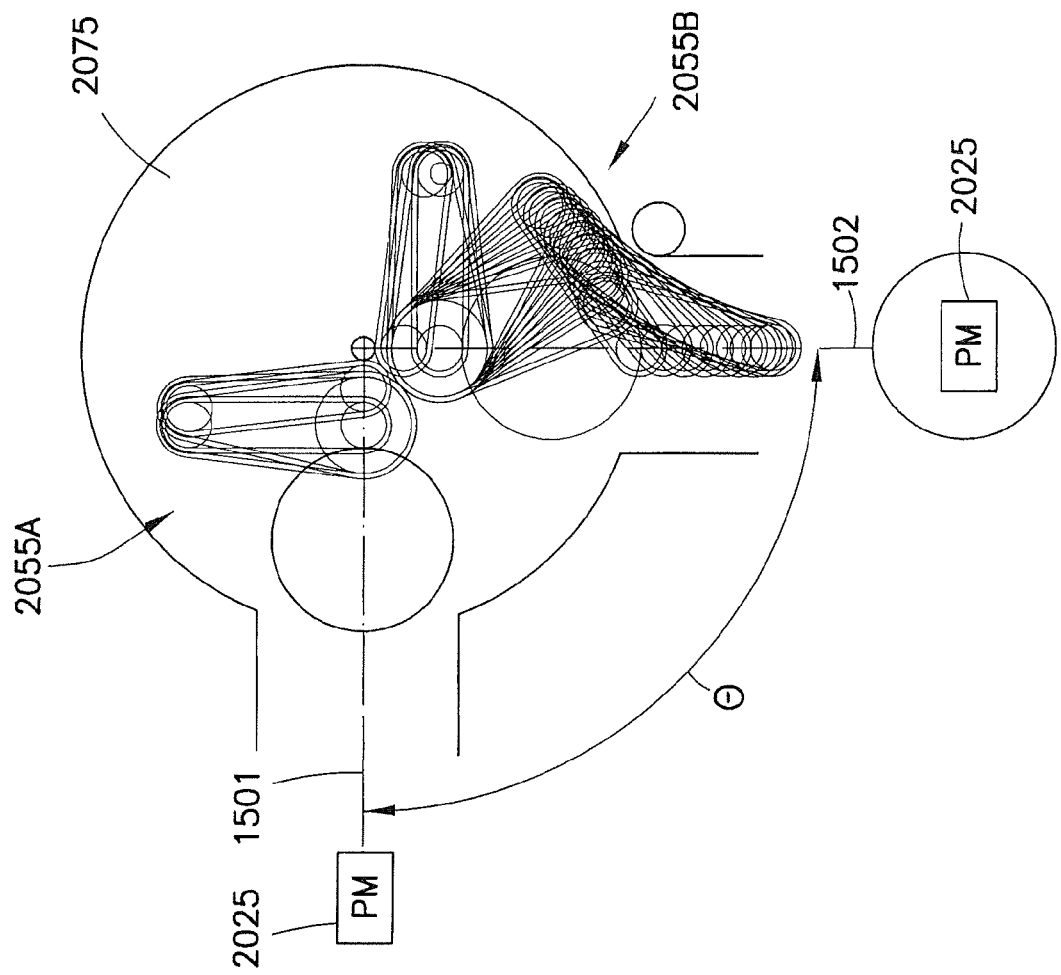
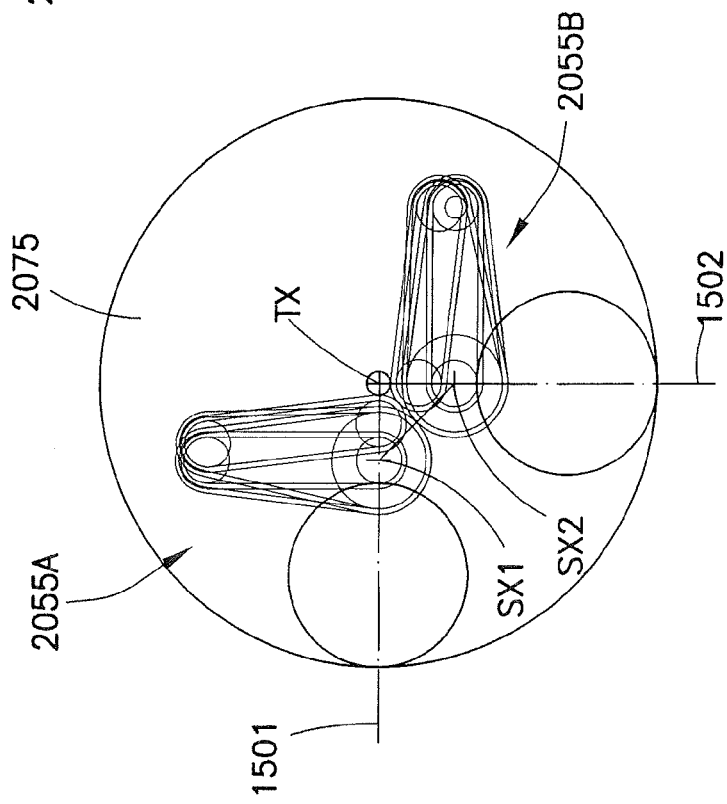

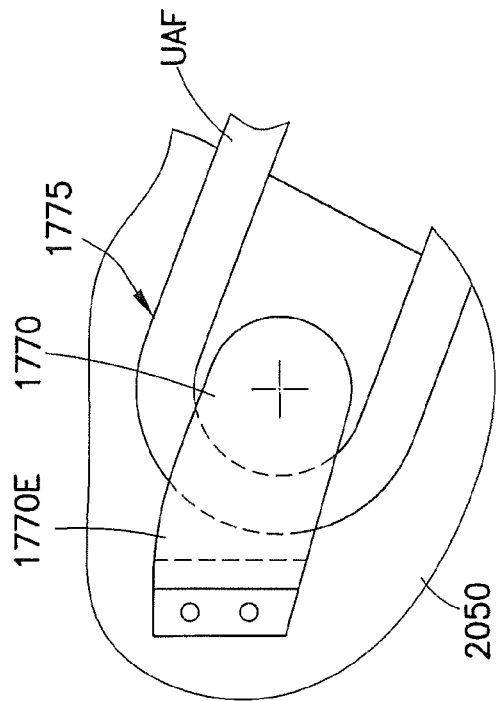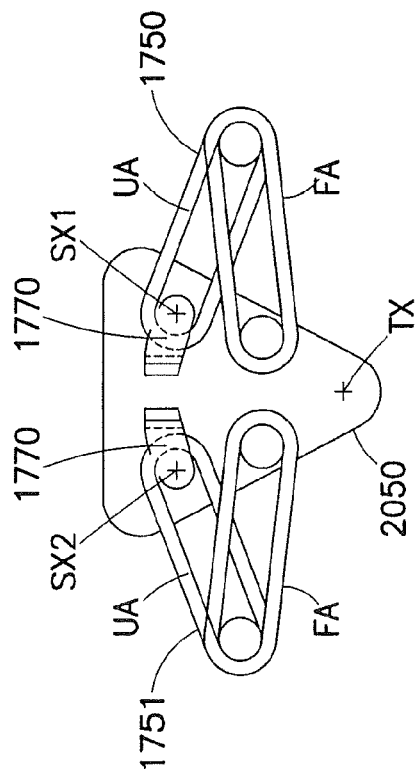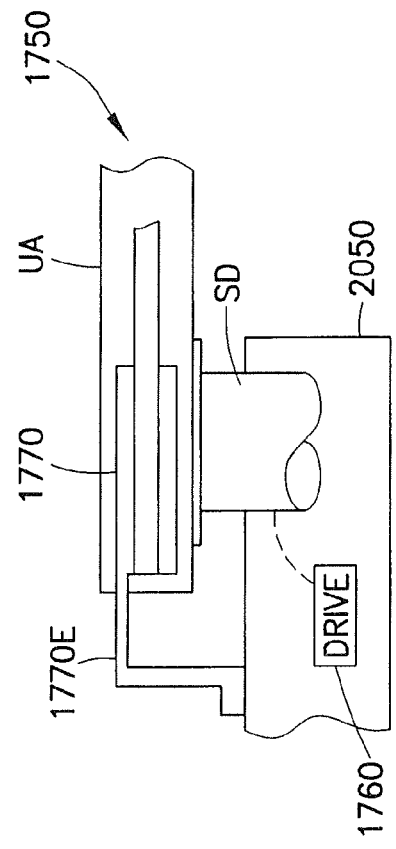

US 9,230,841 B2

SUBSTRATE PROCESSING APPARATUS

CROSS REFERENCE TO RELATED APPLICATIONS

This application is a continuation of U.S. application Ser. No. 13/417,837 filed Mar. 12, 2012 which is a non-provisional of U.S. Provisional Patent Application No. 61/451,912 filed on Mar. 11, 2011 and is related to U.S. patent application Ser. No. 13/293,717 filed Nov. 10, 2011 entitled "DUAL ARM ROBOT," the disclosures of which are incorporated herein by reference in their entireties.

BACKGROUND

1. Field

The aspects of the disclosed embodiment generally relate to substrate processing tools and, more particularly, to substrate transport apparatus.

2. Brief Description of Related Developments

Generally in substrate processing systems the rotation of arms of transfer robots with multiple arms are linked to one another so as one arm rotates the other arm(s) rotates as well. The end effectors of the transfer robots are generally located in different planes so that a fast swap (e.g. one end effector radially passes over/under the other end effector so that as one substrate is removed from a holding station another substrate is substantially simultaneously placed at the holding station) of substrates to and from holding locations generally occurs using either a Z axis capability of the transfer robot or holding station.

It would be advantageous to decouple the rotation of the arms of substrate transfer robots so that each arm is capable of independent operation.

BRIEF DESCRIPTION OF THE DRAWINGS

The foregoing aspects and other features of the disclosed embodiments are explained in the following description, taken in connection with the accompanying drawings, wherein:

FIGS. 2B-2J illustrates a substrate transport apparatus in accordance with an aspect of the disclosed embodiment;

FIGS. 2K and 2L illustrate graphs showing end effector rotation in accordance with aspects of the disclosed embodiment;

FIGS. 3C-3H illustrate a drive section of a substrate transport apparatus in accordance with an aspect of the disclosed embodiment;

FIGS. 5A and 5B illustrate a substrate transport apparatus in accordance with an aspect of the disclosed embodiment;

FIGS. 5C, 5D and 5E illustrate a substrate transport apparatus in accordance with an aspect of the disclosed embodiment;

FIGS. 5F and 5G illustrate an exemplary operation of the transport apparatus of FIGS. 5C-5E;

FIGS. 14A and 14B are schematic illustrations of a substrate transport apparatus of FIG. 13 in accordance with an aspect of the disclosed embodiment;

FIGS. 15A and 15B illustrate arm extension and retraction paths for the substrate transport apparatus of FIG. 13 in accordance with an aspect of the disclosed embodiment;

FIGS. 17A-17C are schematic illustrations of portions of a substrate transport apparatus in accordance with an aspect of the disclosed embodiment;

DETAILED DESCRIPTION OF THE DISCLOSED EMBODIMENT

Figure 1:
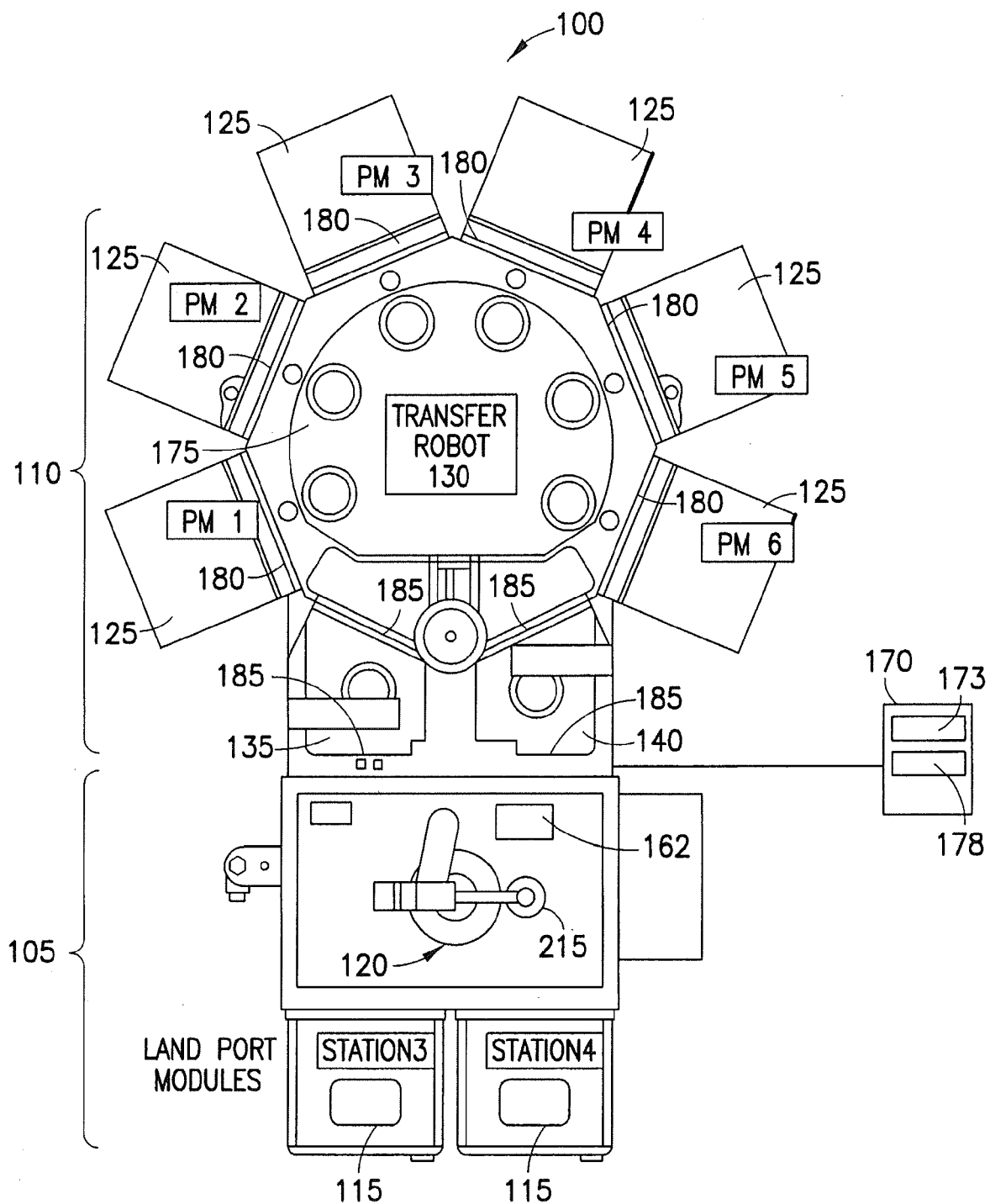
FIG. 1 illustrates a perspective view of a substrate processing apparatus in accordance with an aspect of the disclosed embodiment.

FIG. 1 illustrates a perspective view of a substrate processing apparatus 100 incorporating features of the disclosed embodiments, and a substrate 215 is illustrated. Although the disclosed embodiment will be described with reference to the drawings, it should be understood that the disclosed embodiment can be have many alternate forms. In addition, any suitable size, shape or type of elements or materials could be used.

For purposes of the aspects of the disclosed embodiment described herein, substrate 215 may be for example, a semiconductor wafer, such as a 200 mm, 300 mm, 450 mm or any other desired diameter substrate, any other type of substrate suitable for processing by substrate processing apparatus 100, a blank substrate, or an article having characteristics similar to a substrate, such as certain dimensions or a particular mass. Substrate processing apparatus 100 is a representative substrate processing tool, shown as having a general batch processing tool configuration. In alternate embodiments, the substrate apparatus may be of any desired type such as sorter, stocker, metrology tool, etc. In this embodiment, apparatus 100 may generally have an atmospheric section 105, for example forming a mini-environment and an adjoining atmospherically isolatable or sealed (e.g. sealed from an external atmosphere) section (e.g. atmospherically sealed section) 110, which for example may be equipped to function as a vacuum chamber. In alternate embodiments, the atmospherically sealed section 110 may hold an inert gas (e.g. $N_2$) or any other isolated atmosphere.

In an aspect of the disclosed embodiment, atmospheric section 105 typically has one or more substrate holding cassettes 115, and an atmospheric robot 120. The atmospheric robot 120 may be any suitable robot. For exemplary purposes only the atmospheric robot may be substantially similar to transfer robot 130, 530 described below. The atmospheric robot 120 may be adapted to transport substrates to any location within atmospheric section 105. For example, atmospheric robot 120 may transport substrates among substrate holding cassettes 115, load lock 135, and load lock 140. The atmospheric robot 120 may also transport substrates 215 to and from an aligner 162 located within the atmospheric section 105.

Atmospherically sealed section 110 may have one or more processing modules PM1-PM6 (generally referred to herein as processing modules 125), and a vacuum robot 130. The processing modules 125 may be of any type such as material deposition, etching, baking, polishing, ion implantation cleaning, etc. As may be realized the position of each processing module 125, with respect to a desired reference frame, such as the robot reference frame, may be registered with controller 170. In one aspect of the disclosed embodiment one or more of the process modules may also perform a processing operation on substrates within the substrate processing apparatus 100 that is different than other processing operations performed by the other processing modules. The operation associated with each of the process modules 125 may also be registered with the controller 170. In alternate embodiments the processing modules may perform the same processing operations. Atmospherically sealed section 110 may also have one or more intermediate chambers, referred to as loadlocks 135, 140. The embodiment shown in FIG. 1 has two loadlocks, but in other aspects the atmospherically sealed section 110 may have any suitable number of loadlocks. Loadlocks 135 and 140 operate as interfaces, allowing substrates to pass between atmospheric section 105 and atmospherically sealed section 110 without violating the integrity of any vacuum or other atmosphere sealed within the atmospherically sealed section 110. In accordance with an aspect of the disclosed embodiment the processing modules and/or the loadlocks may be arranged on a common substrate transport plane (e.g. transport paths for substrates to and from the modules may be co-planar).

Substrate processing apparatus 100 generally includes a controller 170 that controls the operation of substrate processing apparatus 100. Controller 170 has a processor 173 and a memory 178. The memory 178 may include computer readable code for effecting the operation of the substrate processing apparatus 100 and its components as described herein. For example, memory 178 may further include processing parameters, such as temperature and/or pressure of processing modules, and other portions or stations of sections 105, 110 of the apparatus, temporal information of the substrate(s) 215 being processed and metric information for the substrates, etc. In one aspect of the disclosed embodiment the controller 170 may have a clustered architecture such as that described in U.S. patent application Ser. No. 11/178,615, entitled "Scalable Motion Control System" and filed on Jul. 11, 2005, the disclosure of which is incorporated by reference herein in its entirety. In other aspects, the controller may have any suitable control architecture.

Figure 2:
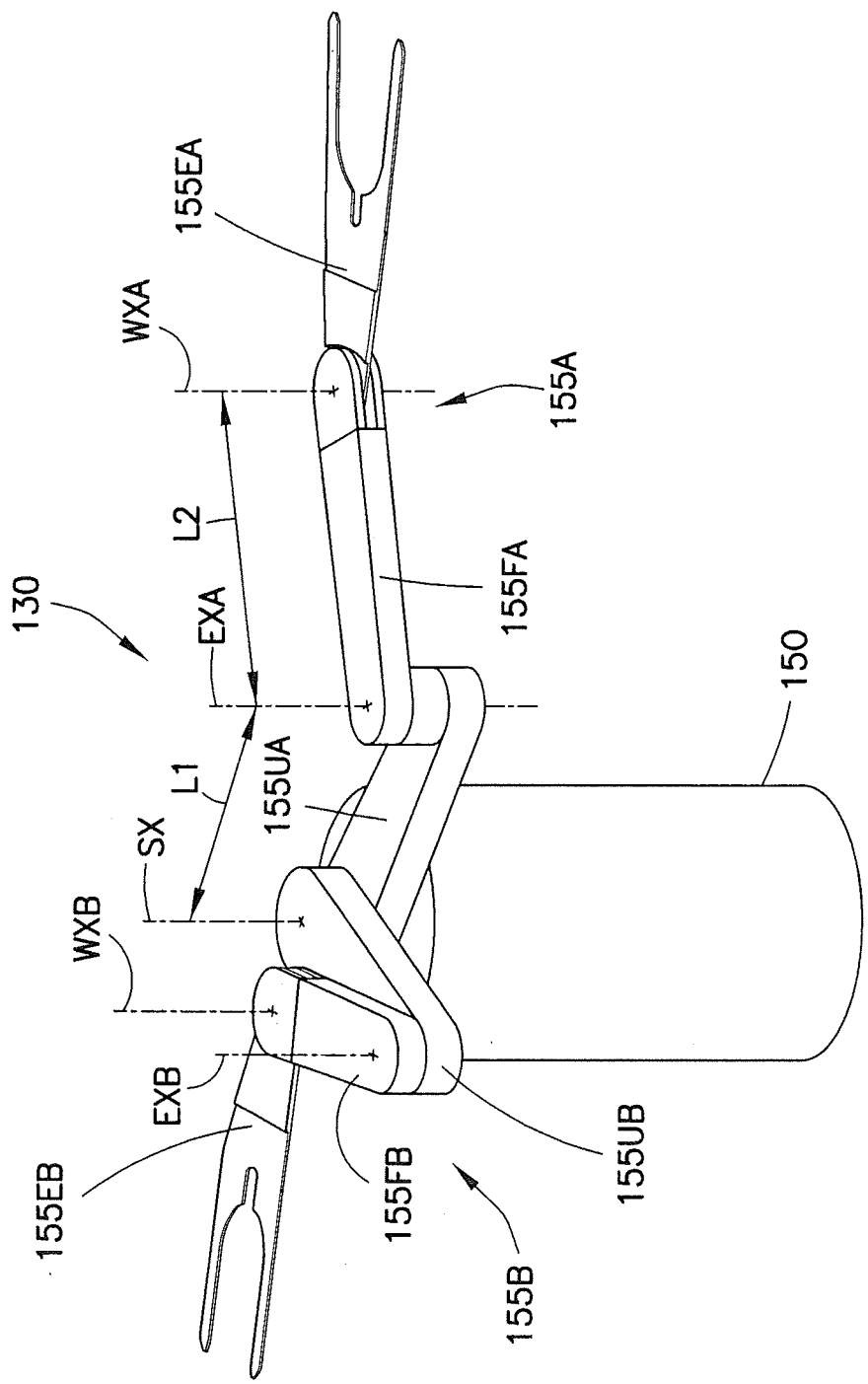
FIG. 2 is a substrate transport apparatus in accordance with an aspect of the disclosed embodiment.

Referring also to FIG. 2, in one aspect of the disclosed embodiment, the transfer robot 130 (which may be substantially similar to atmospheric robot 120) may include a drive section 150 and one or more arms 155A, 155B. The arms 155A, 155B may be attached to a drive section 150 having, for example, a three or four axis drive system as will be described below. The arms 155A, 155B, shown for example in the FIGS. as three link SCARA arms, may be coupled co-axially to the drive section 150, and may be vertically stacked on top of each other to allow for independent theta motion (using e.g. a four axis drive) or coupled theta motion (using e.g. a three axis drive) where the coupled theta motion is rotation of the robot arms as a unit about the shoulder axis SX substantially without extension or retraction. Each arm is driven by a pair of motors and may have any suitable drive pulley arrangement. In one aspect the diameter ratio between the shoulder pulley, elbow pulley and wrist pulley for each arm may be, for non-limiting exemplary purposes, a 1:1:2 ratio or a 2:1:2 ratio. To extend each arm using, e.g. the 1:1:2 ratio each motor in the pair of motors is rotated in substantially equal and opposite directions. To extend each arm using, e.g., the 2:1:2 ratio the shoulder pulley is held substantially fixed (e.g. substantially does not rotate) and the motor coupled to the upper arm is rotated to extend the arm. Theta motion is controlled by rotating the motors in the same direction substantially at the same speed. Where the end effectors are on the same plane, as described herein, the theta motion of each of the arms relative to each other is limited, however the arms can move infinitely in theta if the arms are moved together. As may be realized, where the end effectors are not on the same plane, as also described below, each arm can move infinitely in theta when each arm is driven independent of the other arm such as when using the four axis drive.

It is noted that the upper arm 155UA, 155UB and forearm 155FA, 155FB of the respective arms 155A, 155B may be substantially equal in length or unequal in length. For example, the upper arms 155UA, 155UB may be longer than the forearms 155FA, 155FB or vice versa. One example, of unequal length arms is described in U.S. patent application Ser. No. 11/179,762 entitled "Unequal Link Scara Arm" and filed on Jul. 11, 2005, the disclosure of which is incorporated by reference herein in its entirety.

Figure 2A:
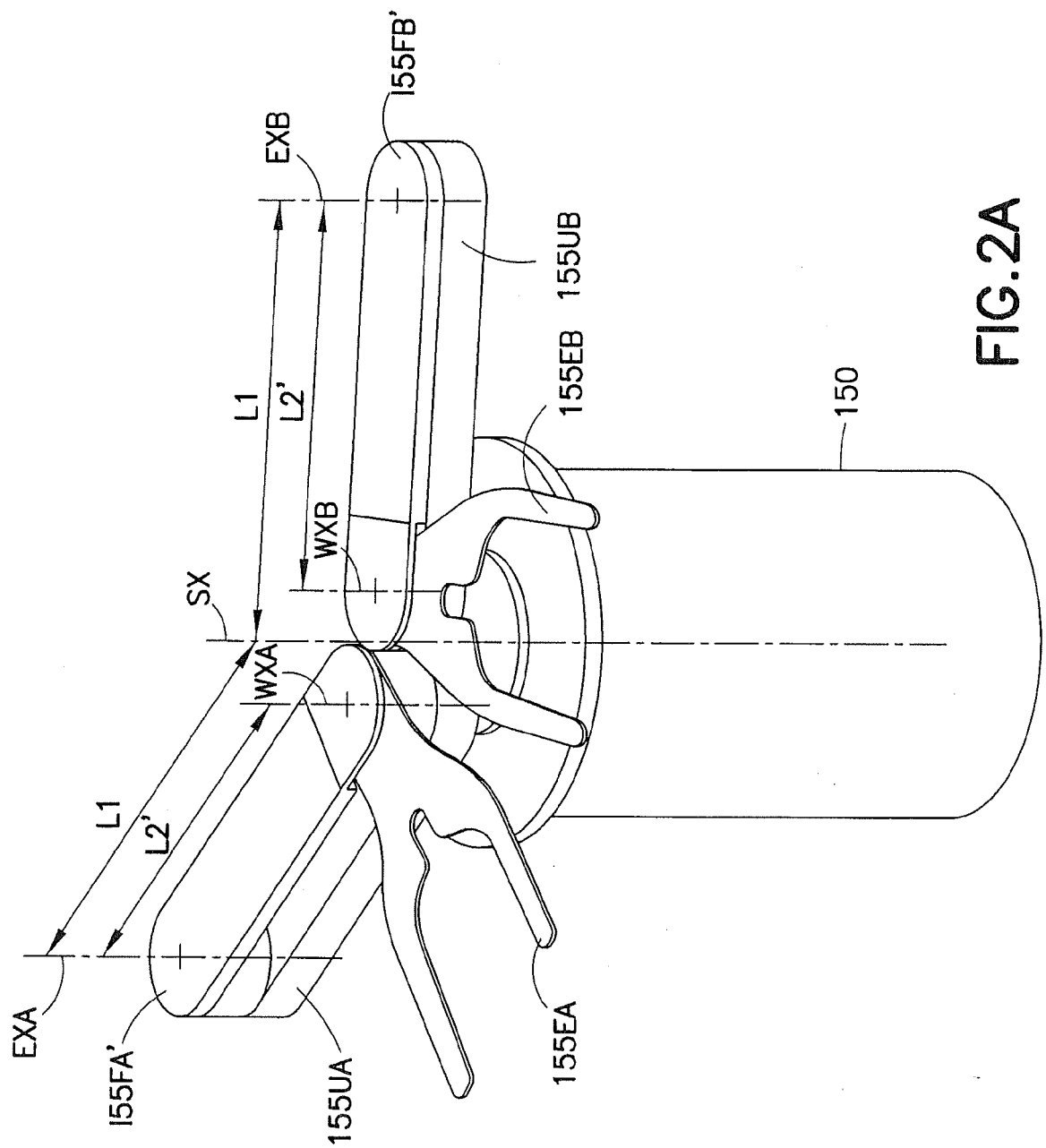
FIG. 2A illustrates a substrate transport apparatus in accordance with an aspect of the disclosed embodiment.

As a non-limiting example, referring to FIG. 2 (also see FIG. 4), with respect to the substantially equal length arm sections the distance L1 between the shoulder axis SX and each of the elbow axes EXA, EXB may be substantially the same as the distance L2 between each of the elbow axes EXA, EXB and a respective one of the wrist axes WXA, WXB. As an example, with respect to the unequal length arm sections (see FIG. 2A), the distance L1 between the shoulder axis SX and each of the elbow axes EXA, EXB may be greater or less than the distance L2' between each of the elbow axes EXA, EXB and a respective one of the wrist axes WXA, WXB (in FIG. 2A the distance L2' is greater). As may be realized, where the forearm section length is greater than the respective upper arm section length, the wrist axes WXA, WXB are allowed to retract to a greater extent than if the forearms and upper arms have substantially the same lengths. For example, where the end effectors 155EA, 155EB are substantially in the same plane as described herein, the swing radius diameter may be limited by the substrate diameter and the wrist instead of, for example, the elbows of the arms. To minimize the swing radius the retract position of the arm is minimized so that the wafer center is as close as possible to the robot center of rotation SX at the robot retract position. Making, for example, the forearm length L2, L2' larger than the length L1 of the upper arms allows each substantially coplanar wrist to further retract when compared to the arms having substantially equal forearm and upper arm lengths.

Figure 2B:
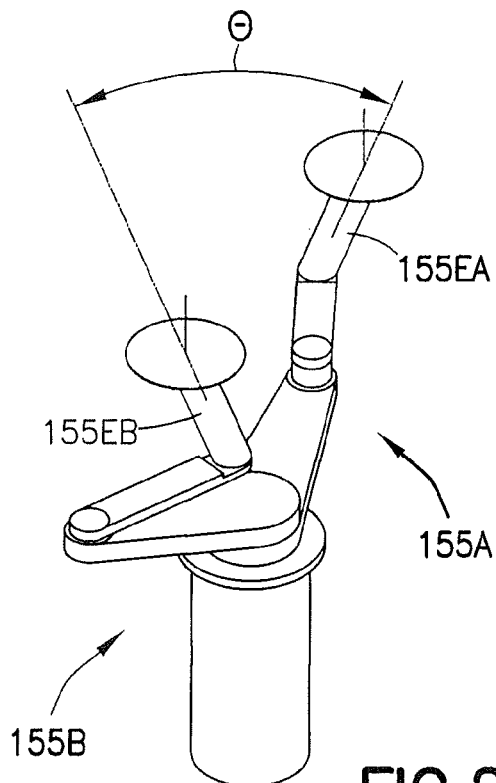
Figure 2C:
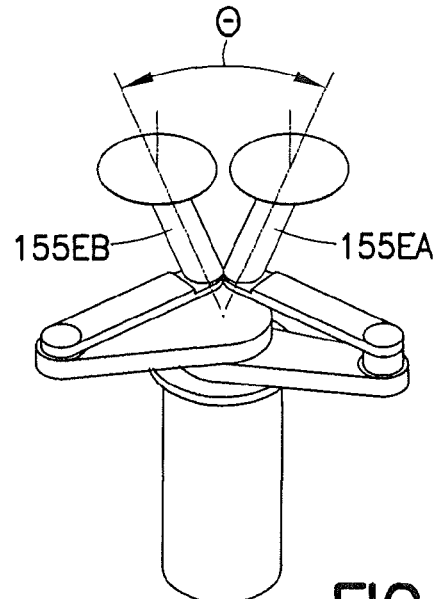
Figure 2D:
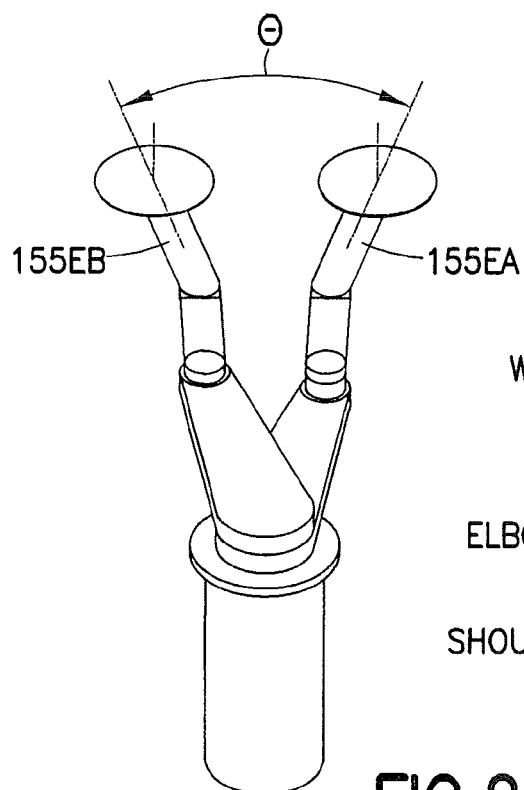
Figure 2E:
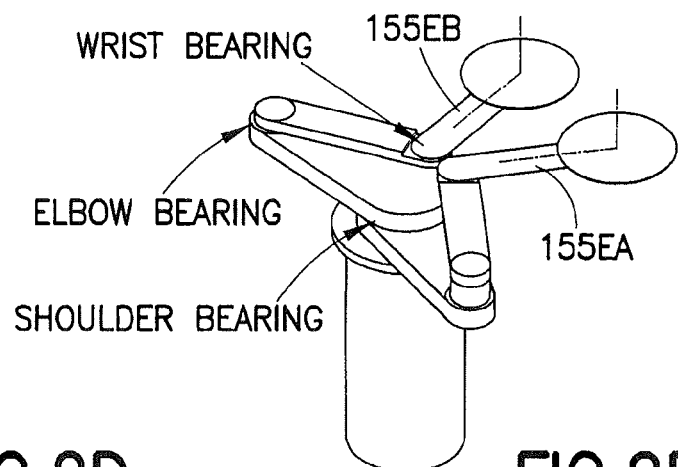
Figure 2H:
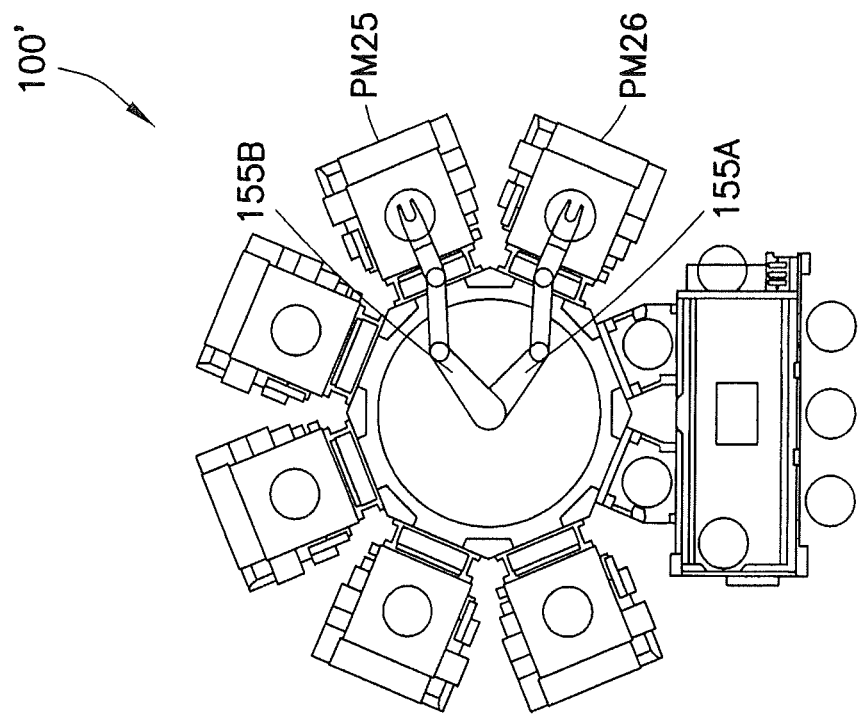
Figure 2G:
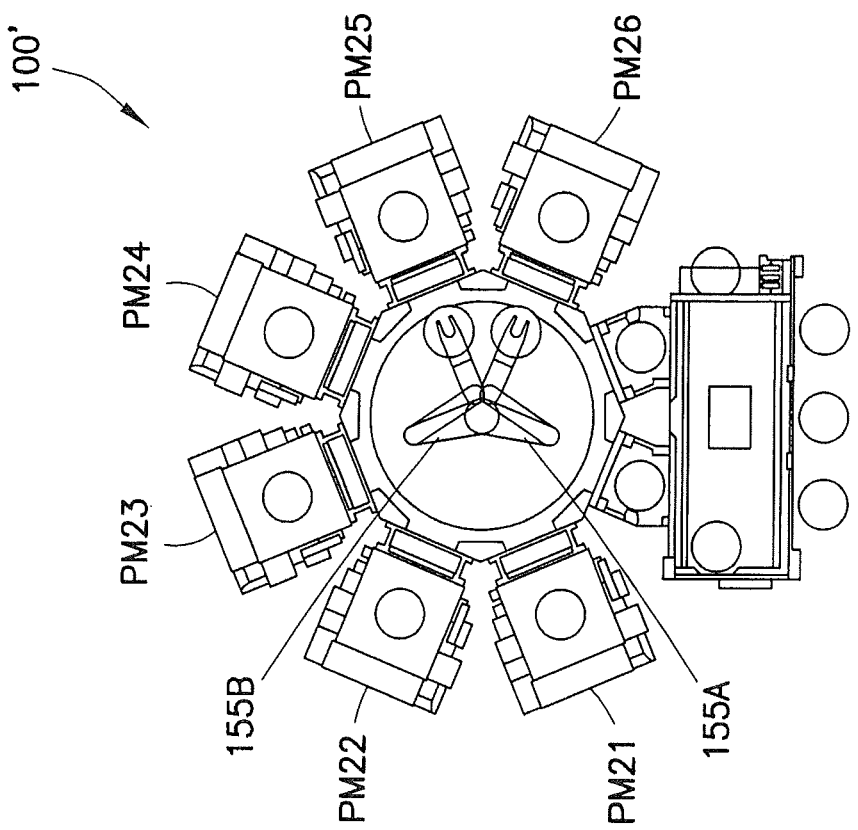
Figure 2M:
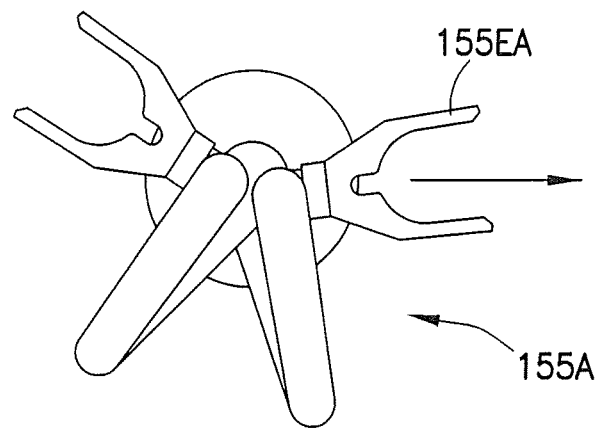
FIGS. 2M-2O are illustrations of end effector rotation in accordance with an aspect of the disclosed embodiment.
Figure 2N:
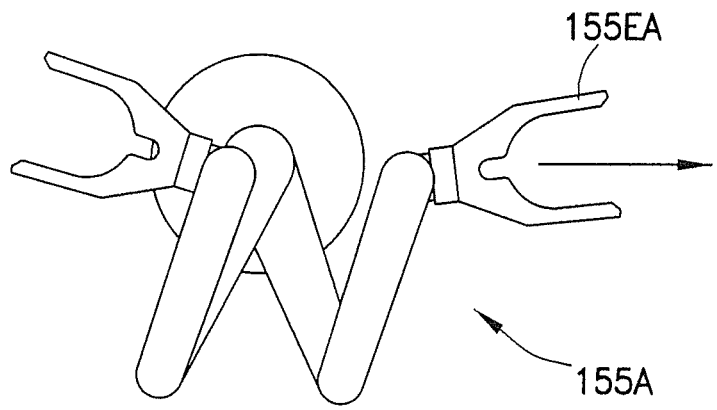
Figure 2O:
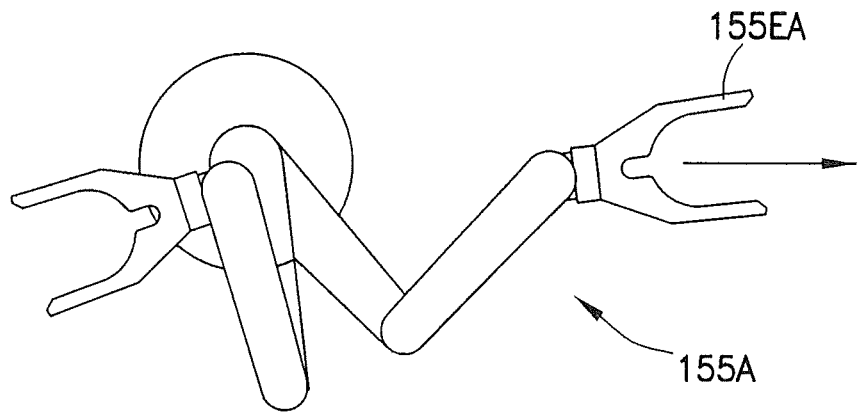

In one aspect of the disclosed embodiment (with substantially equal length or unequal length arm links) allow for the substrate center to perform a radial path from the retract position to a radially located station (e.g. radially located with respect to the shoulder axis SX of the robot). It is noted that the amount of substrate rotation along the radial path can be minimized along the path through a suitable "gear" ratio between, e.g., the elbow pulleys and 383, 389 (FIG. 3A) and the respective wrist pulleys 384, 399 (FIG. 3A). Using a suitable pulley ratio substrate rotation can be substantially eliminated at the station where the end effector path ends. Using unequal length upper arm and forearm links as an example and referring to FIG. 2K, the amount of rotation of the end effector about the center of the substrate (e.g. wafer rotation) is shown for, e.g., a 2:1 elbow/wrist pulley ratio. Referring also to FIG. 2L the amount of rotation of the end effector about the center of the substrate is shown for, e.g., a 1.7:1 elbow/wrist pulley ratio. FIGS. 2M-2O show an extension of arm 155A between fully retracted and fully extended positions using, e.g. the 1.7:1 elbow/wrist ratio such that the wafer rotates by, for example, a maximum of 2.5 degrees. It is noted that the above pulley diameter ratios are exemplary only and it should be understood that the pulleys can have any suitable diameter ratio. It is also noted that the rotation of the substrate during extension can be minimize with respect to upper arms and forearms having substantially the same length in a manner substantially similar to that described above.

Figure 2P:
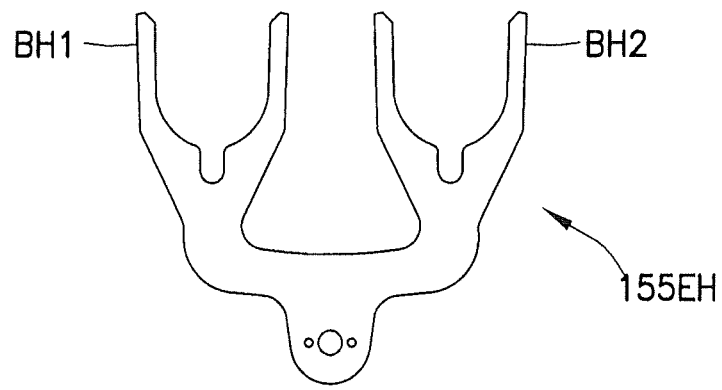
FIGS. 2P and 2Q illustrate end effectors in accordance with aspects of the disclosed embodiments.
Figure 2Q:
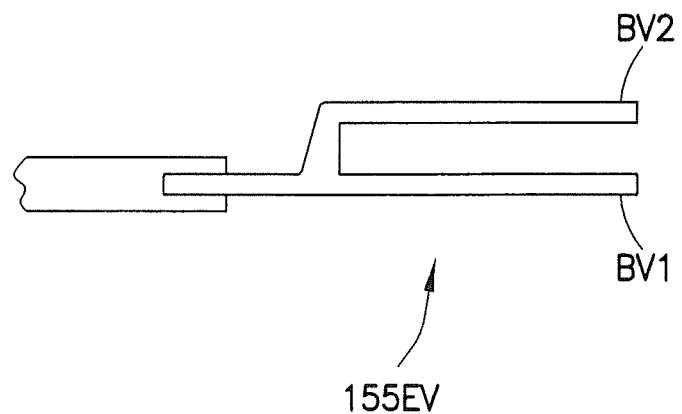

The end effectors may be configured in any suitable manner for holding one or more substrates 215. For example, the end effectors 155EA, 155EB are shown as having a single blade for holding a single substrate but it should be understood that the end effectors can have multiple blades for holding multiple substrates. As an example, the end effector 155EH (FIG. 2P) may have any suitable number of substrate holding blades BH1, BH2 arranged horizontally in a row for holding multiple substrates side by side or the end effector 155EV (FIG. 2Q) may have any suitable number of substrate holding blades BV1, BV2 arranged vertically in a stack for holding multiple substrates one above the other. In one aspect, the end effectors 155EA, 155EB may be edge gripping, vacuum gripping, active gripping or passive gripping end effectors. In one aspect of the disclosed embodiment, the end effectors may be coupled to respective ones of the upper arms 155UA, 155UB and forearms 155FA, 155FB so that the end effectors have a predetermined angular relationship. For example, referring to FIGS. 2B-2F an angle θ between the end effectors may be any suitable angle. In one aspect the angle θ between end effectors 155EA, 155EB may be substantially the same as the angle θ' between radially arranged process modules, such as process modules PM25, PM26 of, for example, cluster tool 100'. For exemplary purposes only, the angle θ and/or angle θ' may be about 60 degrees but in other aspects the angle may be more or less than 60 degrees. As may be realized the arms 155A, 155B may be configured such that the angle θ between end effectors 155EA, 155EB is substantially maintained when both arms 155A, 155B are retracted (FIGS. 2C and 2E), when both arms 155A, 155B are extended (FIG. 2D), and when one arm 155B is retracted and the other arms 155A is extended (FIG. 2B) at least with respect to when the arms are positioned to access adjacent processing modules. As may be realized, where each arm is independently rotatable about the shoulder axis SX the angle of the end effector may match the corresponding angles of respective non-adjacent process modules (e.g. the non-adjacent process modules are separated by other process modules) into which the end effectors are extended. FIGS. 2G-2J illustrate the extension of the arms 155A, 155B having end effectors 155EA, 155EB with a predetermined angle θ that is substantially the same as the angle θ' between processing modules PM21-PM26 of processing tool 100'. FIG. 2G illustrates both arms 155A, 155B being retracted. FIG. 2H illustrates both arms 155A, 155B extended into processing modules PM26, PM25 respectively. FIG. 2I illustrates arm 155B extended into processing module PM25 and arm 155A retracted. FIG. 2J illustrates arm 155A extended into processing module PM26 and arm 155B retracted.

Drive section 150 may receive commands from, for example, controller 170 and, in response, direct radial, circumferential, elevational, compound, and other motions of arms 155A, 155B. The arms 155A, 155B may be mounted onto drive section 150 in any suitable manner. Each of the arms 155A, 155B may include an upper arm section 155UA, 155UB rotatably mounted to the drive section at a shoulder joint axis SX, a forearm section 155FA, 155FB rotatably mounted to the upper arm section 155UA, 155UB at an elbow axis EXA, EXB and an end effector 155EA, 155EB rotatably mounted to the forearm section 155FA, 155FB at a wrist axis WXA, WXB.

In an aspect of the disclosed embodiment, the transfer robot 130 may be mounted in central chamber 175 of atmospherically sealed section 110 (See FIG. 1). Controller 170 may operate to cycle openings 180, 185 and coordinate the operation of transfer robot 130 for transporting substrates among processing modules 125, load lock 135, and load lock 140. It should be understood that while the transfer robots 120, 130 are illustrated and described as having a SCARA-type robot arm, the transfer robots may include any suitable arm configurations such as an articulating arm robot, a frog leg type apparatus, or a bi-symmetric transport apparatus.

Figure 3:
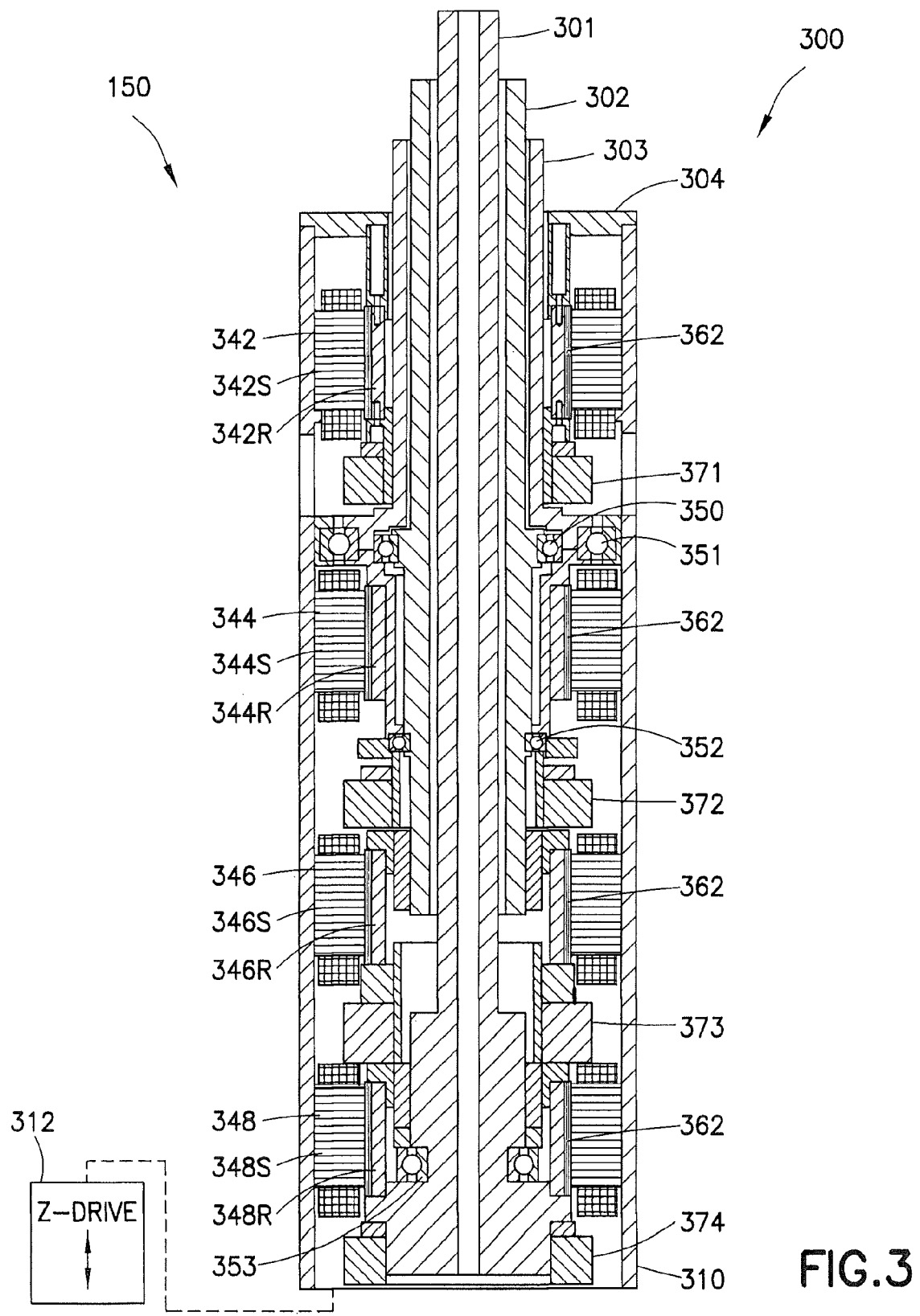
FIGS. 3, 3A and 3B schematically illustrate a drive section and arms of a substrate transport apparatus in accordance with aspects of the disclosed embodiment.
Figure 3A:
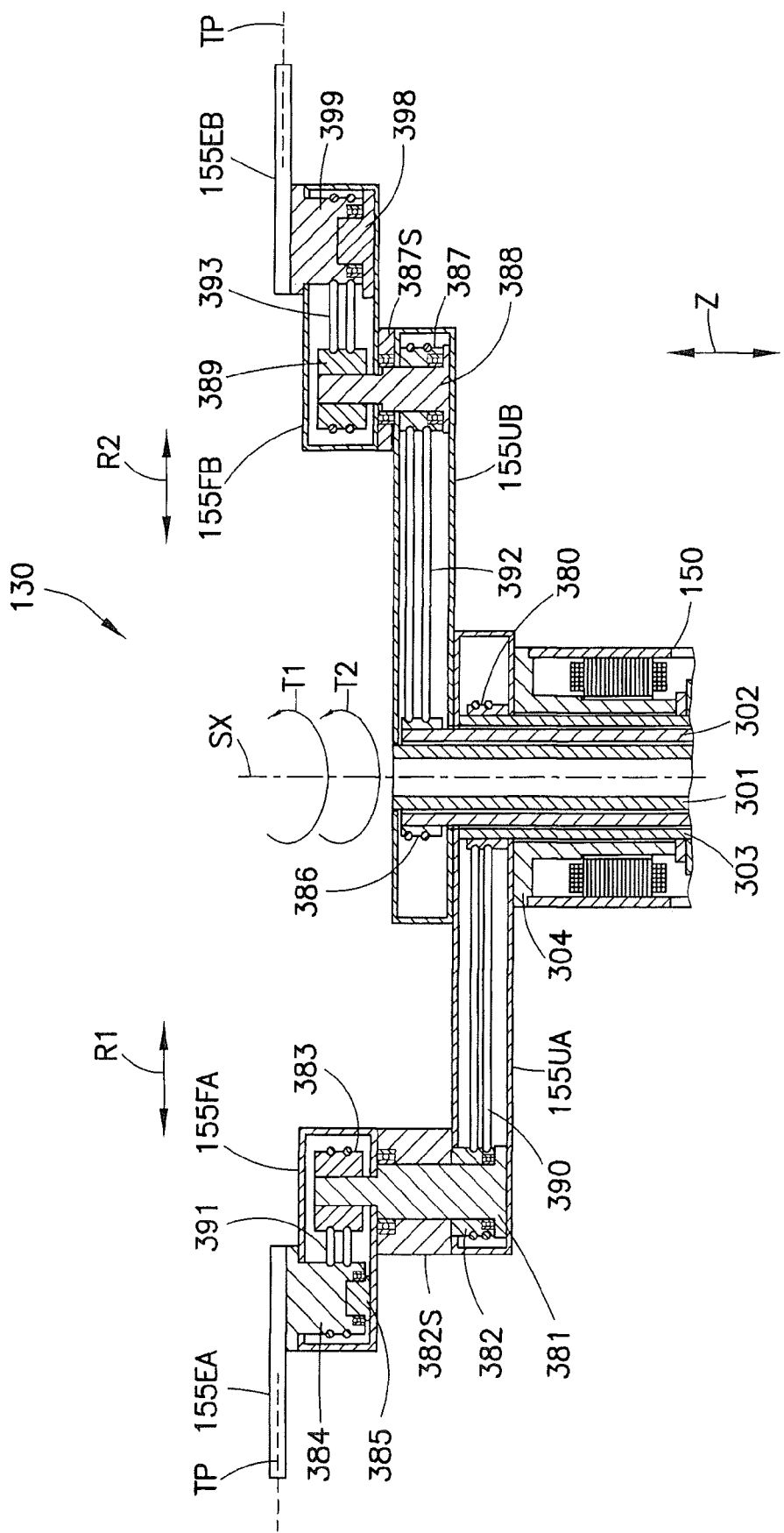

Referring now to FIG. 3, an exemplary drive section 150 is shown in accordance with an aspect of the disclosed embodiments. In one aspect the drive may have a coaxial drive arrangement, while in other aspects the drive section may have any suitable drive arrangement. Suitable examples of drive section arrangements are described in U.S. Pat. Nos. 6,485,250, 5,720,590, 5,899,658 and 5,813,823 the disclosures of which are incorporated by reference herein in their entirety. Other suitable examples of drive system arrangements include those described in U.S. patent application Ser. No. 12/163,996 entitled "Robot Drive with Magnetic Spindle Bearings" and filed on Jun. 27, 2008, the disclosure of which is incorporated herein by reference in its entirety. In this aspect, the drive section 150 includes a housing 310 for at least partially housing a quad-coaxial drive shaft assembly 300 having four drive shafts 301-304 and four motors 342, 344, 346, 348 (e.g. a 4-degree of freedom motor). In other aspects of the embodiments the drive section 150 may have any suitable number of drive shafts and motors, such as for example, two or three coaxial motors or more than four coaxial motors and associated drive shafts. The first motor 342 includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to the fourth or inner shaft 301. The four stators 342S, 344S, 346S, 348S are stationarily attached to the housing 310 at different vertical heights or locations within the housing. Each stator 342S, 344S, 346S, 348S generally comprises an electromagnetic coil. Each of the rotors 342R, 344R, 346R, 348R generally comprises permanent magnets, but may alternatively comprise a magnetic induction rotor that does not have permanent magnets. Where the transfer robot 130 is used in a sealed environment, such as for non-limiting exemplary purposes only, a vacuum environment, sleeves 362 may be located between the rotors 342R, 344R, 346R, 3418R and the stators 342S, 344S, 346S, 348S so that the coaxial drive shaft assembly 300 is located in the sealed environment and the stators are located outside the sealed environment. It should be realized that the sleeves 362 need not be provided if the transfer robot 130 is only intended for use in an atmospheric environment, such as within the atmospheric section 105 of the substrate processing apparatus 100 (FIG. 1).

The fourth or inner shaft 301 extends from the bottom or fourth stator 348S and includes the rotor 348R, which is substantially aligned with the stator 348S. The shaft 302 extends from the third stator 346S and includes rotor 346R, which is substantially aligned with the stator 346S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings 350-353 are provided about the shafts 301-304 and the housing 310 to allow each shaft 301-304 to be independently rotatable relative to each other and the housing 310. It is noted that each shaft may be provided with a position sensor 371-374. The position sensors 371-374 may be used to provide a signal to any suitable controller, such as controller 170, regarding the rotational position of a respective shaft 301-304 relative to each other and/or relative to the housing 310. The sensors 371-374 may be any suitable sensors, such as for non-limiting exemplary purposes, optical or induction sensors.

Figure 3B:
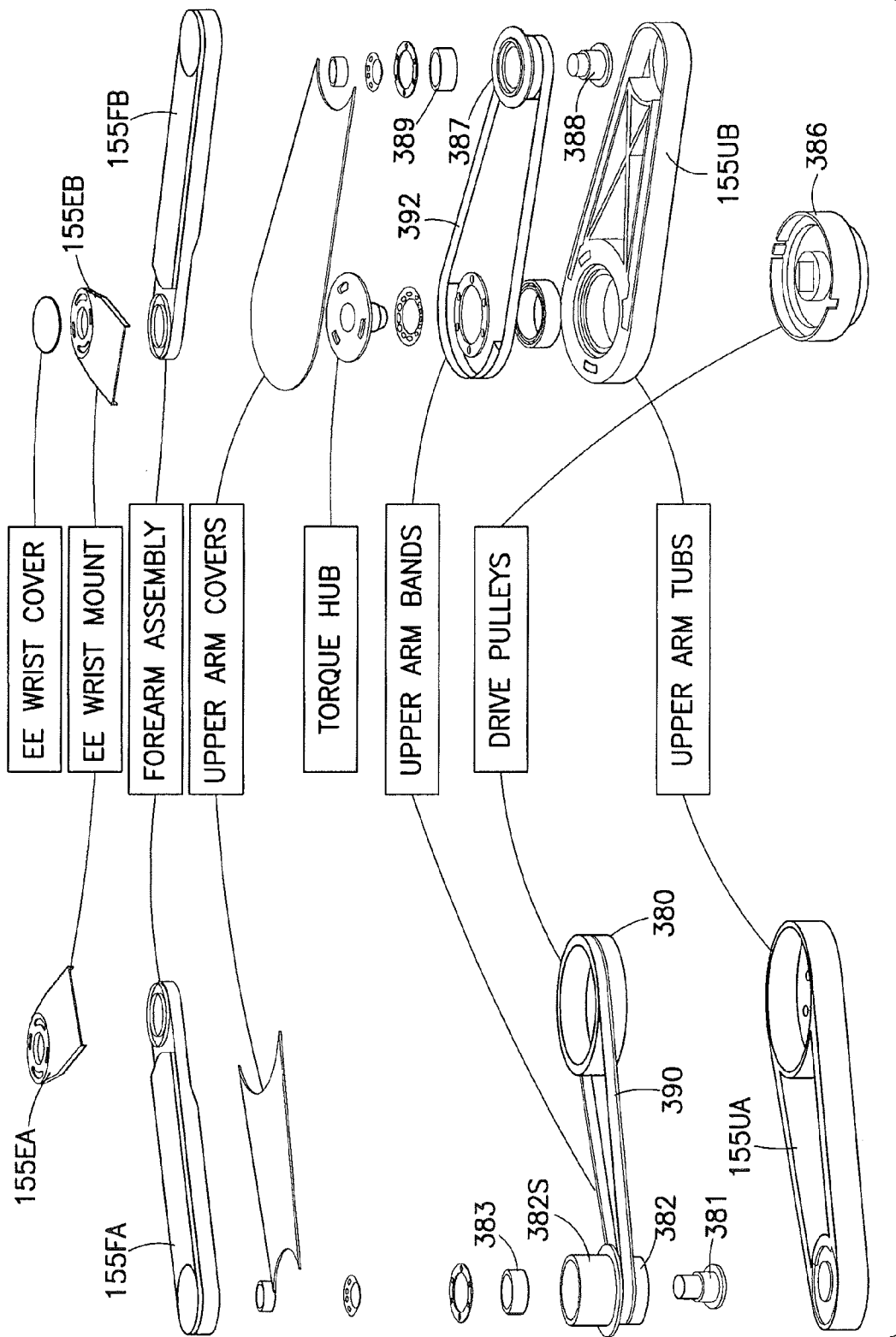

Referring also to FIGS. 2, 3A and 3B, as described above the transfer robot 130 includes two arms 155A, 155B. It is noted that the two (or more) arms of the transfer robots described herein with respect to the aspects of the disclosed embodiment may allow for substantially simultaneous picking and placing of substrates (e.g. both arms are extended and retracted at substantially the same time for picking and placing substrates) or for nearly simultaneous picking and placing of substrates (e.g. a first arm picks or places a substrate and substantially immediately following the picking or placing by the first arm the second arm picks or places a substrate). In one aspect of the disclosed embodiment the upper arm 155UA of arm 155A is fixedly attached to the outer shaft 304 such that the upper arm 155UA rotates with the shaft 304 on a center axis of rotation (e.g. shoulder axis SX). A pulley 380 is fixedly attached to shaft 303. The upper arm 155UA includes a post 381 and a pulley 382 rotatably mounted to the post 381. The post 381 is stationarily mounted to an inner surface of the upper arm 155UA. A first set of transmission members 390 extend between the pulley 380 and pulley 382. It should be realized that any suitable type of transmission members may be used to couple the pulleys 380, 382, such as for example, belts, bands or chains. It should also be realized that while two transmission members are shown coupling the pulleys 380, 382 any suitable number of transmission members may be used to couple the pulleys 380, 382 (e.g. more or less than two). A shaft 382S is fixedly coupled to the pulley 382 so that the shaft 382S rotates with the pulley about elbow axis EXA. The shaft 382S may be rotatably supported on the post 381 in any suitable manner. The forearm 155FA is fixedly mounted to the shaft 382S so that the forearm 155FA rotates with the shaft 382S about elbow axis EXA. The forearm 155FA includes a pulley 383 rotatably supported on the top end of the post 381. The forearm 155FA also includes a post 385 and a pulley 384 rotatably mounted to the post 385. A second set of transmission members 391 (substantially similar to transmission members 390) extends between and couples the pulleys 383, 384. The end effector 155EA is fixedly mounted to the pulley 384 so that the pulley 384 and end effector 155EA rotate about wrist axis WXA. As may be realized the upper arm 155UA and forearm 155FA are independently driven (e.g. rotated) by a respective one of the shafts 304, 303 to allow independent rotation T1 and extension R1 of the arm 155A while the rotation of the end effector 155EA is slaved so that while the arm is extended and retracted along R1 a longitudinal axis of the end effector remains substantially aligned with the axis of extension and retraction R1. In other aspects of the embodiment the drive section 150 may include additional motors and drive shafts so that the end effector 155EA may also be independently rotated about the wrist axis WXA.

The upper arm 155UB of arm 155B is fixedly attached to the inner shaft 301 such that the upper arm 155UB rotates with the shaft 301 on a center axis of rotation (e.g. shoulder axis SX). A pulley 386 is fixedly attached to shaft 302. The upper arm 155UB includes a post 388 and a pulley 387 rotatably mounted to the post 388. The post 388 is stationarily mounted to an inner surface of the upper arm 155UB. A first set of transmission members 392 (substantially similar to transmission members 390) extend between the pulley 386 and pulley 387. A shaft 387S is fixedly coupled to the pulley 387 so that the shaft 387S rotates with the pulley about elbow axis EXB. The shaft 387S may be rotatably supported on the post 388 in any suitable manner. The forearm 155FB is fixedly mounted to the shaft 387S so that the forearm 155FB rotates with the shaft 387S about elbow axis EXB. The forearm 155FB includes a pulley 389 rotatably supported on the top end of the post 388. The forearm 155FB also includes a post 398 and a pulley 399 rotatably mounted to the post 398. A second set of transmission members 393 (substantially similar to transmission members 390) extends between and couples the pulleys 389, 399. The end effector 155EB is fixedly mounted to the pulley 399 so that the pulley 399 and end effector 155EB rotate about wrist axis WXB. As may be realized the upper arm 155UB and forearm 155FB are independently driven (e.g. rotated) by a respective one of the shafts 302, 301 to allow independent rotation T2 and extension R2 of the arm 155B while the rotation of the end effector 155EB is slaved so that while the arm is extended and retracted along R2 a longitudinal axis of the end effector remains substantially aligned with the axis of extension and retraction R2. In alternate embodiments the drive section 150 may include additional motors and drive shafts so that the end effector 155EB may also be independently rotated about the wrist axis WXB.

Figure 12:
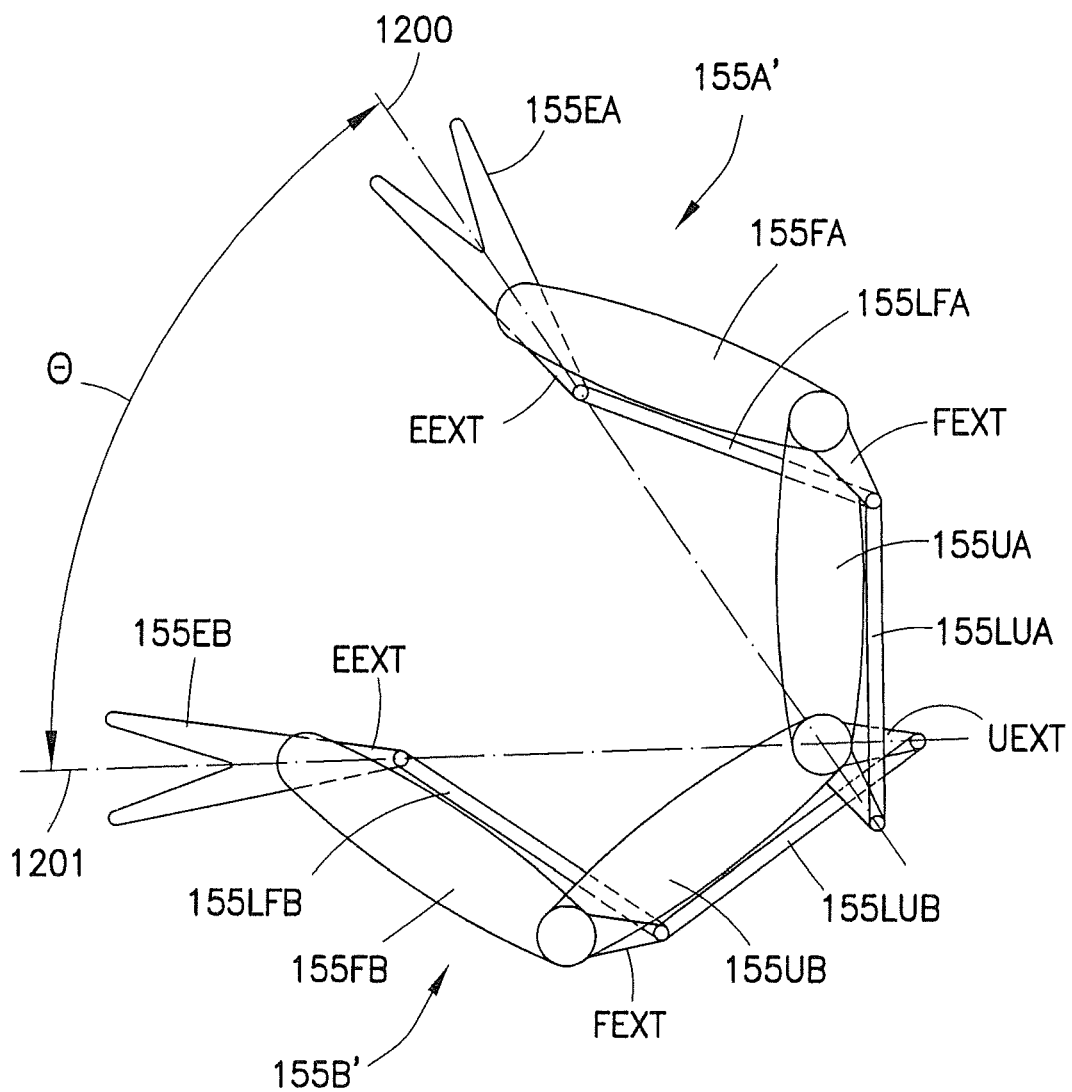
FIG. 12 illustrates a substrate transport apparatus in accordance with an aspect of the disclosed embodiment.

In another aspect, referring to FIG. 12, the rotation of the end effectors about a respective wrist axis WXA, WXB may be slaved to one or more of a respective upper arm and forearm (e.g. not independently driven) during extension and retraction in any suitable manner such as through linkages 155LFA, 155LUA, 155LFB, 155LUB. For example, referring to arm 155A each of the end effector 155EA, forearm 155FA and upper arm 155UA have an extension or coupling EEXT, FEXT, UEXT, respectively. The extensions EEXT, FEXT, UEXT are configured to couple a respective one of the linkages 155LFA, 155LUA, 155LFB, 155LUB to a respective one of the end effector 155EA, the forearm 155FA and the upper arm 155UA. In this aspect, a first end of linkage 155LUA is coupled to extension UEXT of the upper arm 155UA and a second end of linkage 155LUA is coupled to the extension FEXT of the forearm 155FA so that the linkage 155LUA is substantially parallel to the upper arm 155UA during extension and retraction of the arm 155A. A first end of linkage 155LFA is coupled to extension FEXT of the forearm 155FA and a second end of linkage 155LFA is coupled to the extension EEXT of the end effector 155EA so that the linkage 155LFA is substantially parallel to the forearm 155FA during extension and retraction of the arm 155A. As may be realized as the upper arm 155UA and forearm 155FA are rotated for extension and retraction the linkages 155LUA, 155LFA maintain the end effector at a predetermined orientation (which in this aspect is along line 1200). It is noted that arm 155B' includes extensions or couplings EEXT, FEXT, UEXT and linkages 155LFB, 155LUB which are similar to extensions and linkages for arm 155A' such that the end effector 155EB is maintained along line 1201 during extension and retraction. It is noted that while the linkages 155LFA, 155LUA, 155LFB, 155LUB may be applied to any of the robot arm configurations described herein in accordance with aspects of the disclosed embodiment.

Referring again to FIGS. 1, 2, 3A and 3B, in this aspect the shafts 382S, 387S are suitably sized so that the transport planes TP of the end effectors 155EA, 155EB are coplanar. The coplanar transport planes of the end effectors 155EA, 155EB may allow transport of substrates to and from substrate holding stations, such as the process modules 125, loadlocks 135, 140 and cassettes 115 substantially without any Z or vertical travel of the arms 155A, 155B. Hence, substantially simultaneous transfers may be effected by the arms to more than one module or load lock at different locations and orientations around the transport chamber. In alternate embodiments the drive section 150 may include a Z travel motor to allow Z movement of the arms. As may be realized, Z motion may be built into the processing modules and/or loads locks which the robot serves so that the substrates can be lifted off of or placed on the end effectors (e.g. transferred to and from the end effectors).

Referring also to FIGS. 3C-3H another drive system 1300 is shown in accordance with an aspect of the disclosed embodiment. Here the drive system 1300 includes a coaxial spindle arrangement 1310 driven by an offset motor arrangement 1301. As may be realized the motor arrangement 1301 may be any suitable motor including physically separate motors for each drive axis (e.g. the motors are vertically and/or horizontally spaced apart from one another) or the motor may be substantially similar to the motor arrangement described above with respect to FIG. 3. In this aspect, the motor arrangement 1301 may be located in an atmospheric region of the processing apparatus 100 or motor housing 1300H while the portions of the drive shafts 1311-1314 that drive the robot arm sections are located in a sealed and/or controlled environment of the processing apparatus 100. Each motor in the motor arrangement may be coupled to a respective drive pulley DP1, DP2, DP3, DP4 in any suitable manner such as through belts, cables, gears or any other suitable transmission member. As may be realized, the drive system 1300 may also include a Z-axis motor substantially similar to Z-axis motor 312 described above with respect to FIG. 3.

As can be best seen in FIGS. 3E-3H the coaxial spindle arrangement 1310 includes four drive shafts 1311-1314. As may be realized, the drive system 1300 is not limited to four drive shafts (e.g. a four axis drive) and may have more or less than four drive shafts (along with the corresponding drive motors). The outermost drive shaft 1311 is coupled to drive pulley DP1. Drive shaft 1312 is coupled to drive pulley DP2. Drive shaft 1313 is coupled to drive pulley DP3. The innermost drive shaft 1314 is coupled to drive pulley DP4. As may be realized, the couplings between the drive shafts and their respective pulleys is such that when a pulley is driven the respective drive shaft is driven with the pulley. Here the drive shafts 1311-1314 are supported radially and axially by a nested bearing arrangement that includes bearings 1320-1323 but may be supported in any other suitable manner. The outer race 1320A of bearing 1320 is fixedly attached to, for example, a mounting flange 1300X of the housing 1300H using any suitable fasteners such as bolts or screws. The inner race 1320B of bearing 1320 may be fixed to pulley DP1 and to drive shaft 1311 in any suitable manner such as with bolts or screws. The outer race 1321A of bearing 1321 is also fixed to the inner race 1320B of bearing 1320 such that the bearing 1321 is dependent from the inner race 1320B of bearing 1320. The inner race 1321B of bearing 1321 may be fixed to pulley DP2 and drive shaft 1312. The outer race 1322A of bearing 1322 is also fixed to the inner race 1321B of bearing 1321 such that the bearing 1322 is dependent from the inner race 1321B of bearing 1321. The inner race 1322B of bearing 1322 may be fixed to pulley DP3 and drive shaft 1313. The outer race 1323A of bearing 1323 may be fixed to an interior of drive shaft 1313 in any suitable manner, such as through a press/friction fit and/or a cap placed at a bottom of the drive shaft 1313. The inner race 1323B of bearing 1323 supports and is fixedly attached to drive shaft 1314 in any suitable manner. The inner race 1323B of bearing 1323 is also fixed to drive pulley DP4 (either directly or through shaft 1314) such the pulley is also supported by the inner race 1323B of bearing 1323.

As noted above, the motor housing 1300H of drive system 1300 may be located in an atmospheric section of the processing tool 100 and the portions of the drive shafts 1311-1314 that drive the arm sections may be located in a sealed and/or controlled atmosphere portion of the processing tool 100. Suitable seals, such as seals FS1-FS8 may be disposed between the drive shafts 1311-1314 and between the drive shaft 1311 and flange 1300X. While two seals are shown between each of the drive shafts 1311-1314 and between the flange 1300X and drive shaft 1311, it should be understood that more or less than two seals may be disposed in these areas. The seals FS1-FS8 may be, for example, ferro-fluidic seals or any other suitable seal capable of sealing the atmosphere of the housing 1300H from the atmosphere of the process tool 100. The seals FS1-FS8 may be held in place in any suitable manner, such as through snap rings, clips or press/interference fits.

The drive shafts 1311-1314 of drive system 1300 may be coupled to respective arm sections in a manner substantially similar to that described above with respect to FIGS. 3 and 3A. For example, referring also to FIG. 3A, the upper arm 155UA of arm 155A is fixedly attached to the outer shaft 1311 such that the upper arm 155UA rotates with the shaft 1311 on a center axis of rotation (e.g. shoulder axis SX). A pulley 380 is fixedly attached to shaft 1312. The upper arm 155UA includes a post 381 and a pulley 382 rotatably mounted to the post 381. The post 381 is stationarily mounted to an inner surface of the upper arm 155UA. A first set of transmission members 390 extend between the pulley 380 and pulley 382.

It should be realized that any suitable type of transmission members may be used to couple the pulleys 380, 382, such as for example, belts, bands or chains. It should also be realized that while two transmission members are shown coupling the pulleys 380, 382 any suitable number of transmission members may be used to couple the pulleys 380, 382 (e.g. more or less than two). A shaft 382S is fixedly coupled to the pulley 382 so that the shaft 382S rotates with the pulley about elbow axis EXA. The shaft 382S may be rotatably supported on the post 381 in any suitable manner. The forearm 155FA is fixedly mounted to the shaft 382S so that the forearm 155FA rotates with the shaft 382S about elbow axis EXA. The forearm 155FA includes a pulley 383 rotatably supported on the top end of the post 381. The forearm 155FA also includes a post 385 and a pulley 384 rotatably mounted to the post 385. A second set of transmission members 391 (substantially similar to transmission members 390) extends between and couples the pulleys 383, 384. The end effector 155EA is fixedly mounted to the pulley 384 so that the pulley 384 and end effector 155EA rotate about wrist axis WXA. As may be realized the upper arm 155UA and forearm 155FA are independently driven (e.g. rotated) by a respective one of the shafts 1311, 1312 to allow independent rotation T1 and extension R1 of the arm 155A while the rotation of the end effector 155EA is slaved so that while the arm is extended and retracted along R1 a longitudinal axis of the end effector remains substantially aligned with the axis of extension and retraction R1. In alternate embodiments the drive section 150 may include additional motors and drive shafts so that the end effector 155EA may also be independently rotated about the wrist axis WXA.

The upper arm 155UB of arm 155B is fixedly attached to the inner shaft 1314 such that the upper arm 155UB rotates with the shaft 1314 on a center axis of rotation (e.g. shoulder axis SX). A pulley 386 is fixedly attached to shaft 1313. The upper arm 155UB includes a post 388 and a pulley 387 rotatably mounted to the post 388. The post 388 is stationarily mounted to an inner surface of the upper arm 155UB. A first set of transmission members 392 (substantially similar to transmission members 390) extend between the pulley 386 and pulley 387. A shaft 387S is fixedly coupled to the pulley 387 so that the shaft 387S rotates with the pulley about elbow axis EXB. The shaft 387S may be rotatably supported on the post 388 in any suitable manner. The forearm 155FB is fixedly mounted to the shaft 387S so that the forearm 155FB rotates with the shaft 387S about elbow axis EXB. The forearm 155FB includes a pulley 389 rotatably supported on the top end of the post 388. The forearm 155FB also includes a post 398 and a pulley 399 rotatably mounted to the post 398. A second set of transmission members 393 (substantially similar to transmission members 390) extends between and couples the pulleys 389, 399. The end effector 155EB is fixedly mounted to the pulley 399 so that the pulley 399 and end effector 155EB rotate about wrist axis WXB. As may be realized the upper arm 155UB and forearm 155FB are independently driven (e.g. rotated) by a respective one of the shafts 1313, 1314 to allow independent rotation T2 and extension R2 of the arm 155B while the rotation of the end effector 155EB is slaved so that while the arm is extended and retracted along R2 a longitudinal axis of the end effector remains substantially aligned with the axis of extension and retraction R2. As may be realized the drive section 150 may include additional motors and drive shafts so that the end effector 155EB may also be independently rotated about the wrist axis WXB.

Figure 4:
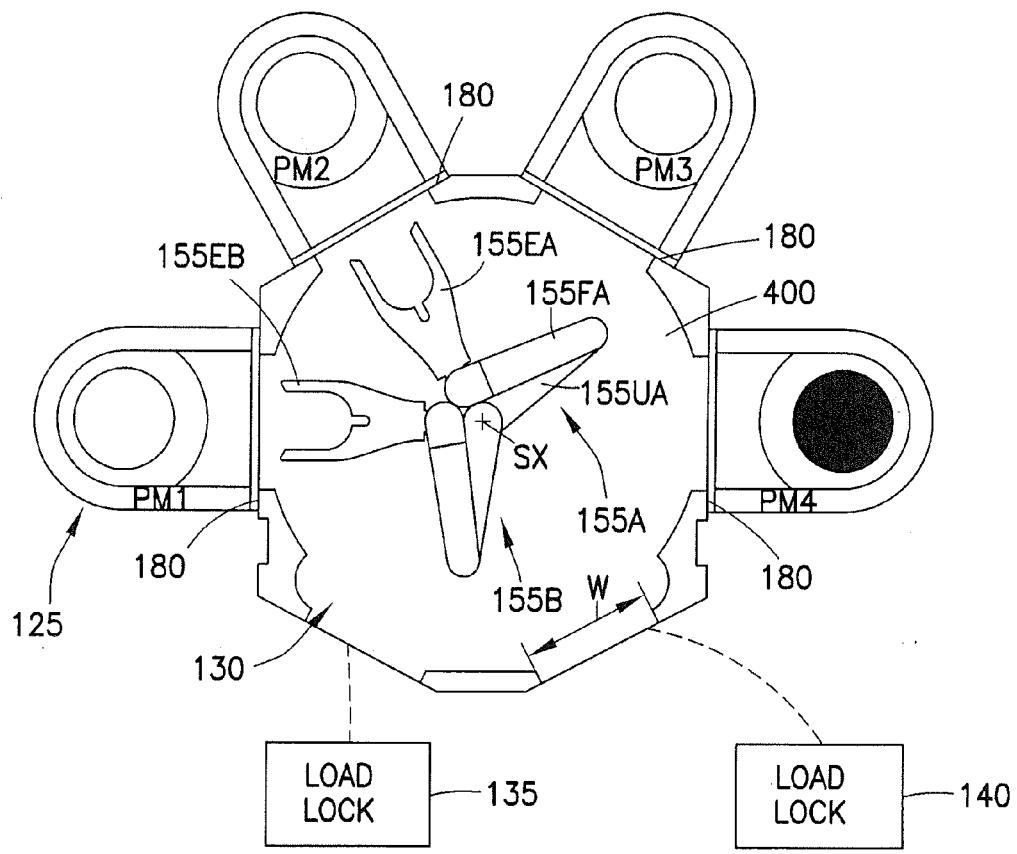
FIGS. 4 and 4A-4G illustrate an exemplary operation of the substrate transport apparatus of FIG. 2 in accordance with an aspect of the disclosed embodiment.
Figure 4A:
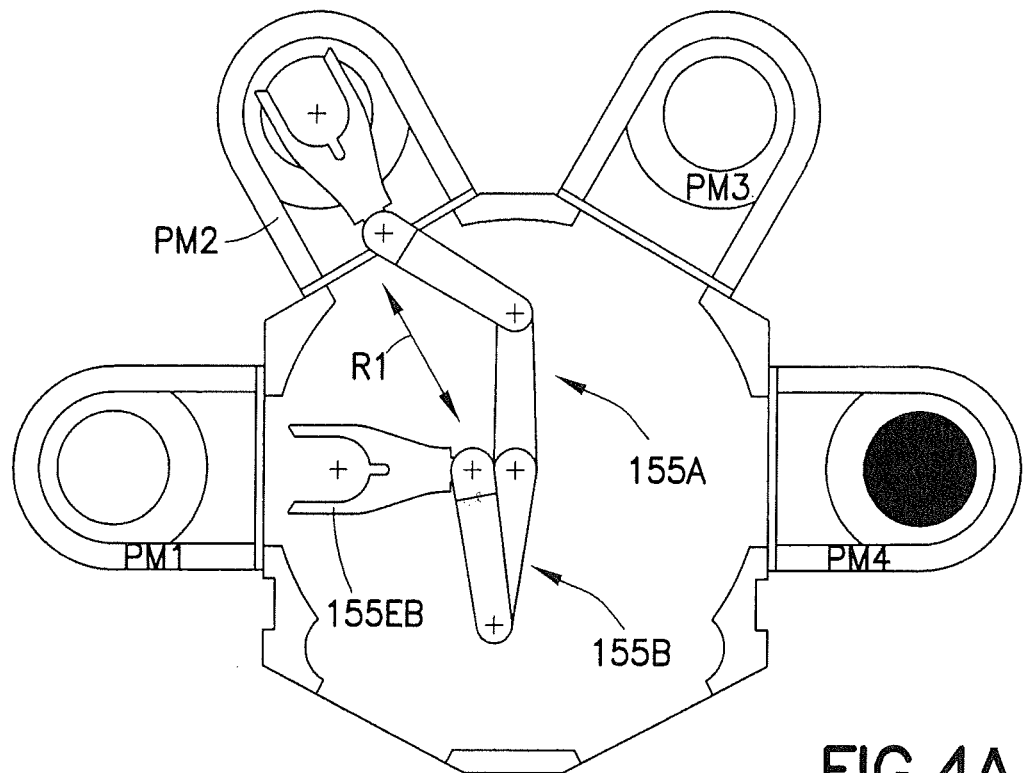
Figure 4B:
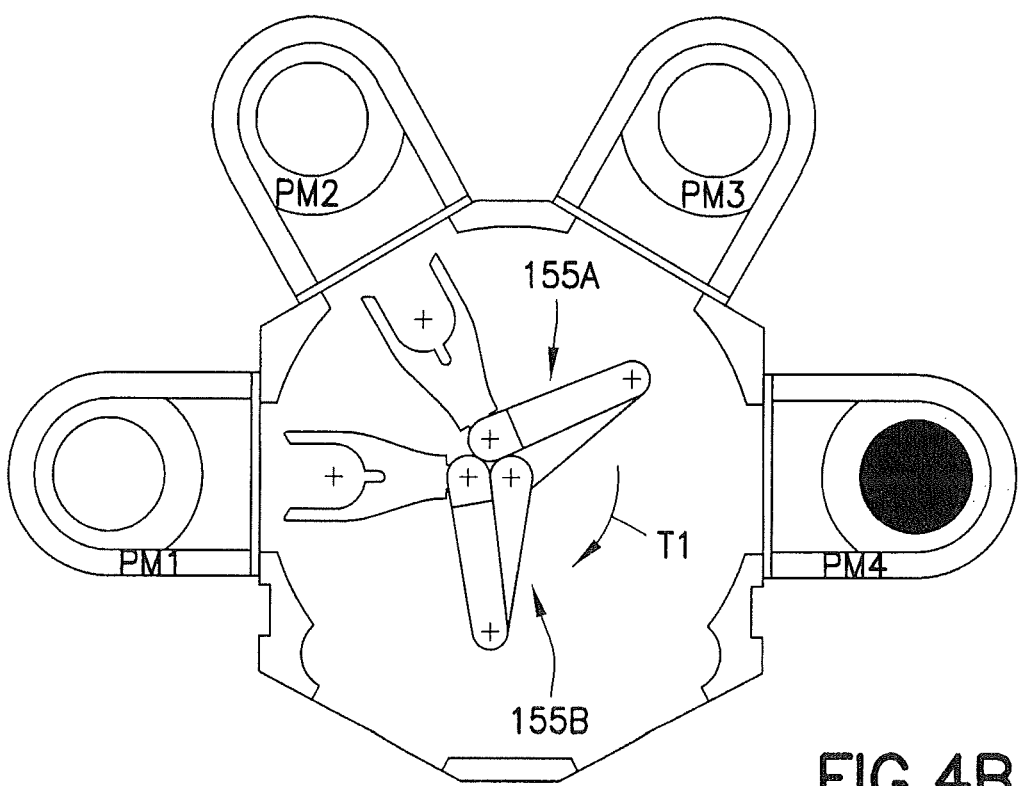
Figure 4C:
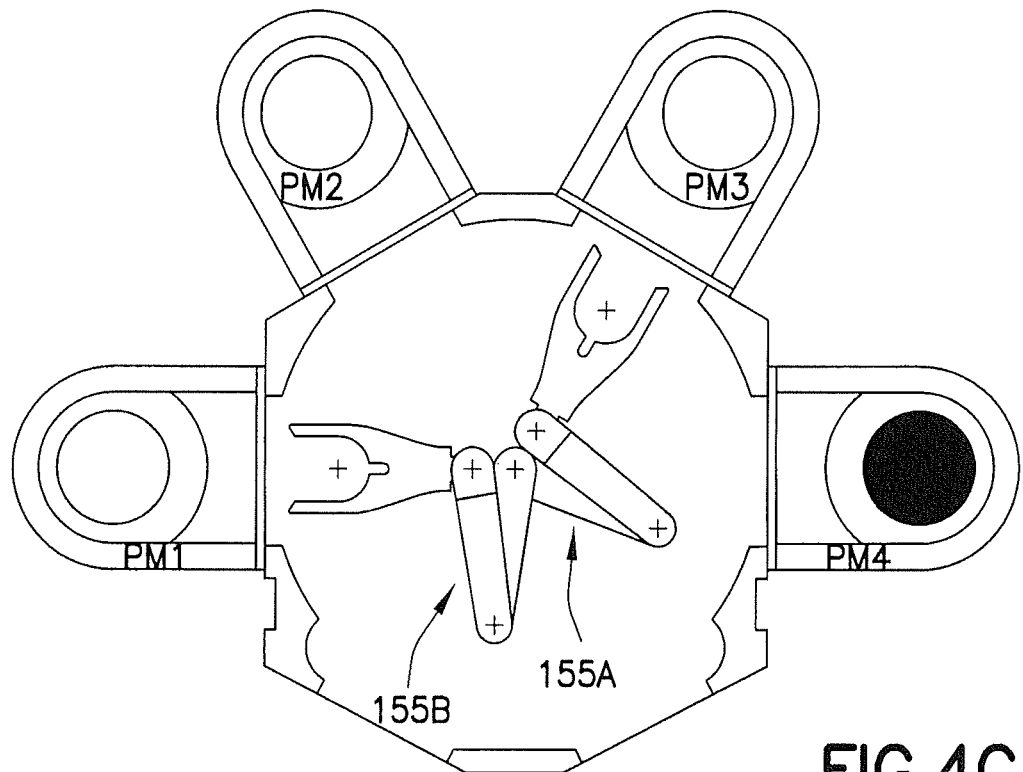
Figure 4D:
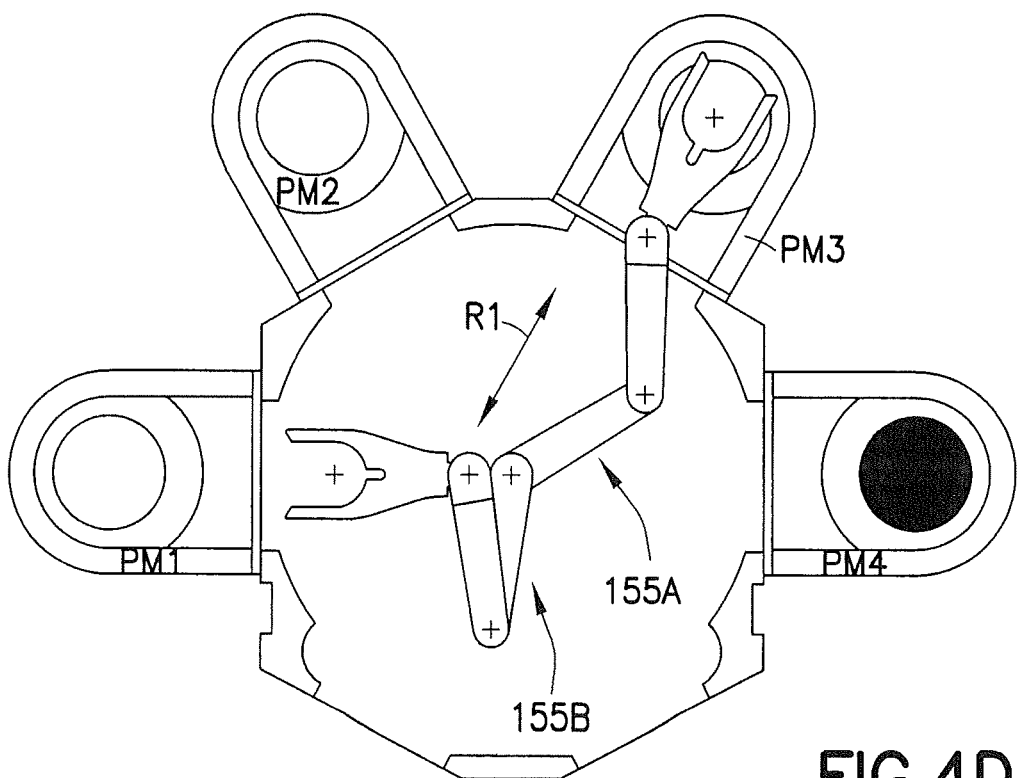
Figure 4E:
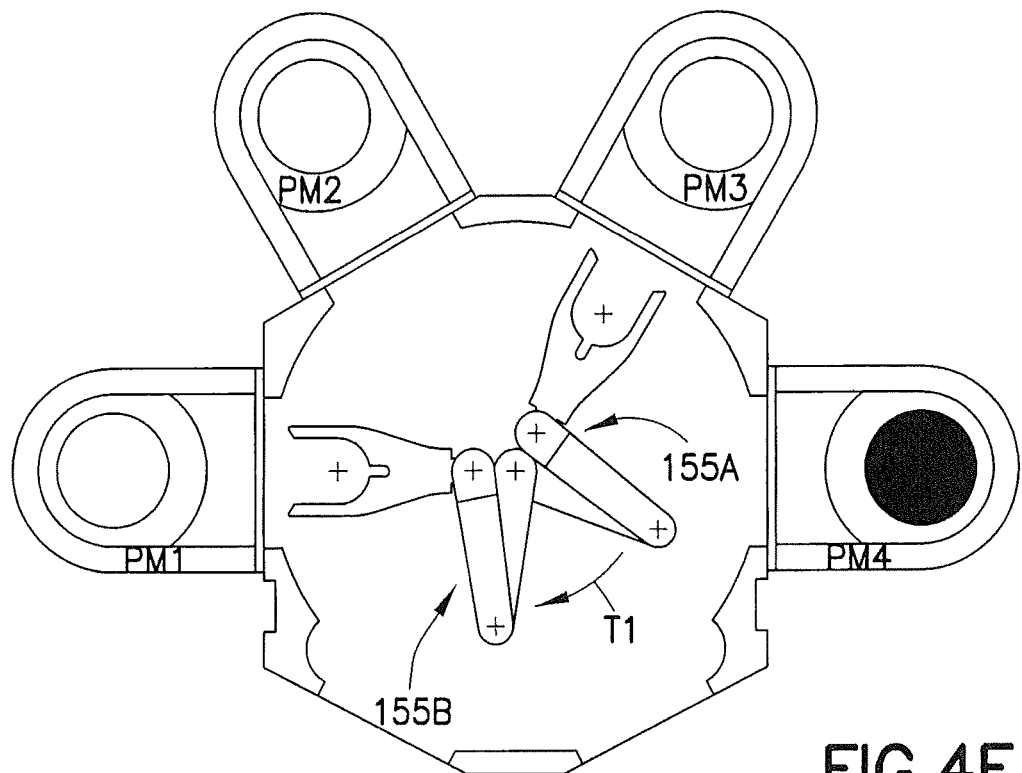
Figure 4F:
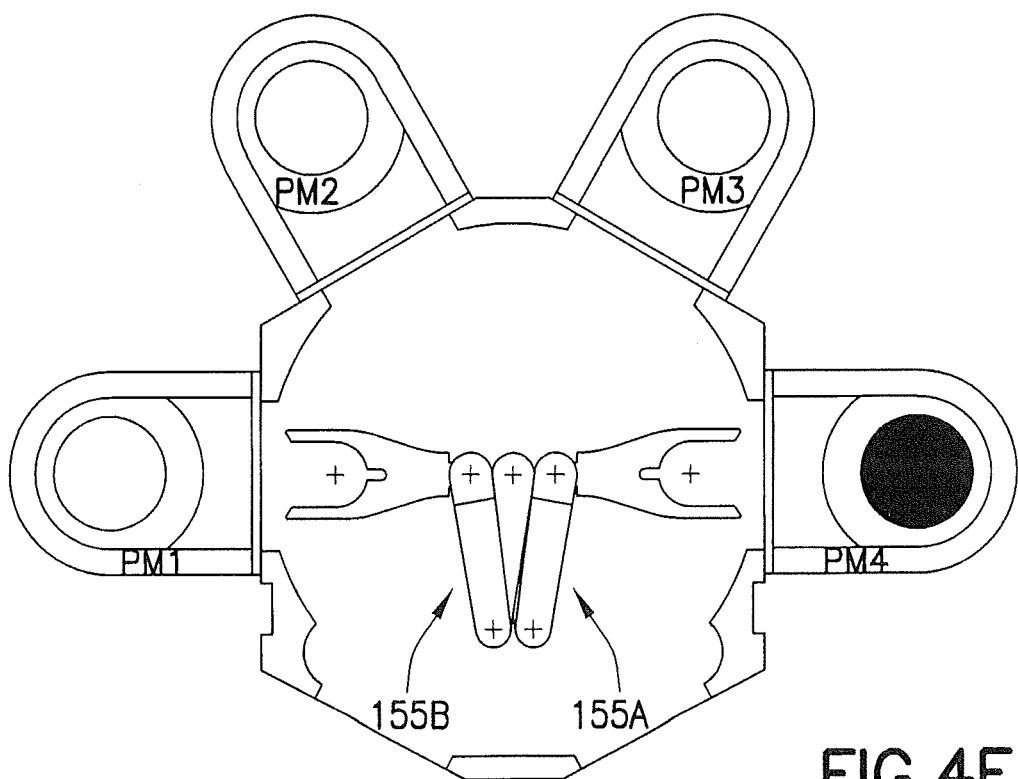
Figure 4G:
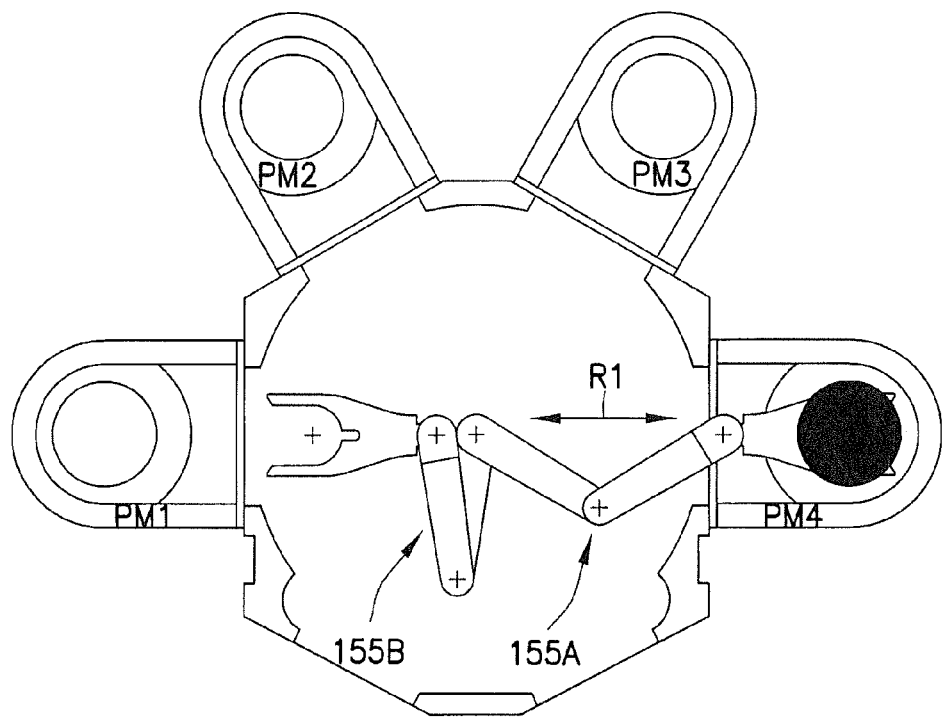
Figure 4H:
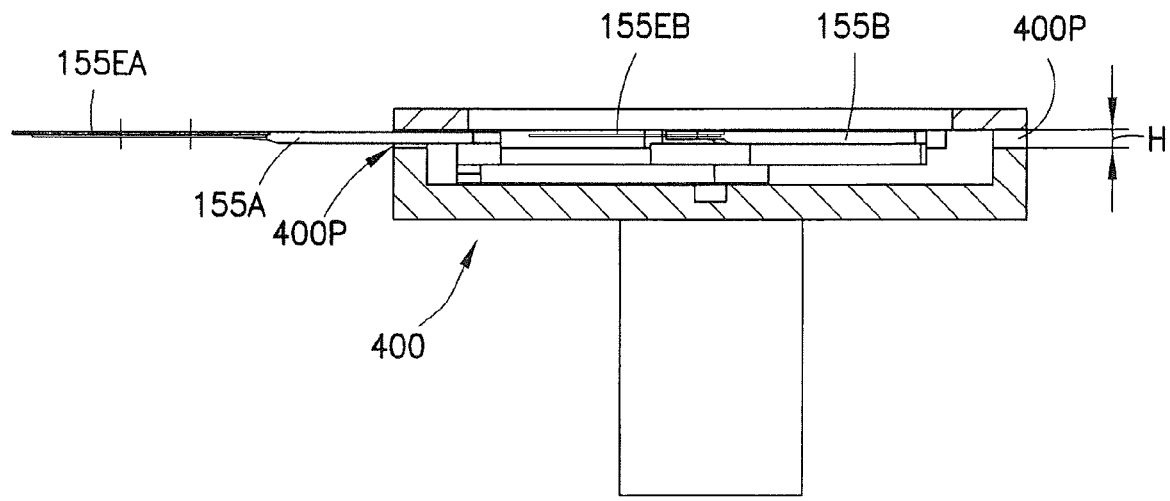
FIG. 4H illustrates a side view of a transport chamber in accordance with an aspect of the disclosed embodiment.

Referring to FIGS. 4 and 4A-4H an operation arm 155A of the transfer robot 130 using, for example, a four axis drive will be described. It should be understood that the operation of arm 155B is substantially similar to that described below with respect to arm 155A. In this aspect, the transfer robot 130 is shown located within a transfer chamber 400. FIG. 4H illustrates a side view of the transfer chamber 400. It is noted that the transfer chamber includes sealable apertures or ports 400P that may be sealed in any suitable manner such as with gate valves (not shown). The height H and width W of the ports 400P may be minimized such that the end effector 155EA, 155EB with a substrate thereon can pass through the port with minimal clearance. The transfer chamber 400 may be substantially similar to central chamber 175 described above. The transfer chamber includes openings or gate valves 180 to which process modules 125 (PM1-PM4) are attached. As described above, the transfer planes TP (e.g. the end effectors as well as the forearms and wrists) (FIG. 3A) of the arms 155A, 155B are coplanar so that the end effectors 155EA, 155EB of the arms 155A, 155B cannot access the same process module without rotation of both arms 155A, 155B of the transfer robot about the shoulder axis SX. As may be realized, each of the arms 155A, 155B is capable of accessing all the process modules (and loadlocks—not shown) attached to the transfer chamber 400. For example, with suitable rotation of one or more arms each arm is capable of accessing adjacent process modules, alternately spaced process modules and process modules located approximately 180 degrees apart.

As can be seen in FIG. 4 the arms 155A, 155B are arranged so that the end effectors 155EA, 155EB are aligned with adjacent process modules PM1, PM2. To extend arm 155A so that end effector 155EA enters the process module PM2 the motor 342 rotates shaft 304 relative to shaft 303 while shaft 303 is kept substantially stationary. However, shaft 303 may be rotated slightly during extension and retraction to speed up the transfer process with the start or finish of rotation of the entire movable arm assembly 155A. With the shaft 303 (and pulley 380) kept stationary and the upper arm 155UA moved, the pulley 382 is rotated by transmission members 390. This, in turn, rotates the forearm 155FA about axis EXA. Because the pulley 383 is stationarily attached to post 381, and because the post 381 is stationarily attached to the forearm 155FA, the pulley 384 is rotated by the transmission members 391 relative to the forearm 155FA. The pulleys 380, 382, 384 may be sized relative to each other to allow end effector 155EA to be moved straight radially in and out along extension/retraction axis R1 as can be seen in FIG. 4A. As may be realized extension and retraction of arm 155B may occur in a substantially similar manner where motor 348 rotates shaft 301 relative to shaft 302.

Rotation of the arm 155A (T1 rotation) so that the arm is moved from process module PM2 to process module PM3 occurs through operation of both motor 342 and 344 so that the shafts 304, 303 are rotated in the same direction substantially simultaneously at substantially the same speed as shown in FIG. 4B. Once the arm 155A is positioned so that end effector 155EA is aligned with process module PM3 the arm may be extended and retracted in a manner substantially similar to that described above as shown in FIG. 4D. Likewise, to rotate the arm 155A (T1 rotation) so that the arm is moved from process module PM3 to process module PM4 both motor 342 and 344 are operated so that the shafts 304, 303 are rotated in the same direction substantially simultaneously at substantially the same speed as shown in FIG. 4E. Once the arm 155A is positioned so that end effector 155EA is aligned with process module PM4 the arm may be extended and retracted in a manner substantially similar to that described above as shown in FIG. 4G. As may be realized, the rotation of the arm 155A in, for example, a clockwise direction as shown in FIGS. 4A-4G is substantially limited to a point of rotation where the end effectors are substantially 180 degrees apart due to, for example, the transfer planes TP, the forearms 155FA, 155FB and the wrists being located in the same plane (e.g. the forearms are located in a common plane, the wrists are located in a common plane, and the end effectors/substrates are located along common transfer plane TP, see e.g. FIG. 3A). As such the transport paths R1, R2 of the transport arms are angled relative to one another where the angle ranges from adjacent substrate holding locations to substrate holding locations that are approximately 180 degrees apart.

Figure 4I:
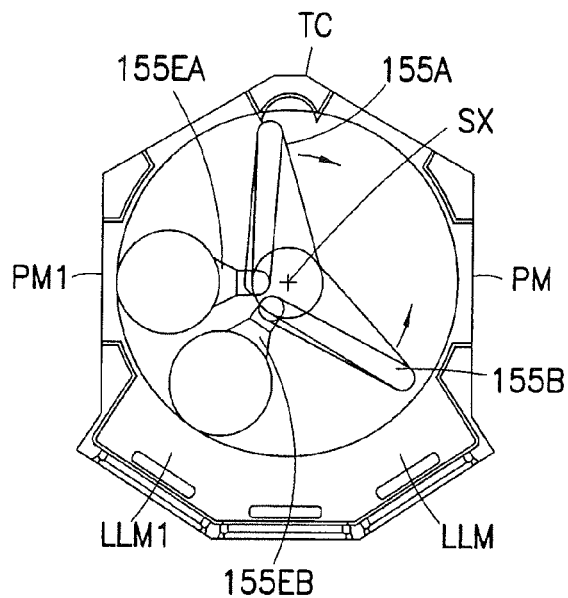
FIGS. 4I-4O illustrate an exemplary operation of a transport apparatus in accordance with aspects of the disclosed embodiment.
Figure 4J:
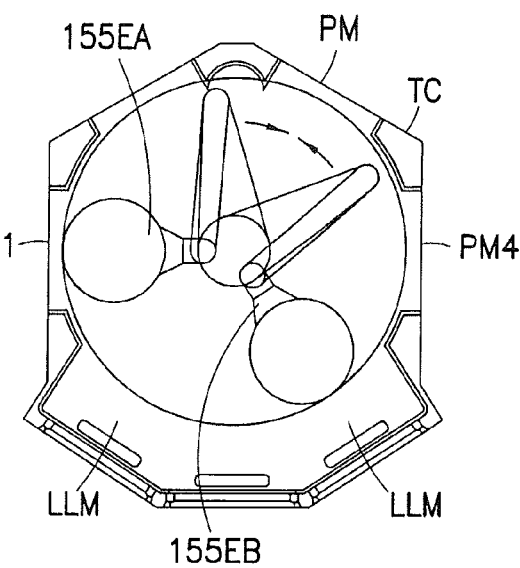
Figure 4K:
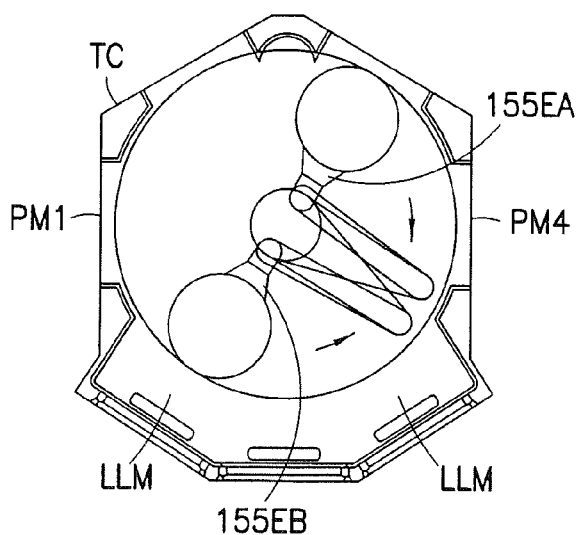
Figure 4L:
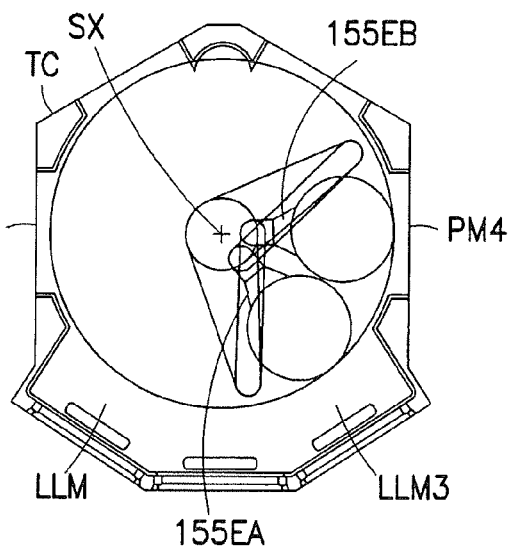
Figure 4M:
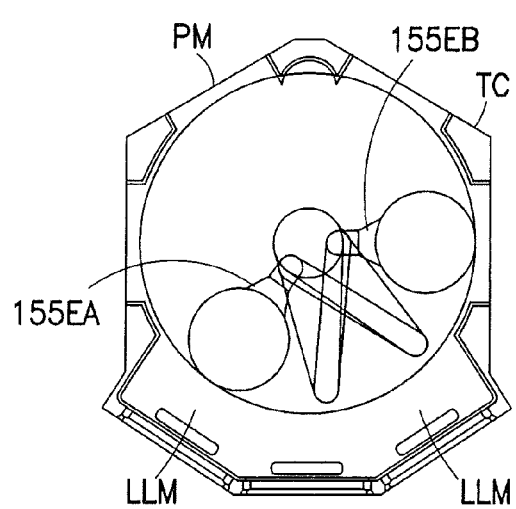
Figure 4N:
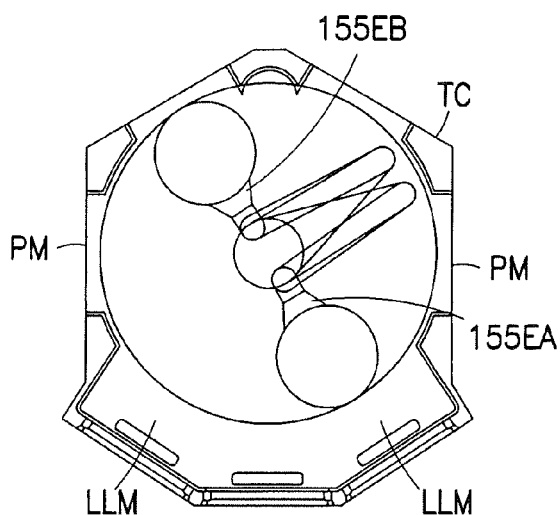
Figure 4O:
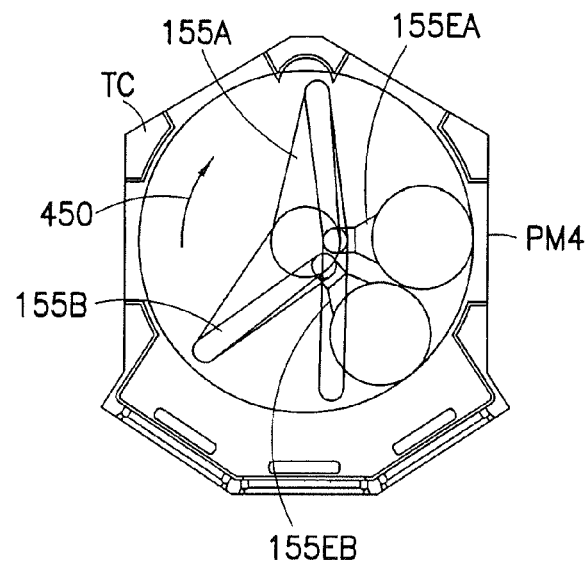

As may be realized, where the end effectors 155EA, 155EB are disposed in substantially the same transfer plane TP (FIG. 3A) in some circumstances the end effectors 155EA, 155EB may not be able to pass over one another (i.e. one arm blocks rotation of the other arm). As such, the theta movement of the individual arms 155A, 155B is limited or partially independent in which case the arms 155A, 155B have to be rotated as a unit (e.g. a long process move) about the shoulder axis SX to "unblock" stations that are to be accessed. In other aspects, the arms 155EA, 155EB can move independently of each other for accessing stations that are up to 180 degrees apart without one arm blocking the other arm's access to a station (e.g. load lock, process module, etc.). For example, referring to FIGS. 4I-4K and exemplary transfer chamber TC having process modules PM and load lock modules LLM is shown. It should be understood that the transfer chamber may have any configuration with any suitable number of process modules and load lock modules. As can be seen in FIGS. 4J-4L each arm 155A, 155B is able to move its respective end effector 155EA, 155EB without interference from the other arm 155A, 155B (e.g. a short process move) to access stations up to approximately 180 degrees apart. Any individual rotation of the arms 155A, 155B beyond approximately 180 degrees would result in one arm 155A, 155B trying to pass through the other arm 155A, 155B as shown in FIGS. 4L-4N, which is not possible when the end effectors are disposed in the same plane TP. To access stations beyond 180 degrees both arms 155A, 155B have to be rotated about the shoulder axes SX simultaneously and in the same direction as a unit. The controller, such as controller 170 (FIG. 1) may be configured to recognize, which stations can be accessed using short process moves and which stations can be accessed using long process moves. During operation of the robot, the controller 170 is configured to "unblock" stations (e.g. by issuing appropriate commands to the motors drives for rotating the arms) that are to be accessed where such access cannot be performed with a short access move. For example, referring to FIGS. 4I and 4L if end effector 155EA is to move from process module PM1 to process module PM4 the controller 170 is configured to recognize that moving arm 155A independent of arm 155B to place end effector 155EA at process module PM4 may result in interference between the arms 155A, 155B. As such, if the arms will interfere with each other, instead of moving the arms 155A independently the controller may move arms 155A, 155B as a unit in (e.g. move the arms at the same time in the same direction and at the same or at different speeds), for example, direction 450 as shown in FIG. 4O to unblock access to process module PM4 for allowing end effector 155EA to access the process module PM4.

Referring now to FIGS. 5A and 5B another transfer robot 530 is shown in accordance with an aspect of the disclosed embodiment. The transfer robot 530 may be substantially similar to transfer robot 130 described above except where otherwise noted. In this aspect, the transfer robot 530 includes a drive section 150 which may be substantially similar to the drive sections described above with respect to FIGS. 3 and 3C-3H or any other suitable drive system. As may be realized, the drive section 150 may include a Z axis drive 312 (FIG. 3). The Z axis drive 312 may be connected to, for example, the housing 310 of the drive 150 in any suitable manner. The Z axis drive 312 may be configured to drive the housing 310, including any arms 555A, 555B connected thereto, in the Z-direction so that the end effectors 555EA, 555EB of each of the arms 555A, 555B can be moved to different transfer planes.

In this aspect, the transfer robot 530 includes two transfer arms 555A, 555B. The transfer arm 555A may be substantially similar to transfer arm 155A described above such that like features have like reference numbers (e.g. upper arm 555UA, forearm 555FA and end effector 555EA). The transfer arm 555A may be connected to shafts 304, 303 of the drive section (FIG. 3) in a manner substantially similar to that described above. The transfer arm 555B may also be substantially similar to transfer arm 155B described above such that like features have like reference numbers (e.g. upper arm 555UB, forearm 555FB and end effector 555EB). The transfer arm 555B may be connected to shafts 302, 301 of the drive section (FIG. 3) in a manner substantially similar to that described above. In this aspect, however, the shafts 582S, 587S (which correspond to shafts 382S, 387S in FIG. 3) are sized so that the arm 555B is able to rotate substantially 360 degrees infinitely and uninterrupted independent of the rotation of arm 355A and vice versa. In addition, the forearm 555FB of arm 555FB may be mounted to an underside of the upper arm 555UB (whereas the forearm 155FB is mounted to an upper side of the upper arm 155UB in FIG. 2—e.g. vertically opposed forearms) so that the transfer plane TP2 of end effector 555EB is near, but not coplanar, with the transfer plane TP1 of end effector 555EA to substantially minimize the amount of Z movement needed to transfer substrates using the different arms 555A, 555B. This non-coplanar arrangement allows for independent operation of each arm where the extension and retraction R1, R2 of the arms can be angled relative to one another as well as for the fast swap of substrate at a single substrate holding location. It is noted that the spacing between the transfer planes TP1, TP2 may be such that both end effectors 555EA, 555EB can fit through a transfer port, such as 400P (FIG. 4H) substantially without or with minimal Z motion of the end effectors. As may be realized, where robot 530 is not capable of moving the arms 555A, 555B along the Z axis the port may have a slightly larger height than the height H of the port 400P and/or Z movement may be built into the processing modules and/or loadlocks which the robot 530 serves.

Figure 5E:
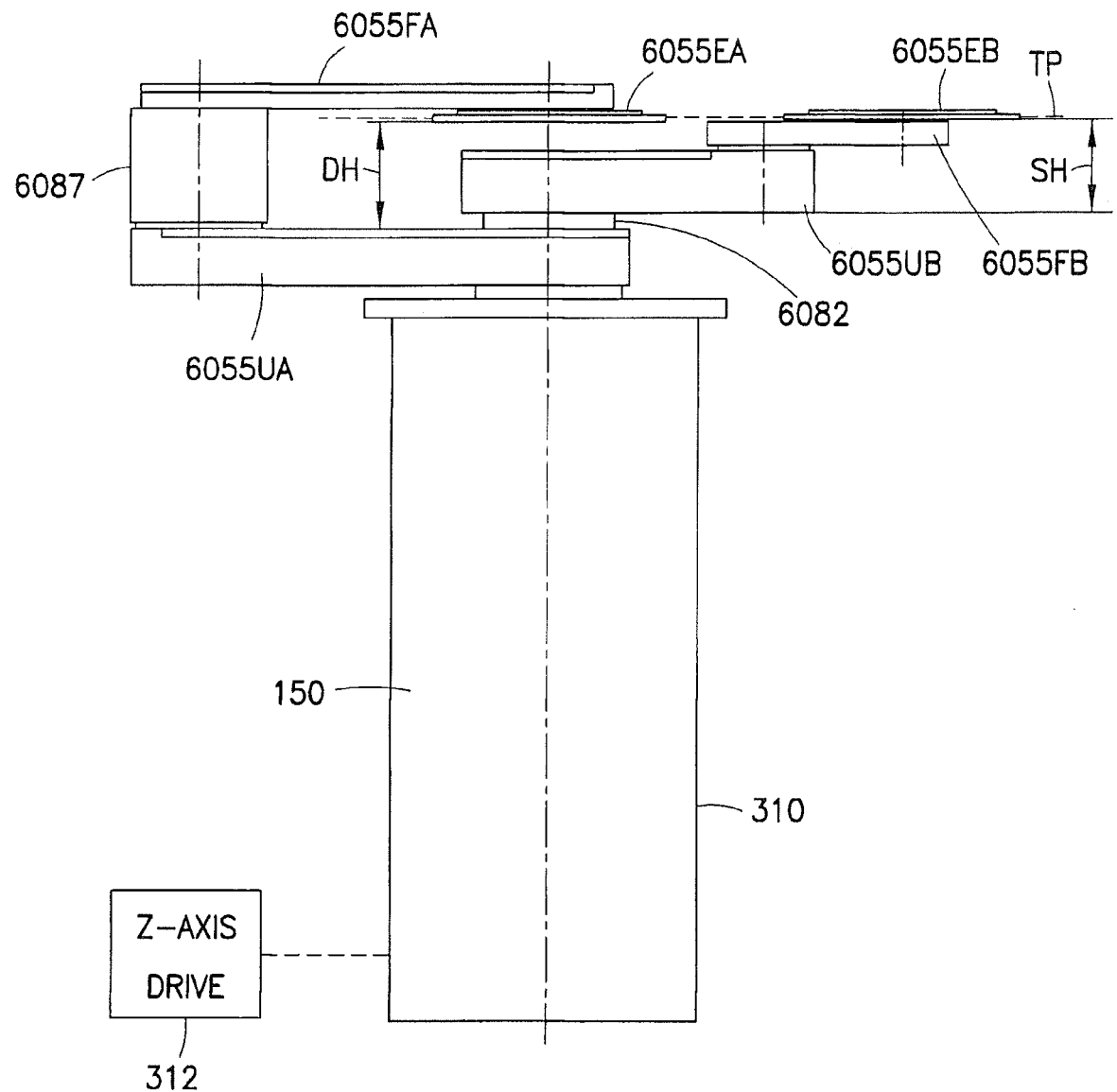

Referring now to FIGS. 5C-5E another transfer robot 6000 is shown in accordance with an aspect of the disclosed embodiment. The transfer robot 6000 may be substantially similar to transfer robot 130 described above except where otherwise noted. In this aspect, the transfer robot 6000 includes a drive section 150 which may be substantially similar to the drive sections described herein such as e.g. with respect to FIGS. 3 and 3C-3H or any other suitable drive system. As may be realized, in one aspect the drive section 150 may include a Z axis drive 312 (FIG. 3). The Z axis drive 312 may be connected to, for example, the housing 310 of the drive 150 in any suitable manner. The Z axis drive 312 may be configured to drive the housing 310, including any arms 6055A, 6055B connected thereto, in the Z-direction so that the end effectors 6055EA, 6055EB of each of the arms 6055A, 6055B can be moved to different transfer planes. In other aspects the drive may not include a Z-axis drive.

In this aspect, the transfer robot 6000 includes two independently movable transfer arms 6055A, 6055B. The transfer arm 6055A may be connected to shafts 304, 303 of the drive section (FIG. 3) in a manner substantially similar to that described above. The transfer arm 6055B may be connected to shafts 302, 301 of the drive section (FIG. 3) in a manner substantially similar to that described above. In this aspect, each arm 6055A, 6055B respectively includes an upper arm 6055UA, 6055UB, a forearm 6055FA, 6055FB and at least one end effector 6055EA, 6055EB. However, in this aspect, the arms 6055A, 6055B may be configured so that the end effectors 6055EA, 6055EB are disposed on a common plane, such as transfer plane TP while the forearms 6055FA, 6055FB are disposed in different planes to allow for increased arm rotation (e.g. when compared to when the forearms and end effectors are located respective common planes) substantially without restricting arm extension. For exemplary purposes only where the forearms are disposed in a common plane and the end effectors are disposed in a common plane, such as described with respect to FIGS. 4 and 4A-4O above, one arm may rotate about 120 degrees while the other arm remains substantially stationary (or otherwise aligned with a substrate holding station for picking and placing substrates). In this aspect, also for exemplary purposes only, with the forearms disposed in different planes and the end effectors disposed in a common plane one arm may rotate about 180 degrees while the other arm remains substantially stationary (or otherwise aligned with a substrate holding station for picking and placing substrates).

In a manner substantially similar to that described above with respect to FIGS. 5A and 5B the shafts 6082, 6087 (e.g. disposed at the elbows of the respective arms) are sized so that the forearm 6055FA of arm 6055A is disposed in a different plane than the forearm 6055FB of arm 6055B. As may be realized, the end effector 6055EA of arm 6055A may be mounted to an underside of the forearm 6055FA so that both end effectors 6055EA, 6055EB are disposed on the common transfer plane TP (e.g. the end effectors are coplanar) to substantially minimize Z movement of the robot arms and/or eliminate Z movement (if the substrate holding stations have Z movement capability) of the robot arms needed to transfer substrates using the different arms 6055A, 6055B. As can be seen best in FIG. 5E, the lengths of the upper arm and forearm 6055UA, 6055UB of arm 6055A may be different than the lengths of the upper arm and forearm of arm 6055B. For example, the lengths of the upper arm and forearm 6055UA, 6055FA may be longer than the lengths of upper arm and forearm 6055UB, 6055FB so that arm 6055B may rotate "through" arm 6055A as will be described in greater detail below. As may be realized, the shafts 6087, 6082 may also be sized to allow for arm 6055B to rotate through arm 6055A (e.g. a stack height SH of the upper arm and forearm 6055UB, 6055FB of arm 6055B is less than a distance DH between the upper arm 6055UA and end effector 6055EA of arm 6055A).

Referring also to FIGS. 5G and 5F, an operation of the transfer robot 6000 will be described. In a manner similar to that described above, a minimum angle α between end effectors 6055EA, 6055EB may be substantially the same as the angle θ' between radially arranged process modules, such as process modules PM4, PM3 of, e.g. FIG. 4A. For exemplary purposes only, the angle α may be about 60 degrees but in other aspects the angle may be more or less than 60 degrees such as when larger or smaller substrates are processed. In this aspect, referring to FIG. 5F, the end effector 6055EA may be aligned with process module PM1 for transferring a substrate WA to/from the process module PM1. End effector 6055EB may be aligned with load lock 140 for transferring a substrate WB to/from the load lock 140. Here the load lock 140 and process module PM1 are radially disposed β degrees apart from each other. The angle β may be any suitable angle and, for exemplary purposes only, may be about 120 degrees. In other aspects the angle β may be more or less than 120 degrees. In this example, the substrate WB is being transferred to load lock 140 while substrate WA is transferred to process module PM1. To make the transfer, both arms 6055A, 6055B are rotated in the direction of arrow 6099, as it is noted that the end effectors 6055EA, 6055EB are disposed in the same plane and cannot pass over one another. The arm 6055B may move through angle β to align the end effector 6055EB and substrate WB with process module PM1. The arm 6055A may move through angle β' (which in this example, for exemplary purposes only, is about 240 degrees) so that the end effector 6055EA and substrate WA are aligned with load lock 140. It is noted that as the arm 6055A rotates in the direction of arrow 6099 it passes arm 6055B such that the upper arm 6055UB and forearm 6055FB of arm 6055B pass between (or "through") the upper arm 6055UA and forearm 6055FA (and end effector 6055EA) of arm 6055A.

As may be realized, the theta movement of the individual arms 6055A, 6055B may be limited or partially independent (e.g. because the end effectors 6055EA, 6055EB are coplanar) in which case the arms 6055A, 6055B have to be rotated as a unit (e.g. a long process move) about the shoulder axis SX to "unblock" stations that are to be accessed in a manner substantially similar to that described above, such as under the control of controller 170.

Figure 6:
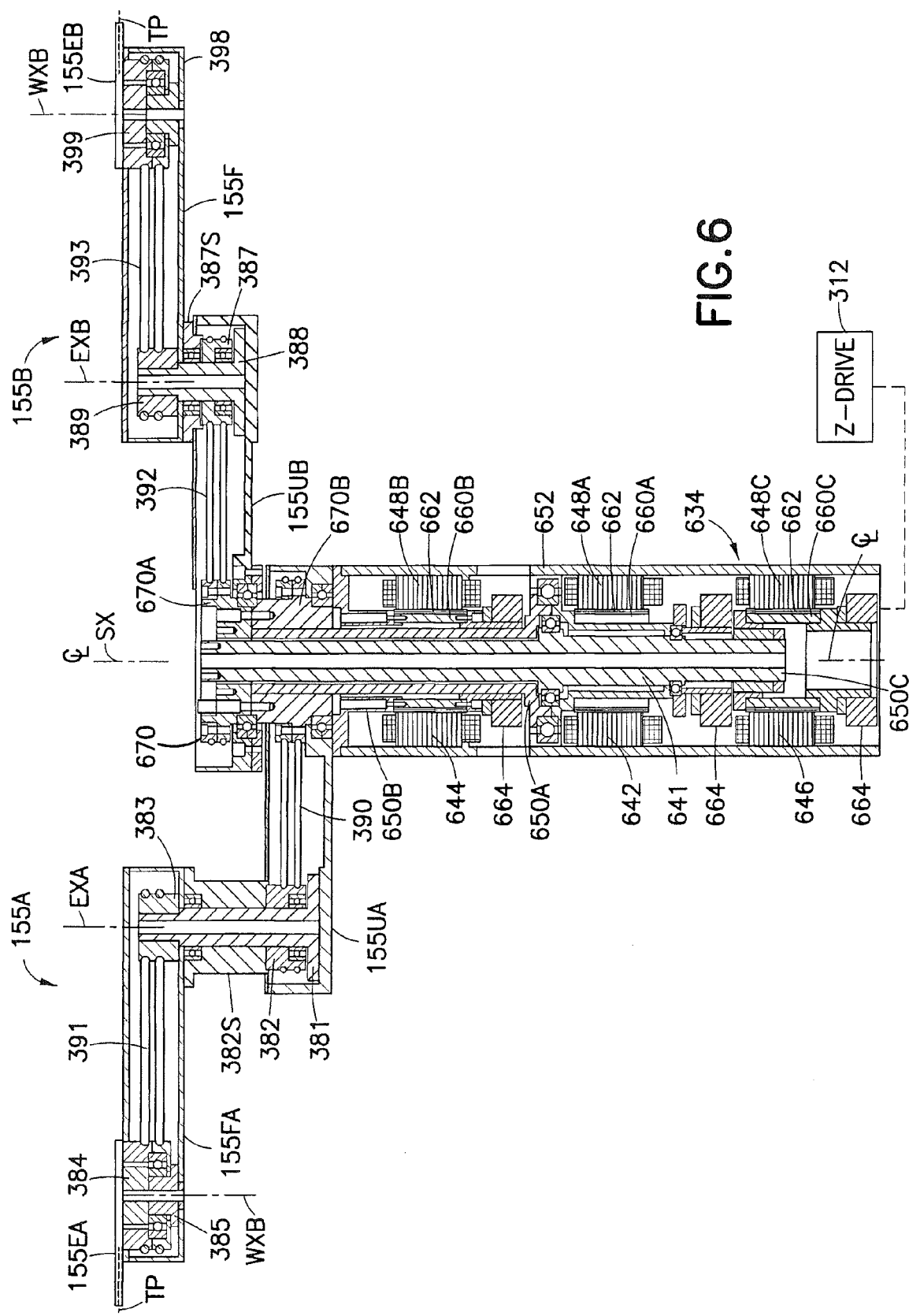
FIG. 6 illustrates a drive section of a substrate transport apparatus in accordance with an aspect of the disclosed embodiment.

As noted above, the arms, such as arms 155A, 155B (and arms 6055A, 6055B) (having substantially coplanar end effectors) may be driven by a three axis drive system such that the theta movement of the upper arms 155UA, 155UB of each arm are linked (e.g. the upper arms rotate so that a predetermined angle is maintained between the upper arms). Referring to FIG. 6, the three axis drive system 634 generally comprises a drive shaft assembly 641 and three motors 642, 644, 646. The drive shaft assembly 641 has three drive shafts 650A, 650B, 650C. As may be realized the drive system may not be limited to three motors and three drive shafts. The first motor 642 comprises a stator 648A and a rotor 660A connected to the middle shaft 650A. The second motor 644 comprises a stator 648B and a rotor 660B connected to the outer shaft 650B. The third motor 646 comprises a stator 648C and rotor 660C connected to the inner shaft 650C. The three stators 648A, 648B, 648C are stationarily attached to the tube or housing 652 at different vertical heights or locations along the tube. For illustrative purposes only the first stator 648A is the middle stator, the second stator 648B is the top stator and the third stator 648C is the bottom stator. Each stator generally comprises an electromagnetic coil. The three shafts 650A, 650B, and 650C are arranged as coaxial shafts. The three rotors 660A, 660B, 660C are preferably comprised of permanent magnets, but may alternatively comprise a magnetic induction rotor that does not have permanent magnets. Sleeves 662 are preferably located between the rotor 660 and the stators 648 to allow the robot to be useable in a vacuum environment with the drive shaft assembly 641 being located in a vacuum environment and the stators 648 being located outside of the vacuum environment. However, the sleeves 662 need not be provided if the robot is only intended for use in an atmospheric environment.

The third shaft 650C is the inner shaft and extends from the bottom stator 648C. The inner shaft has the third rotor 660C aligned with the bottom stator 648C. The middle shaft 650A extends upward from the middle stator 648A. The middle shaft has the first rotor 660A aligned with the first stator 648A. The outer shaft 650B extends upward from the top stator 648B. The outer shaft has the second rotor 660B aligned with the upper stator 648B. Various bearings are provided about the shafts 650A-650C and the tube 652 to allow each shaft to be independently rotatable relative to each other and the tube 652. Each shaft 650A-650C may be provided with a position sensor 664. The position sensors 664 are used to signal the controller 170 (FIG. 1) of the rotational position of the shafts 650A-650C relative to each other and/or relative to the tube 652. Any suitable sensor could be used, such as optical or induction.

Here the upper arm 155UA is coupled to the outer shaft 650B so that as the outer shaft rotates the upper arm 155UA rotates with it. The upper arm 155UB is coupled to the inner shaft 350C so that as the inner shaft rotates the upper arm 155UB rotates with it. A pulley 670 having a first or upper pulley section 370A, and a second or lower pulley section 670B is coupled to the middle shaft 350A so that as the middle shaft rotates the pulley 670 (and the pulley sections 670A, 670B) rotate with it. As may be realized the pulley 670 may be one unitary piece or the two pulley sections 670A, 670B that are fixed to each other and the shaft 650A in any suitable manner. The pulley section 670A is coupled to pulley 387 of arm 155B through transmission 392 and pulley section 670B is coupled to pulley 382 of arm 155A through transmission 390.

The three motors 642, 644, 646 are independently movable to independently move the two arms 155A, 155B in extension and retraction. It is noted that the two arms 155A, 155B can be extended simultaneously together, individually one at a time, or one arm can be extended while the other arm is retracted. The arms 155A, 155B can be moved to extend and retract the two end effectors 155EA, 155EB for picking up and for placing substrates, and the drive 634 can rotate the entire movable arm assembly (i.e. both arms 155A, 155B) as a unit about the shoulder axis SX to reorient the arms 155A, 155B relative to the processing modules, loadlocks and/or any other features of the processing tool in which the arms are located.

In order to extend and retract the arm 155A, the motor 644 is activated to rotate the outer shaft 650B relative to the middle shaft 650A. Preferably, the middle shaft 650A is kept stationary while the arm 155A is being extended and retracted. However, the pulley 670 may be moved slightly during extension or retraction to speed up the transfer process with the start or finish of rotation of the entire movable arm assembly. With the pulley 670 kept substantially stationary and the upper arm 155UA moved, the pulley 382 is rotated by the transmission members 390. This, in turn, rotates the forearm 155FA about the elbow axis EXA. Because the pulley 383 is stationarily attached to the post 381, and because the post is stationarily attached to the upper arm 155UA, the pulley 384 is rotated by the transmission members 391 relative to the forearm 155FA. It is noted that the pulley diameter ratio can be any suitable ratio, such as those described above, so that the end effector (and substrate thereon) is moved straight radially in and out.

In order to extend and retract the arm 155B, the motor 646 is actuated to rotate the inner shaft 650C relative to the middle shaft 650A. Preferably, the middle shaft 650A is kept stationary while the arm 155B is being extended and retracted. However, the pulley 670 may be moved slightly during extension or retraction to speed up the transfer process with the start or finish of rotation of the entire movable arm assembly. With the pulley 670 kept substantially stationary and the upper arm 155UB moved, the pulley 387 is rotated by the transmission members 392. This, in turn, rotates the forearm 155FB about the elbow axis EXB. Because the pulley 389 is stationarily attached to the post 388, and because the post 388 is stationarily attached to the upper arm 155UB, the pulley 399 is rotated by the transmission members 393 relative to the forearm 155FB. It is noted that the pulley diameter ratio can be any suitable ratio, such as those described above, so that the end effector (and substrate thereon) is moved straight radially in and out.

The motor 642 is used in conjunction with the two other motors 644, 646 in order to rotate the entire arm assembly about the shoulder axis SX. The motor 642 is rotated to rotate the middle shaft 650A and, thus, rotate the main pulley 670. The motors 644, 646 are moved in the same direction and speed as the motor 642 to rotate the upper arms 155UA, 155UB with the pulley 670. Thus, the transmission members 390, 392 do not rotate their respective pulleys 382, 387. Therefore, the forearms 155FA, 155FB are not rotated relative to their respective upper arms 155US, 155UB and the pulleys 384, 399 are not rotated to rotate the end effectors 155EA, 155EB. As may be realized, the rotation of the arms 155A, 155B about the shoulder axis SX is a coupled rotation (e.g. both arms rotate together as a unit while an angle between the upper arms 155UA, 155UB is maintained) and the extension and retraction of the arms can be performed individually or simultaneously. As may also be realized, a Z axis drive 312 (substantially similar to that described above) can be connected to the drive system 634 to lift and lower the arms 155A, 155B along the Z axis.

As may be realized, the exemplary transfer robots 130, 530 described herein allows for sequential processing of substrates where one or more of the processing modules 125 performs a separate processing operation on the substrates. For example, referring to FIG. 4A, a substrate may be placed in process module PM1 using one of the arms 155A, 155B. After processing is finished in process module PM1, arm 155A may remove the substrate from process module PM1 and place it in process module PM2. Substantially simultaneously with the transfer of the substrate from process module PM1 to process module PM2, arm 155B may transfer another substrate from load lock 135 to process module PM1. Such an arrangement may provide for a substantially continuous flow of substrates from, for example, load lock 135 through process modules PM1-PM4 to load lock 140.

Figure 7:
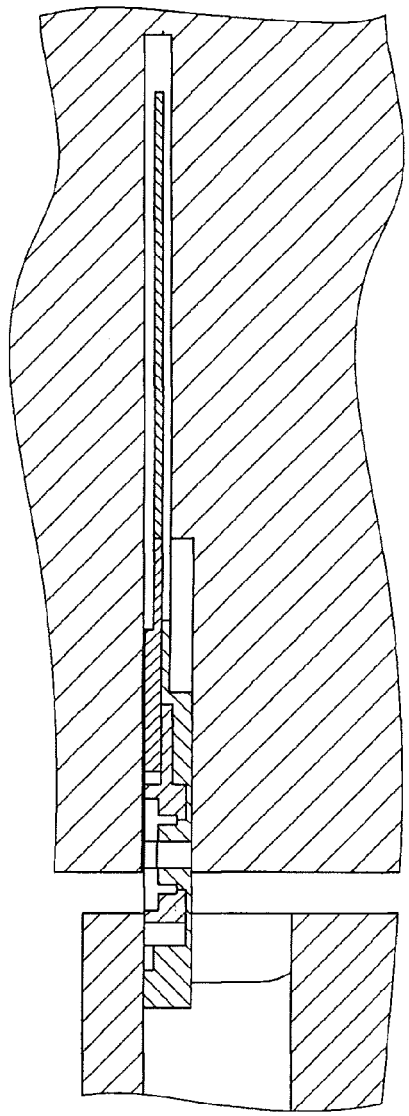
FIG. 7 is a schematic illustration of an exemplary transfer arm extension into a processing module in accordance with an aspect of the disclosed embodiment.

FIG. 7 illustrates schematically an exemplary extension of an arm of the transfer robot 130, 530 into a process module. It should be understood that the dimensions shown in FIG. 7 are merely exemplary approximations and that the dimensions may be greater or smaller than those shown. In alternate embodiments the arm may extend into the process module any suitable horizontal distance and at any suitable vertical location.

Figure 8:
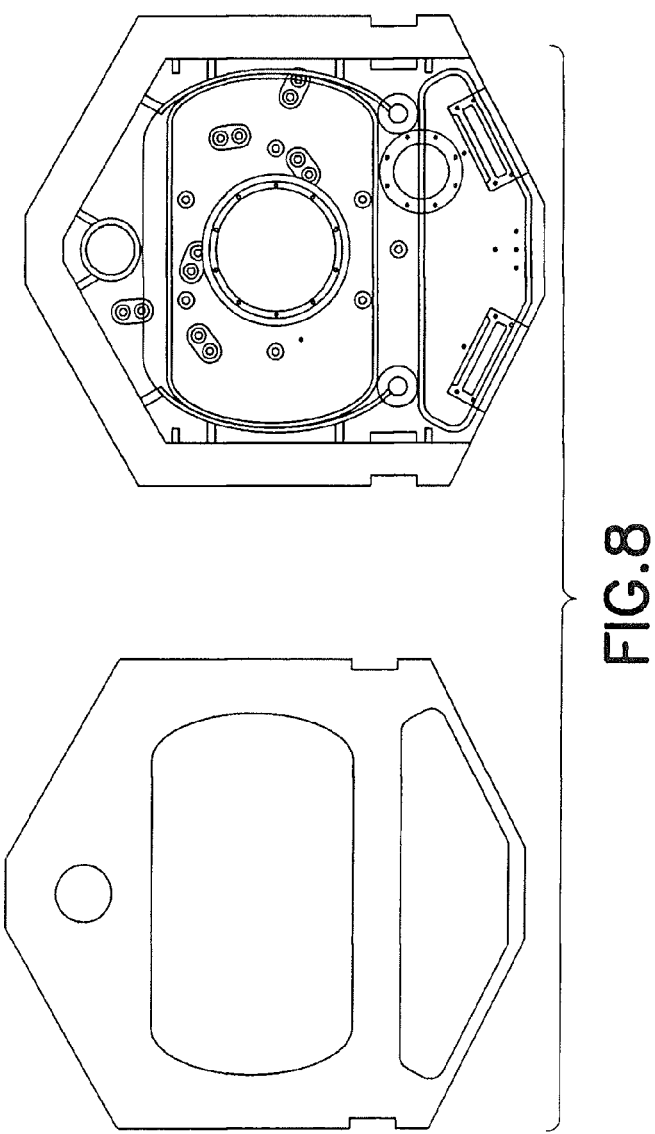
FIGS. 8-10 are schematic illustrations of transfer chambers in accordance with an aspect of the disclosed embodiment.
Figure 9A:
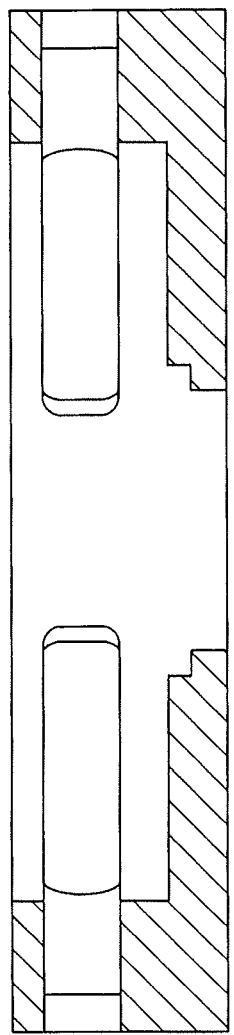
Figure 9B:
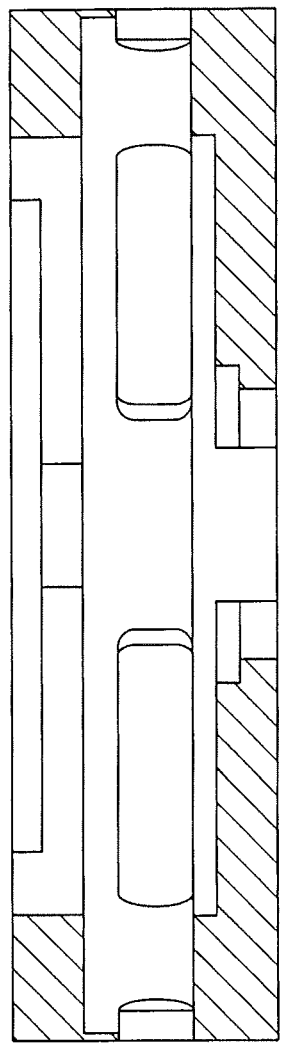
Figure 10:
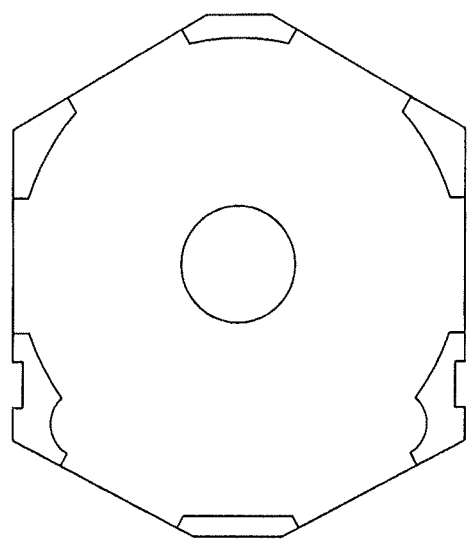

FIGS. 8 and 10 are exemplary top schematic illustrations of a transfer chamber, such as transfer chamber 400. FIGS. 9A and 9B are schematic side views of the transfer chamber 400 where the interior height of the transfer chamber is increased when the transfer robot includes a Z drive. It should be understood that the dimensions shown in FIGS. 8-10 are merely exemplary approximations and that the dimensions may be greater or smaller than those shown. It should be understood that the transfer chamber may have any suitable configuration.

Figure 11:
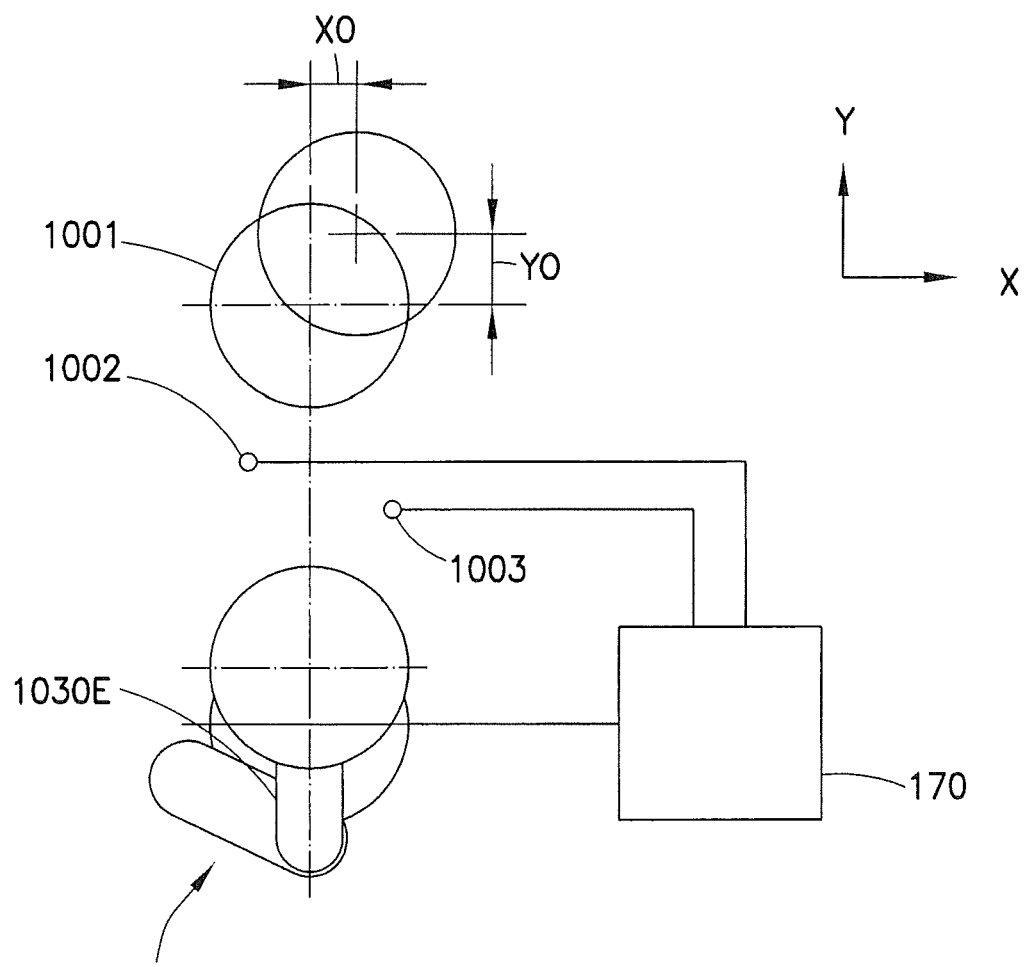
FIG. 11 illustrates a sensor system in accordance with an aspect of the disclosed embodiment.

Referring to FIG. 11, the robots described herein may be configured, along with the controller, for automatically centering substrates as the substrates are placed at a processing module or station. For example, one or more sensors 1002, 1003 may be placed, for example, adjacent a port providing access between a transfer chamber and the processing station 1001. As the robot 1030 extends the end effector 1030E carrying a substrate through the port the sensors 1002, 1003 may detect one or more of the leading and trailing edges of the substrate and transmit detection signals corresponding to the detection of the one or more leading and trailing edges of the substrate to the controller. The controller 170 may use the detection signals in any suitable manner to determine the position of the substrate relative to, for example, a position of the end effector 1030E. The controller 170 may be configured to apply an offset XO, YO in one or more of the X and Y directions for placing the substrate at the processing station 1001 in a predetermined position. The offsets XO, YO may be calculated by the controller depending on thermal expansion of the processing components (e.g. the components that interact directly or indirectly with the substrate) such that the offsets are steady state offsets that compensate for the thermal growth of the components. In an aspect of the disclosed embodiment, the access ports of more than one process module and/or loadlocks (see for example FIG. 1) may have a similar sensor arrangement. Robot 1030 may be similar to the previously described robots. As may be realized, the robot may effect substantially simultaneous multiple automatic substrate centering of substrates on both robot end effectors.

Figure 13:
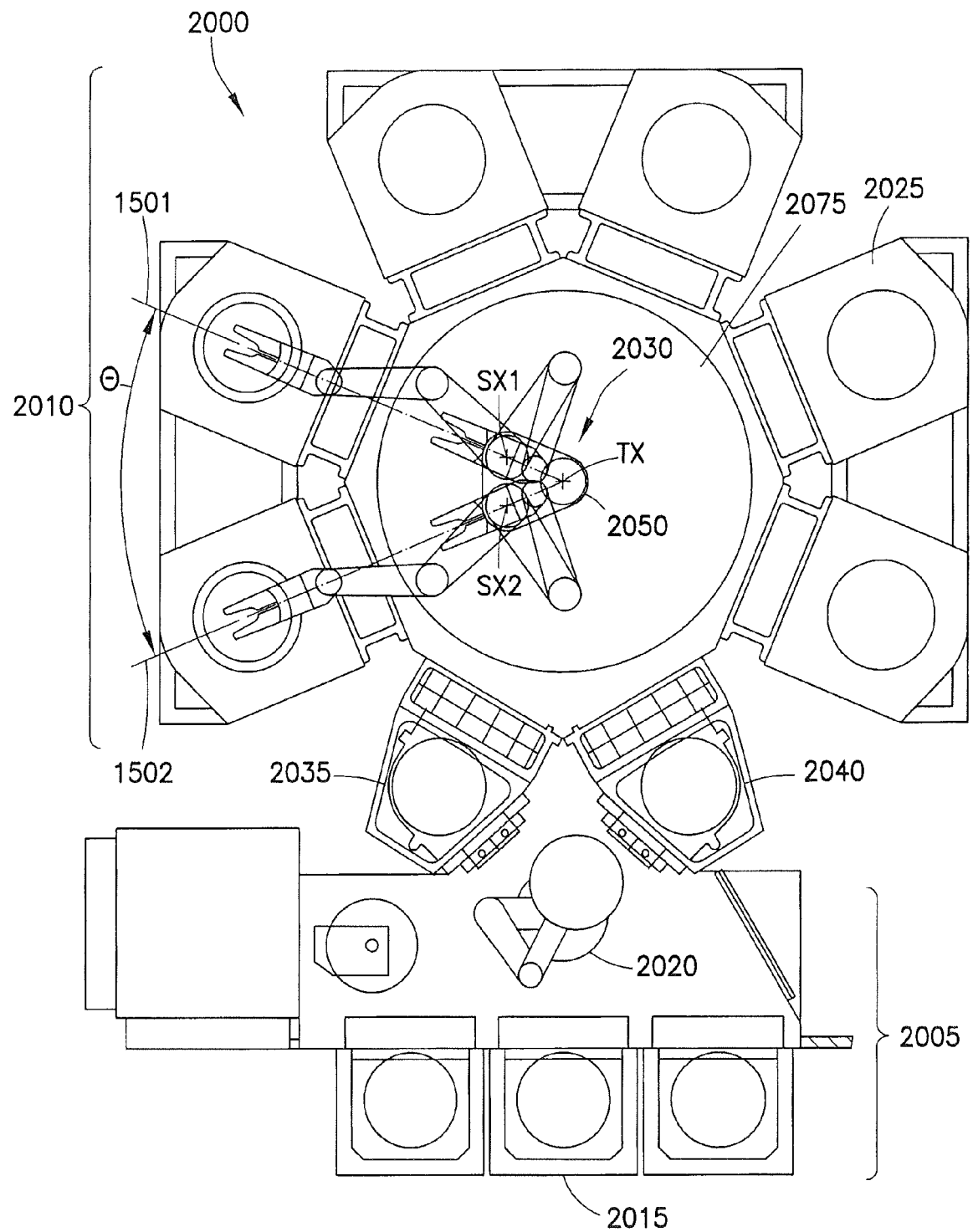
FIG. 13 is a schematic illustration of a substrate processing system in accordance with an aspect of the disclosed embodiment.

Referring now to FIG. 13 a substrate processing apparatus 2000 is shown. The substrate processing apparatus 2000 may be substantially similar to the substrate processing apparatus 100 in FIG. 1. For example, the substrate processing apparatus 2000 may generally have an atmospheric section 2005, for example forming a mini-environment and an adjoining atmospherically isolatable or sealed (e.g. sealed from an external atmosphere) section (e.g. atmospherically sealed section) 2010, which for example may be equipped to function as a vacuum chamber. In alternate embodiments, the atmospherically sealed section 110 may hold an inert gas (e.g. $N_2$) or any other isolated atmosphere. The atmospheric section may include load ports 2015, robot 2020 and be coupled to the atmospherically sealed section 2010 through load locks 2035, 2040. The atmospherically sealed section 2010 may be in the form of a cluster type tool having processing modules 2025 radially arranged around a central chamber 2075 where each processing module is angled relative to each other by angle θ. The central chamber 2075 may include a transfer apparatus 2030 for transferring substrates between the load locks 2035, 2040 and the processing modules 2025. In one aspect the transfer apparatus may be substantially similar to that described in U.S. Pat. No. 6,450,755 issued on Sep. 17, 2002 the disclosure of which is incorporated by reference herein in its entirety.

Figure 14:
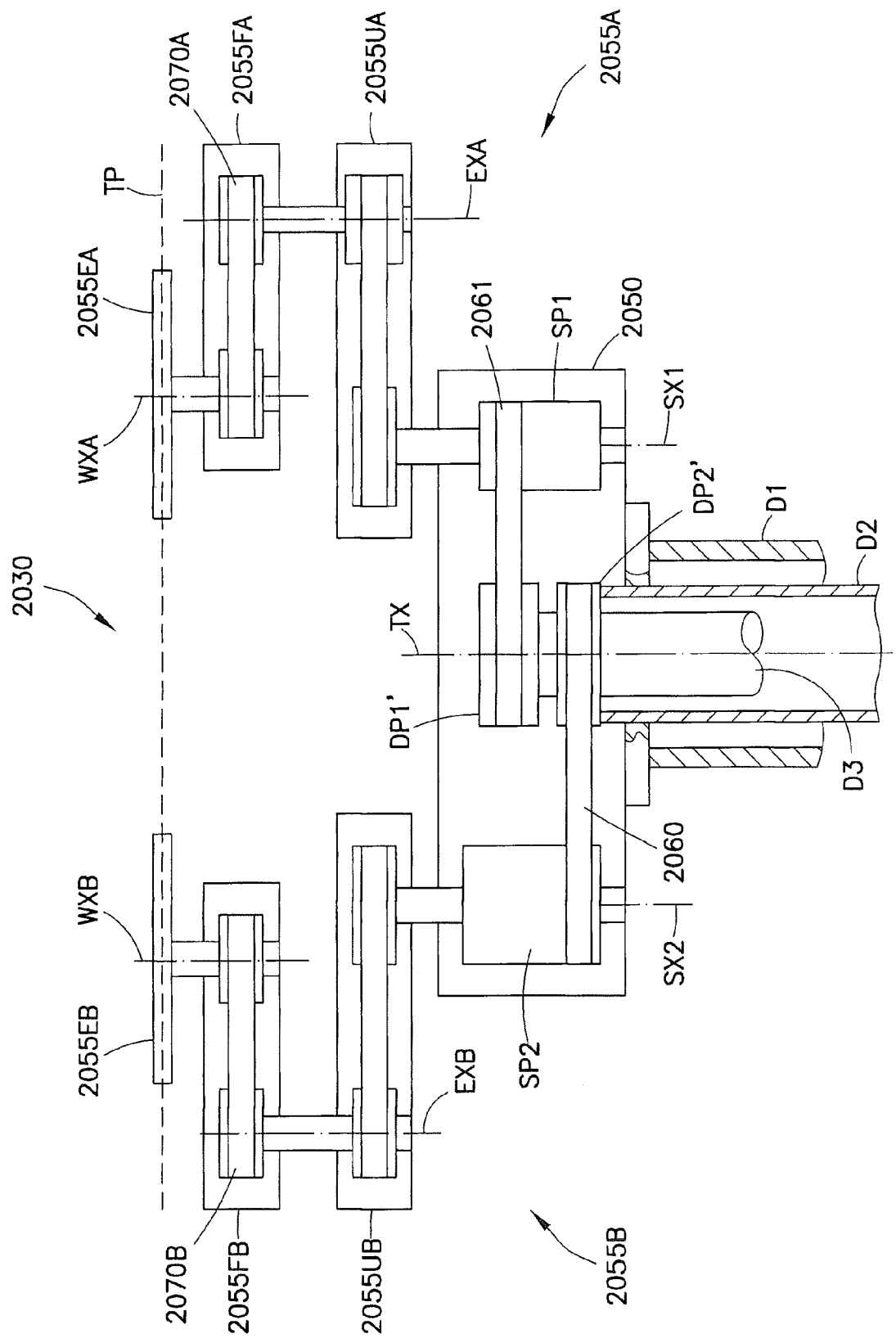
FIG. 14 is a schematic illustration of a substrate transport apparatus of FIG. 13 in accordance with an aspect of the disclosed embodiment.

Referring also to FIG. 14, the transfer apparatus 2030 may include two scara arms 2055A, 2055B substantially similar to arms 155A, 155B described above and a drive section. The drive section for transfer apparatus 2030 may be a three axis coaxial drive system substantially similar to the three axis drive system 634 described above with respect to FIG. 6. In another aspect the drive system of transfer apparatus 2030 may be a three axis coaxial drive system substantially similar to that described above with respect to FIGS. 3C-3H (with for example, drive shaft 1314, or any one of the shafts 1311-1314, and the respective pulley/motor components removed from the drive). A Z-axis drive may be coupled to the coaxial drive shaft arrangement for providing travel along the Z-direction to raise and/or lower the arm assembly in a manner substantially similar to that described above.

Each arm includes an upper arm 2055UA, 2055UB, a forearm 2055FA, 2055FB mounted to the upper arm about an elbow axis EXA, EXB and at least one end effector 2055EA, 2055EB mounted to the forearm 2055FA, 2055FB about a wrist axis WXA, WXB. It is noted that in one aspect the end effectors 2055EA, 2055EB may be located on the same transfer plane TP to reduce the amount of Z-motion of the arm assembly. In other aspects the end effectors may be located on different transfer planes. In this aspect, the arms 2055A, 2055B are mounted to and supported by a base member 2050 about a respective shoulder axis SX1, SX2. For example, arm 2055A is mounted to the base member 2050 about shoulder axis SX1 and arm 2055B is mounted to the base member about shoulder axis SX2. The base member 2050 may have any suitable shape and/or configuration and it is noted that the triangular shape shown in the figures is merely exemplary in nature. The end effectors 2055EA, 2055EB of the arms 2055A, 2055B may be arranged so that the end effectors 2055EA, 2055EB are angled relative to each other by angle θ so that the end effectors 2055EA, 2055EB are aligned with adjacent ones of the angled process modules 2025 in a manner substantially similar to that described above with respect to arms 155A, 155B.

The base member 2050 may be coupled to a first drive shaft D1 (e.g. the outer drive shaft) of the drive section about drive axis TX (e.g. the axis of rotation of the coaxial drive shaft assembly) so that as the drive shaft D1 rotates the base member 2050 rotates with it. As can be seen in FIG. 13 each of the shoulder axes SX1, SX2 may be located relative to the drive axis TX so that the shoulder axes is positioned along a line of extension and retraction 1501, 1502 of the respective end effector 2055EA, 2055EB. A first drive pulley DP1' may be coupled to a third drive shaft D3 (e.g. the inner drive shaft) of the drive section so that as the drive shaft D3 rotates the pulley DP1' rotates with it. A first shoulder pulley SP1 may be mounted on a shaft about axis SX1 where the first shoulder pulley SP1 is coupled to the first drive pulley DP1 in any suitable manner, such as through belts, bands, gears, or any other suitable transmission. The shoulder pulley SP1 may be coupled to the arm 2055A in any suitable manner for causing the arm to extend and retract along path 1501. In this aspect, rotation of the forearm 2055FA and end effector 2055EA may be slaved to the rotation of the upper arm 2055UA through any suitable transmission system 2070A in a known manner (e.g. such as with a 2:1:1:2 shoulder-elbow-end effector pulley ratio or any other suitable pulley ratio) so that the arm 2055A can be extended and retracted using only one drive axis and wrist axis WXA and the end effector 2055EA remain aligned with the path 1501 during extension and retraction (in a manner similar to that shown in FIGS. 15A and 15B described below with respect to arm 2055B). It should be realized that in other aspects additional drive shafts/motors may be provided in the drive section so that two or more of the upper arm, forearm and end effector of arm 2055A may be individually driven.

A second drive pulley DP2' may be coupled to a second drive shaft D2 (e.g. the middle drive shaft) of the drive section so that as the drive shaft D2 rotates the drive pulley DP2' rotates with it. A second shoulder pulley SP2 may be mounted on a shaft about axis SX2 where the second shoulder pulley SP2 is coupled to the second drive pulley DP2 in any suitable manner, such as through belts, bands, gears, or any other suitable transmission. The shoulder pulley SP2 may be coupled to the arm 2055B in any suitable manner for causing the arm to extend and retract along path 1502. In this aspect, rotation of the forearm 2055FB and end effector 2055EB may be slaved to the rotation of the upper arm 2055UB through any suitable transmission system 2070B in a known manner (e.g. such as with a 2:1:1:2 shoulder-elbow-end effector pulley ratio or any other suitable pulley ratio) so that the arm 2055B can be extended and retracted using only one drive axis while the wrist axis WXB and end effector 2055EB remain longitudinally aligned with the path 1502 during extension and retraction as shown in FIGS. 15A and 15B. It should be realized that in other aspects additional drive shafts/motors may be provided in the drive section so that two or more of the upper arm, forearm and end effector of arm 2055B may be individually driven.

It is noted that the ratio between the first and second drive pulleys DP1', DP2' and the respective shoulder pulleys SP1, SP2 may be a 1:1 ratio. However, in alternate embodiments any suitable ratio may be used between the drive pulleys and the respective shoulder pulleys.

Figure 14C:
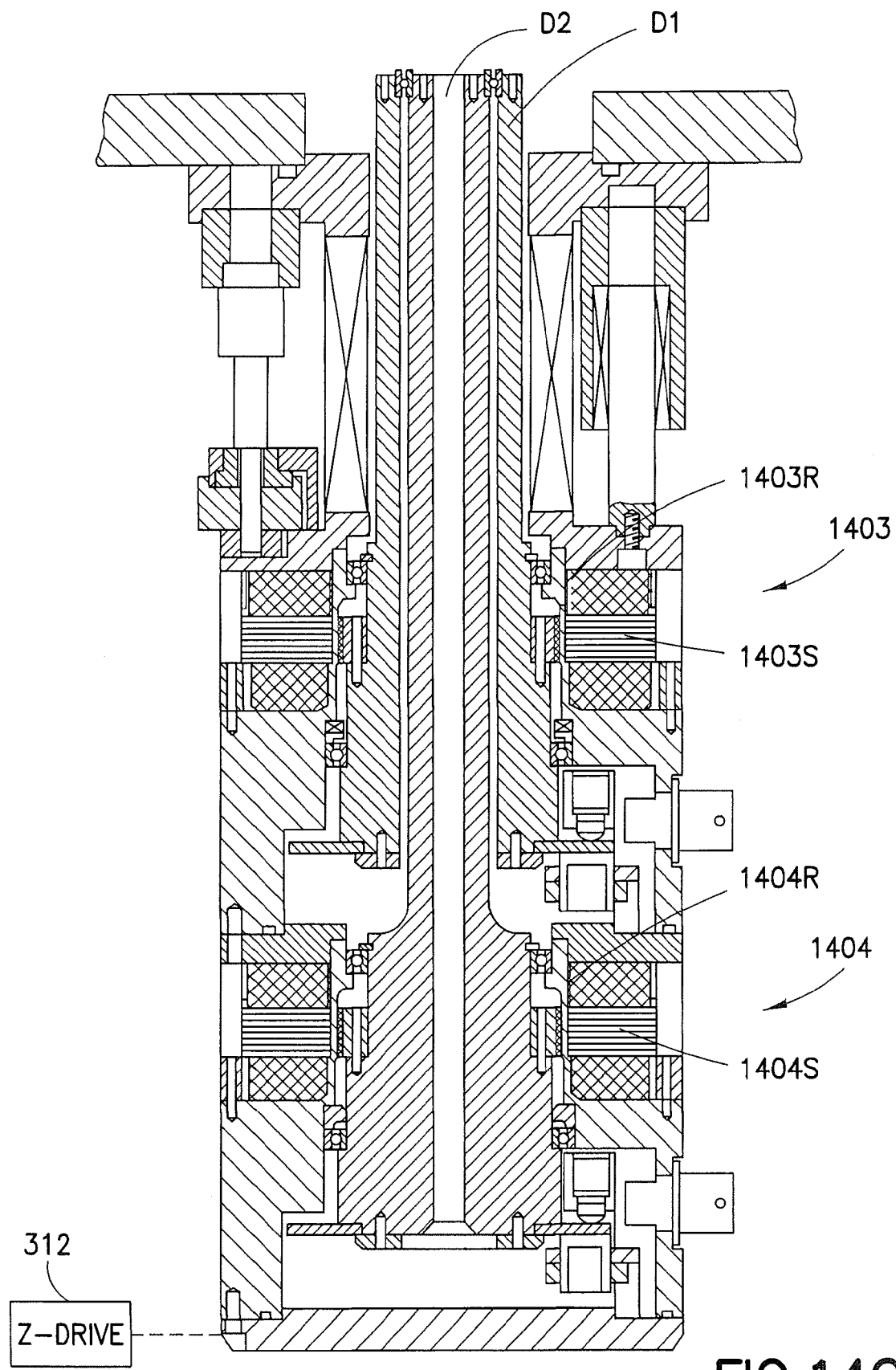
FIGS. 14C and 14D are schematic illustrations of substrate transport apparatus drive systems in accordance with aspects of the disclosed embodiment.
Figure 14D:
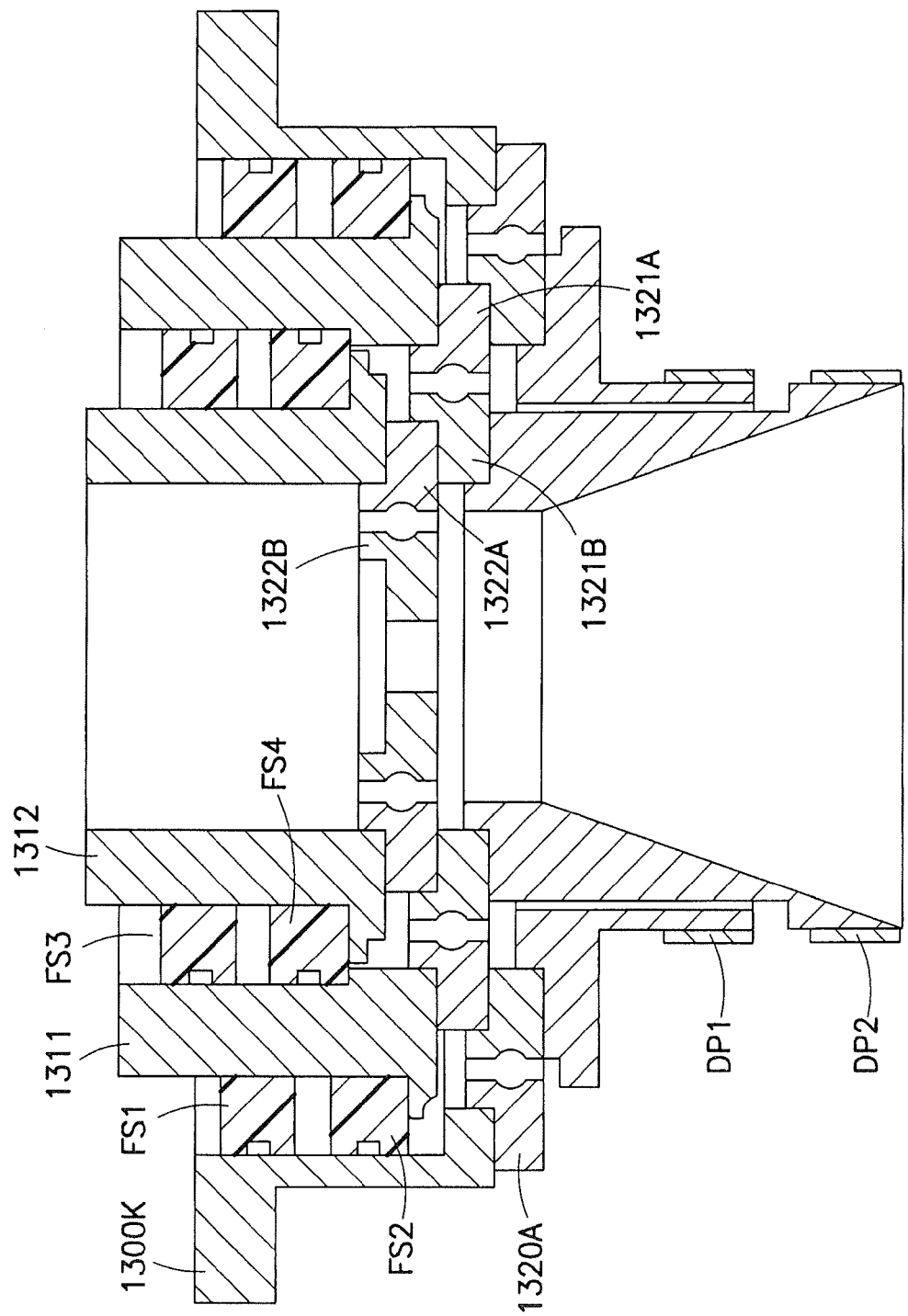

Referring to FIGS. 14A-14D, in another aspect of the disclosed embodiment, the transfer apparatus 2030 may be driven by a two-axis coaxial drive system 2099 such that the extension and retraction of the arms 2055A, 2055B is coupled. It is noted that the two-axis drive system may be substantially similar to those described above with respect to FIGS. 3, 3C-3H and 6 but with only two drive shafts D1, D2 and corresponding motors. For example, an exemplary two-axis drive system (substantially similar to the drive systems shown in FIGS. 3 and 6) is shown in FIG. 14C having first and second drive shafts D1, D2 driven by respective motors 1403, 1404 where each of the motors includes a stator 1403S, 1404S and rotor 1403R, 1404R. As another example, another exemplary two-axis drive system (substantially similar to the drive system shown in FIGS. 3C-3H) is shown in FIG. 14D having first and second drive shafts 1311 (D1), 1312 (D2) driven through pulleys DP1, DP2 by respective motors (not shown). A first one of the drive shafts D1 may be coupled to the base member 2050 in a manner substantially similar to that described above. A second one of the drive shafts D2 may be coupled to the drive pulleys DP1, DP2 such that as the second drive shaft D2 rotates the drive pulleys DP1, DP2 rotate with the drive shaft D2. In this aspect, one of the drive pulleys DP1, DP2 may be coupled to a respective shoulder pulley SP1, SP2 in any suitable manner so that the drive pulley and shoulder pulley rotate in the same direction (e.g. both clockwise or both counterclockwise). The other one of the drive pulleys DP1, DP2 may be coupled to a respective shoulder pulley SP1, SP2 so that the drive pulley and shoulder pulley rotate in opposite directions (e.g. one pulley rotates clockwise and the other pulley rotates counterclockwise). In this aspect, the drive pulley DP2 and shoulder pulley SP2 are coupled to each other in any suitable manner, such as through belts, bands, gears or any other suitable transmission 2060, so that the pulleys DP2, SP2 rotate in the same direction. The drive pulley DP1 is coupled to the shoulder pulley SP1 in any suitable manner, such as through belts, bands, gears or any other suitable transmission 2062, so that the pulleys DP1, SP1 rotate in opposite directions. For exemplary purposes the pulleys DP1, SP1 are shown in FIG. 14B as being coupled by a "figure 8" belt/band arrangement so that as the shaft D2 rotates the pulleys SP1, SP2 are rotated in opposite directions. As may be realized, with this two-axis drive arrangement and corresponding transmissions between the driven pulleys DP1, DP2 and the respective shoulder pulleys SP1, SP2 the arms 2055A, 2055B may be extended substantially simultaneously (e.g. both arms extend into and are retracted from substrate holding locations substantially simultaneously, such as with the "figure 8" belt/band arrangement or any other suitable reverse rotation drive configuration) or one arm 2055A, 2055B may be extended while the other arm 2055A, 2055B is retracted. In other aspects, the coupling between the drive shaft D2 and the shoulder pulleys SP1, SP2 may be a lost motion coupling substantially similar to those described in U.S. patent application Ser. No. 12/117,415 entitled "Substrate Transport Apparatus with Multiple Movable Arms Utilizing a Mechanical Switch Mechanism" and filed on May 8, 2008 and U.S. patent application Ser. No. 11/697,390 entitled "Substrate Transport Apparatus with Multiple Independently Movable Articulated Arms" and filed on Apr. 6, 2007 the disclosure of which are incorporated by reference herein in their entireties.

In another aspect of the disclosed embodiment, the base member 2050', substantially similar to base member 2050 described above with respect to FIGS. 13-14A, may be adjustable so that the end effectors 2055EA, 2055EB and the respective arms 2055A, 2055B can be adjustably rotated relative to the drive axis TX to align the end effectors 2055EA, 2055EB with an angle θ of the substrate holding locations (such as the process modules 2025 and load locks 2035, 2040). For example, referring to FIG. 16A the base member 2050' has two generally opposing base sections 1672, 1678 configured to support a respective one of the arms 2055A, 2055B. The sections 1672, 1678 are joined to each other, in this embodiment at a drive axis joint 1635 of the base member 2050'. The sections 1672, 1678 are capable of being locked to each other, allowing the base member 2050' to be rotated as a unit about drive axis TX. The generally opposing base sections 1672, 1678 may otherwise be unlocked in order to reposition the generally opposing base sections 1672, 1678 relative to each other for adjusting the angle α between the base sections 1672, 1678. Adjusting the angle α may adjust an angle of extension/retraction between the arms for aligning the angle of extension and retraction of each arm with a transport path into adjacent processing modules. In other aspects each arm may be individually rotatable about a respective shoulder axis where changing the angle α increases the distance between the arms. In still other aspects of the disclose embodiment, the base member 2050' may comprise any desired number of sections, or may be one piece with a lockable flexible joint to allow adjustable positioning of different parts of the section relative to each other. It is noted that the base sections 1672, 1678 may be releasably coupled to each other at the drive axis TX to form a substantially rigid link where the first and second arm sections are incapable of movement relative to one another during substrate transport. Base member section 1672 generally has a hollow frame or casing capable of housing any suitable transmission connecting the arm 2055A to the corresponding drive shaft of the drive section (see e.g. FIGS. 14 and 14A described above). In other aspects the base member section 1672 may be configured to house a motor for driving the arm 2055A. Base member section 1678 also generally has a hollow frame or casing capable of housing any suitable transmission connecting the arm 2055B to the corresponding drive shaft of the drive section (see e.g. FIGS. 14 and 14A described above). In other aspects the base member section 1678 may be configured to house a motor for driving the arm 2055B.

Figures 16A, 16B:
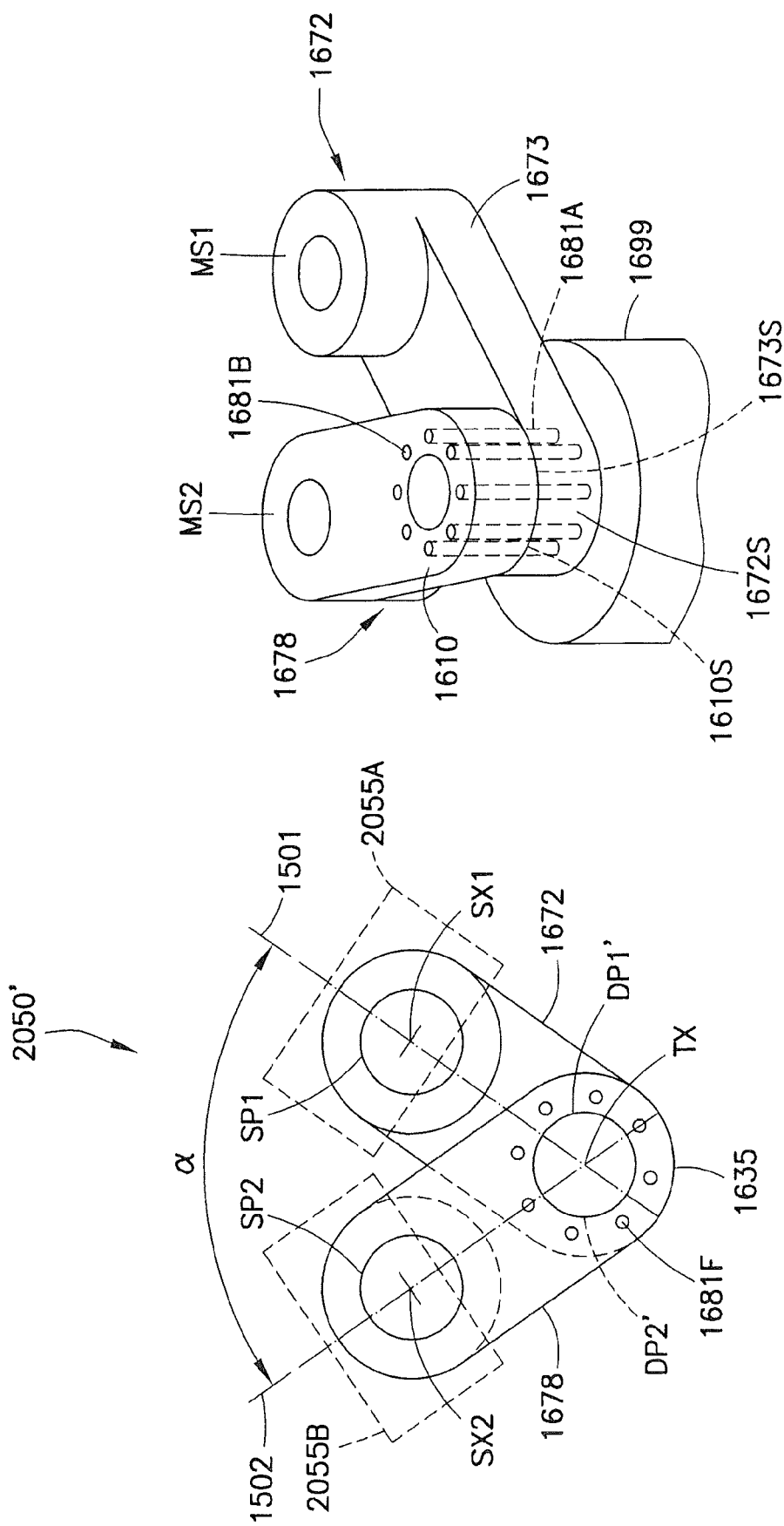
FIGS. 16A-16G are schematic illustrations of portions of a substrate transport apparatus in accordance with an aspect of the disclosed embodiment.

As seen in FIGS. 16A and 16B, in this embodiment the opposing sections 1672, 1678 are configured so that the arm mounting surfaces MS1, MS2 are disposed on a common plane to allow the arms 2055A, 2055B to be substantially the same (but mirror images of each other) and the end effectors to have substantially the same transfer plane TP (see FIGS. 14 and 14A). In other aspects, arm mounting surfaces MS1, MS2 may have any desired configuration relative to each other and the end effectors may have different transfer planes. The mounting or coupling section 1672S of base member 2050' may be formed by the frame 1673 of the base member section 1672. In one aspect the frame 1673 extends around the coaxial shaft assembly of the drive section 1699 (which may be substantially similar to those described above with respect to FIGS. 14-14D) to form a seating surface 1673S for the opposing arm section 1678. The surface 1673S, which in this aspect is generally in the same plane as the upper surface of the base member section 1672, has locating features for both vertical and horizontal positioning of the base member section 1678 onto base member section 1672. The opposing base member section 1678 has a frame 1610 that has a mating section 1610S which is generally conformally configured, with respect to mounting section 1672S so that mating section 1610S may be mounted on the mounting section 1672S. The locating features are fastener holes 1681A formed in seating surface 1673S. Similarly, the seating surface of the mating section 1610S of the opposing base member section 1678 also has fastener holes 1681B. As will be described below, the fastener holes 1681A, 1681B formed in the respective seating surfaces are distributed and spaced to provide desired indexing positions for indexing the arm section 1672, 1678 relative to each other. Fasteners 1681F, such as cap screws, bolts, locating pins, or any combination thereof may be inserted through holes 1681B of the base member section 1678, into matching holes 1681A of the other base member section 1672 thereby locking the two base member sections 1672, 1678 of the base member 2050' to each other. The fasteners are sufficient for torque transfer during movement and hence the base member section 1678 (which as noted before is not directly mounted to the outer shaft (e.g. D1, 1311) of the rotational drive such as those described with respect to FIGS. 14-14D (or any of the other drives described herein) rotates in unison with opposing base member section 1672 when base member section 1672 is rotated by the outer shaft D1 about common axis of rotation TX at the drive axis joint 1635 of the base member 2050'. In other aspects of the disclosed embodiment, any other suitable enablement features, such as splines, keys/keyways, may be used for locating and torque transfer between the opposing base member sections.

The locating holes 1681A, 1681B are circumferentially equally distributed on the respective frame 1673, 1610 of the base member section 1672, 1678. Any desired number of holes may be used to provide the desired incremental adjustment spacing between the base member section 1672, 1678 will be described below. The number of locating holes in the mounting sections 1673S, 1610S of the base member sections may be different, as one section 1673S, 1610S may include only the minimum number of holes for mechanical loads, while the mating section would have additional holes for desired positional adjustment or indexing. For example, if four fasteners 1681F are used for mechanical attachment, then one mounting section 1673S, 1610S may have four mounting holes 1681A, 1681B and the other mounting section may have eight or ten or any desired number of holes to accommodate adjustment between the base member sections. The mating surfaces 1673S, 1610S may include additional engagement features, such as interlocking or interdigitated lips or edges (not shown) that stably hold the base member sections together when the locking fasteners 1681F are removed. Accordingly, the base member sections 1672, 1678 may remain self supporting when the fasteners 1681F are removed to effect positional adjustment as will be described below. The engagement features may be provided with suitable sliding surfaces (not shown) to allow sliding motion between base member sections when being positionally adjusted without generating particulate matter at the sliding surfaces. In one aspect, the mounting sections 1673S, 1610S of the base member sections are shown as being disposed at the drive axis joint 1635 of the base member 2050'. In other aspects of the disclosed embodiment, the adjustable connection between the base member sections may be located at any other position along base member 2050'.

Figure 16C:
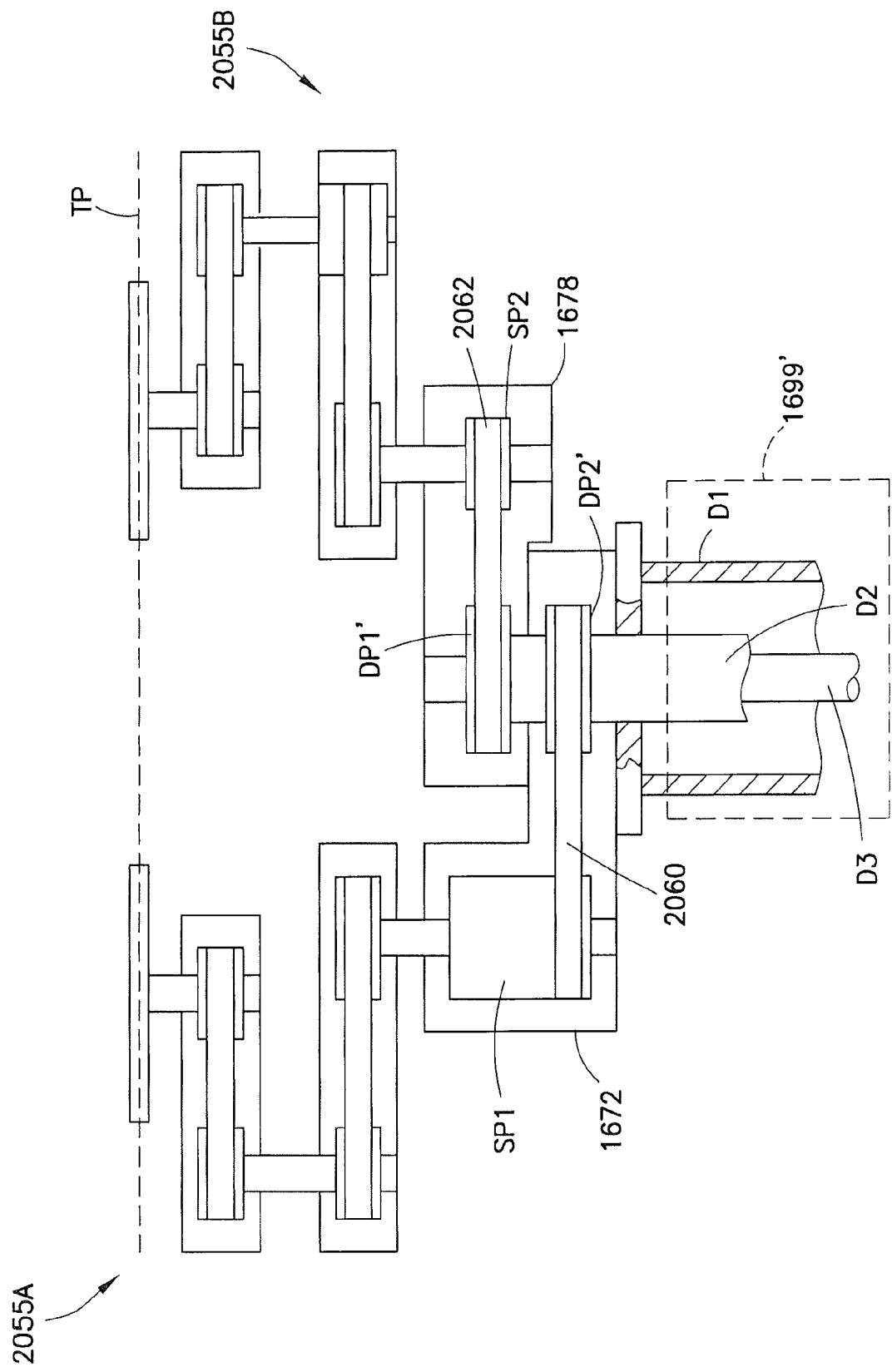

In other aspects of the disclosed embodiments the angle α between the base member sections 1672, 1678 can be dynamically adjusted. For example, referring to FIG. 16C the drive 1699' may have three drive shafts D1-D3 where the outer drive shaft is coupled to base member section 1672 so that as the outer drive shaft rotates the base member section 1672 rotates with it. Inner drive shaft D3 is coupled to base member section 1678 so that as the inner drive shaft D3 rotates the base member section 1678 rotates with it. The middle drive shaft D2 may be coupled to the pulleys SP1, SP2 for extending and retracting the arms 2055A, 2055B in the manner described above. A controller (not shown) may be connected to the drive 1699' for dynamically adjusting the angle α between the base member sections 1672, 1678. For example, to adjust the angle α between the base member sections 1672, 1678 the drive shafts D1 and D3 may be rotated relative to each other by any desired amount so that the angle α is dynamically adjusted to any desired angle. It is noted that the drive shafts D1 and D3 may be rotated in unison (e.g. in the same direction at the same rotational speed) so that the base member 2050' can be rotated as a unit without changing the angle α between the base member sections 1672, 1678.

The base member 2050, 2050' may also allow for the independent Z-movement of just one of the arms 2055A, 2055B. Referring now to FIG. 16D the base member 2050" is shown having base member sections 1672, 1678'. The base member section 1678' is substantially the same as base member section 1678 described above, but in this aspect of the disclosed embodiment the base member section 1678' includes a first portion 1678A and a second portion 1678B. The first portion 1678A may be adjustably connected to the base member section 1672 in a manner substantially similar to that described above to allow for indexing of the base member sections relative to each other. The second portion 1678B may be movably coupled to the first portion 1678A in any suitable manner to allow the second portion 1678B to move relative to the first portion 1678A along the Z-axis in the direction of arrow 1666 as will be described below. In this aspect of the disclosed embodiments, the drive section 1699 may include any suitable primary lift or Z-axis drive 1687 that is configured to lift the base member 2050" (and the arms 2055A, 2055B) as a unit in the direction or arrow 1666. However, in some instances it may be desired, where e.g. both arms are extended for transferring substrates, to adjust a final drop off location of one of the substrates such that one arm is moved along the Z-axis while keeping the other arm stationary in Z. In this instance the base member section 1672 and arm 2055A may be positioned along the Z-axis with the primary Z-drive and the base member section 1678 and the arm 2055B may be further positioned along the Z-axis with any suitable secondary Z-drive 1686 of the drive section 1699. It should be understood that while base member section 1678' is shown as being adjustable along the Z-axis with the secondary Z-drive 1686, in other aspects of the disclosed embodiment the other base member section 1672 or both base member sections 1672, 1678' may be configured to be independently moved along the Z-axis in the manner described herein with respect to base member section 1678'.

Figure 16E:
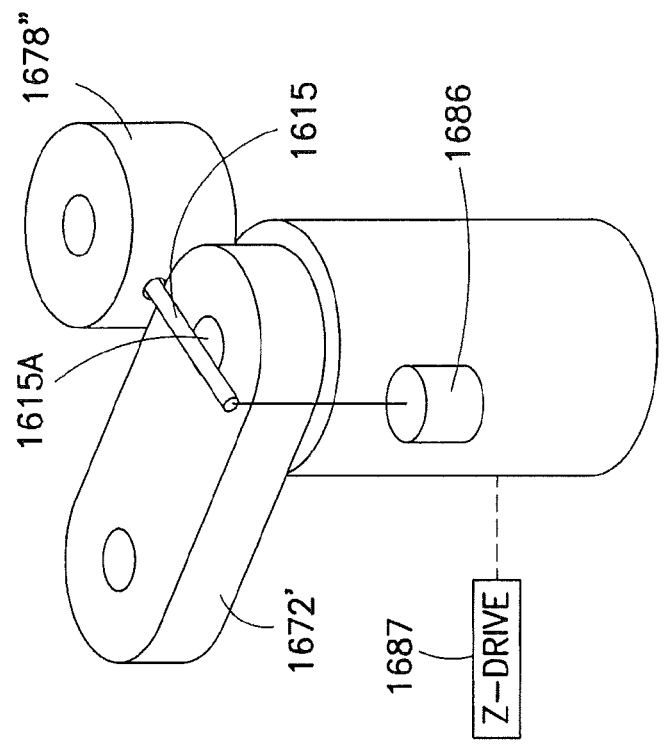
Figure 16D:
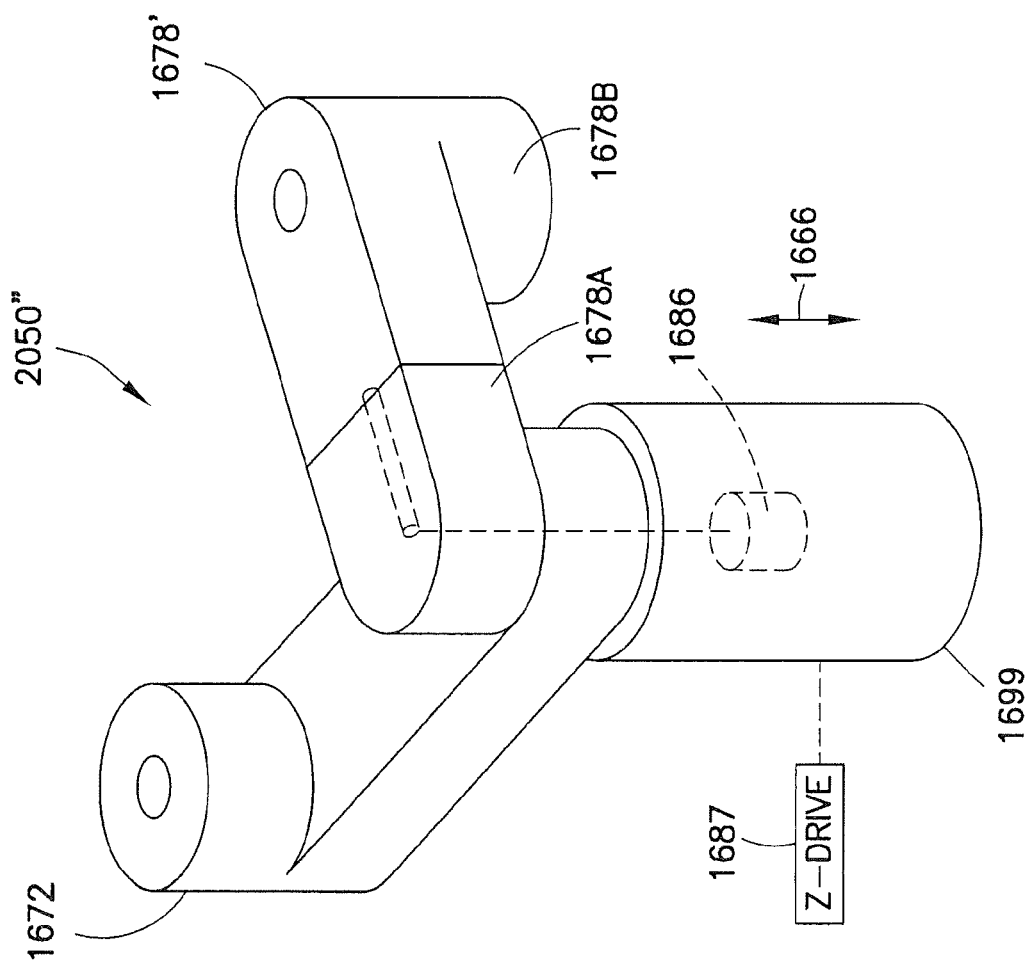

Referring to FIG. 16E in another aspect of the disclosed embodiment the base member sections may be configured such that one of the base member section 1672' is supported directly by the drive section and the other one of the base member sections 1678" is supported by a lift link 1615 that is suitable adjustably supported by and extends out of the base member section 1672'. As may be realized the base member section 1672' may have an aperture 1615A through which the lift link extends that is suitable shaped to allow indexing of the base member links 1672', 1678" relative to each other as well as independent Z-motion of the base member link 1678". In one aspect the lift link 1615 may be configured to provide support and guide the movement of the base member section 1678". In other aspects any suitable guide bearings (described below) may be provided for guiding movement of the base member section 1678" and maintaining an attitude of an end effector of the respective arm for transferring substrates.

Figure 16F:
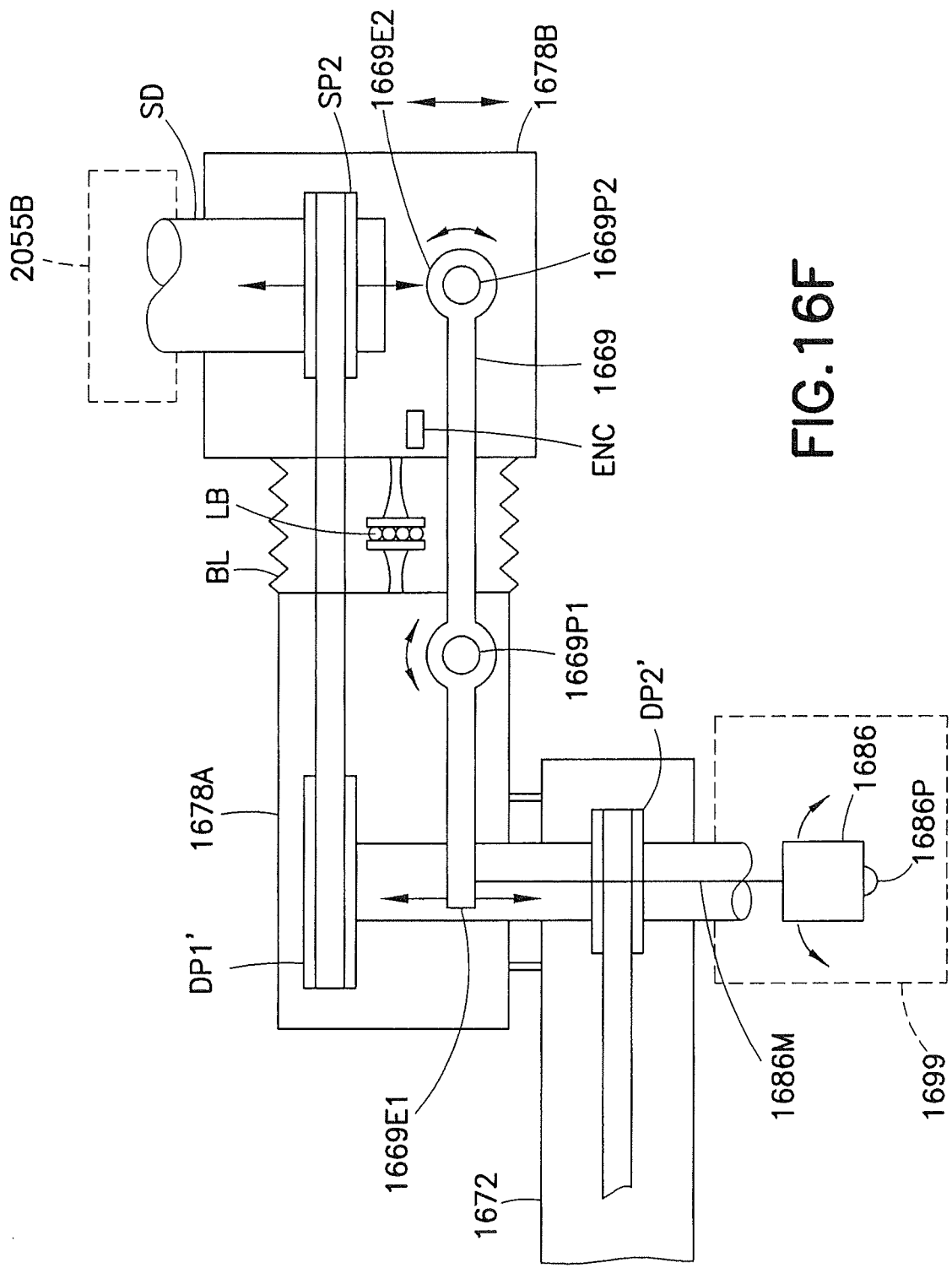

Referring now to FIG. 16F the lift linkage for allowing the independent vertical movement of one of the base member sections (and the respective arm) will be described. It is noted that while the operation and configuration of the linkage will be described with respect to FIG. 16D the operation and configuration of the linkage may be substantially the same for the configuration shown in FIG. 16E. In one aspect the secondary Z-drive 1686 may be pivotally mounted within the drive section 1699 or within the base member section 1672 in any suitable manner. A pivot link 1669 may be pivotally mounted within the base member portion 1678A about pivot point 1669P1. A first end 1669E1 of the pivot link 1669 is connected to the secondary Z-drive 1686 in any suitable manner, such as through e.g. a connecting member 1686M such that as the secondary Z-drive 1686 is actuated the pivot link is caused to pivot about point 1669P1. A second end 1669E2 of the pivot link 1669 may be movably coupled to the base member portion 1678B in any suitable manner such that the rotational movement of the second end 1669E2 about pivot point 1669P1 is converted into a linear motion of the base member portion 1678B along the Z-axis. The second base member portion 1678B may be movably coupled to and supported by the first base member portion 1678A at least in part by, for example, a linear bearing arrangement LB that is configured to guide the movement of the second base member portion 1678B along the Z-axis. It is noted that where the rotational drive for the arm 2055B is located in the drive 1699 the pulley SP2 that drives the arm 2055B may be movably coupled to the arm drive shaft SD such that as the second base member portion 1678B moves along the Z-axis the pulley SP2 is allowed to slide longitudinally along the shaft SD while remaining rotationally coupled to the shaft SD. It should be understood that the pulley arrangement for driving the arm 2055B may have any suitable configuration that allows for the movement of the second base member portion 1678B along the Z-axis. A bellows BL may be located between base member portions 1678A, 1678B and configured to enclose one or more of the pivot link 1669 and linear bearing LB.

Figure 16G:
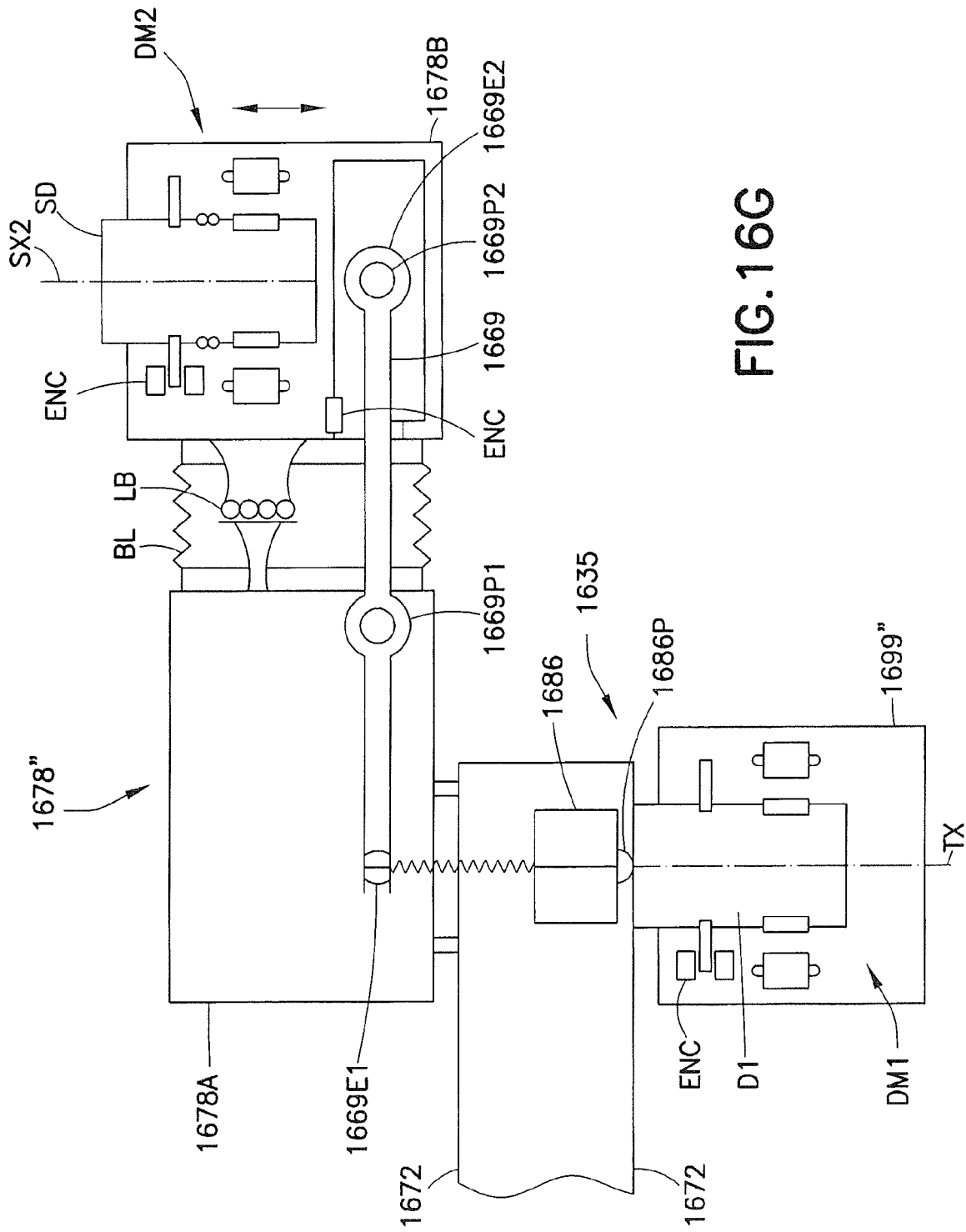

Referring to FIG. 16G, in another aspect of the disclosed embodiment, single axis drive motors may be placed at each joint of the base member. For example, a single drive motor DM1 may be located at the drive joint 1635 for rotating the base member about axis TX as a unit. As may be realized where the base member portions are dynamically adjustable relative to each other a dual axis drive may be located at the joint 1635 for individually rotating base member sections 1672, 1678" relative to each other in a manner substantially similar to that described above. Another single axis drive motor DM2 may be located within base member section 1678" about axis SX2 for driving shaft SD for causing arm 2055B to extend and retract. Yet another single axis drive motor (not shown) may be located within base member section 1672 about axis SX1 for effecting the extension and retraction of the arm 2055A. It should be understood that the single axis drives DM1, DM2 may be substantially similar to the drives described above with respect to FIGS. 3, 3E-3H, 6, 14C and 14D but for the inclusion of only a single drive motor.

It should also be understood that any suitable encoders ENC may be used for determining a position of the arms and the various portions of the base member. Further, while the single axis drives located at each of the joints of the base section are described with respect to FIG. 16G it should be understood that the single axis drive configuration may be used with any aspect of the disclosed embodiments.

FIGS. 17A-17C illustrate a portion of a robot where each of the arms 1750, 1751 is driven by a remotely located motor or by a single axis motor located at the shoulder of the arm. Examples of the remotely located motors and the motors located at the joints of the robot are described above. In this aspect of the disclosed embodiment each arm includes an upper arm UA, a forearm FA connected to a respective upper arm UA, and an end effector (not shown) connected to a respective forearm FA. The upper arm UA is coupled to a shoulder drive shaft SD for rotating the upper arm UA about a respective shoulder axis of rotation SX1, SX2. The arms 1750, 1751 in this aspect of the disclosed embodiment are driven in extension and retraction by a single axis drive 1760 in a manner substantially similar to that described above. The shoulder pulley 1770 of the arms 1750, 1751 is grounded to, for example, the base member 2050 so that the pulley is not routed through the center of the shoulder joint. As each upper arm UA rotates about a respective axis SX1, SX2 the shoulder pulley 1770 does not rotate causing the arm to extend and retract in a slaved manner in conjunction with the rotation of the upper arm. Here the shoulder pulley 1770 includes an extension 1770E that extends out of the housing/frame UAF of the respective upper arm UA through an aperture 1775. The extension 1770E may be fixed to the base member 2050 in any suitable manner such as through any suitable fasteners, clips, etc. It is noted that the aperture 1775 in the housing/frame UAF of the upper arm UA is suitably sized and shaped to allow rotation of the upper arm UA for extending and retracting the arm while the extension 1770E remains fixed to and stationary with respect to the base member 2050. It is noted that while the fixed shoulder pulley 1770 is described with respect to base member 2050 it should be understood that the fixed shoulder pulley arrangement of FIGS. 17A-17C can be applied to the adjustable arm sections of FIGS. 16A-16G or any other suitable aspects of the disclosed embodiment.

Figure 18:
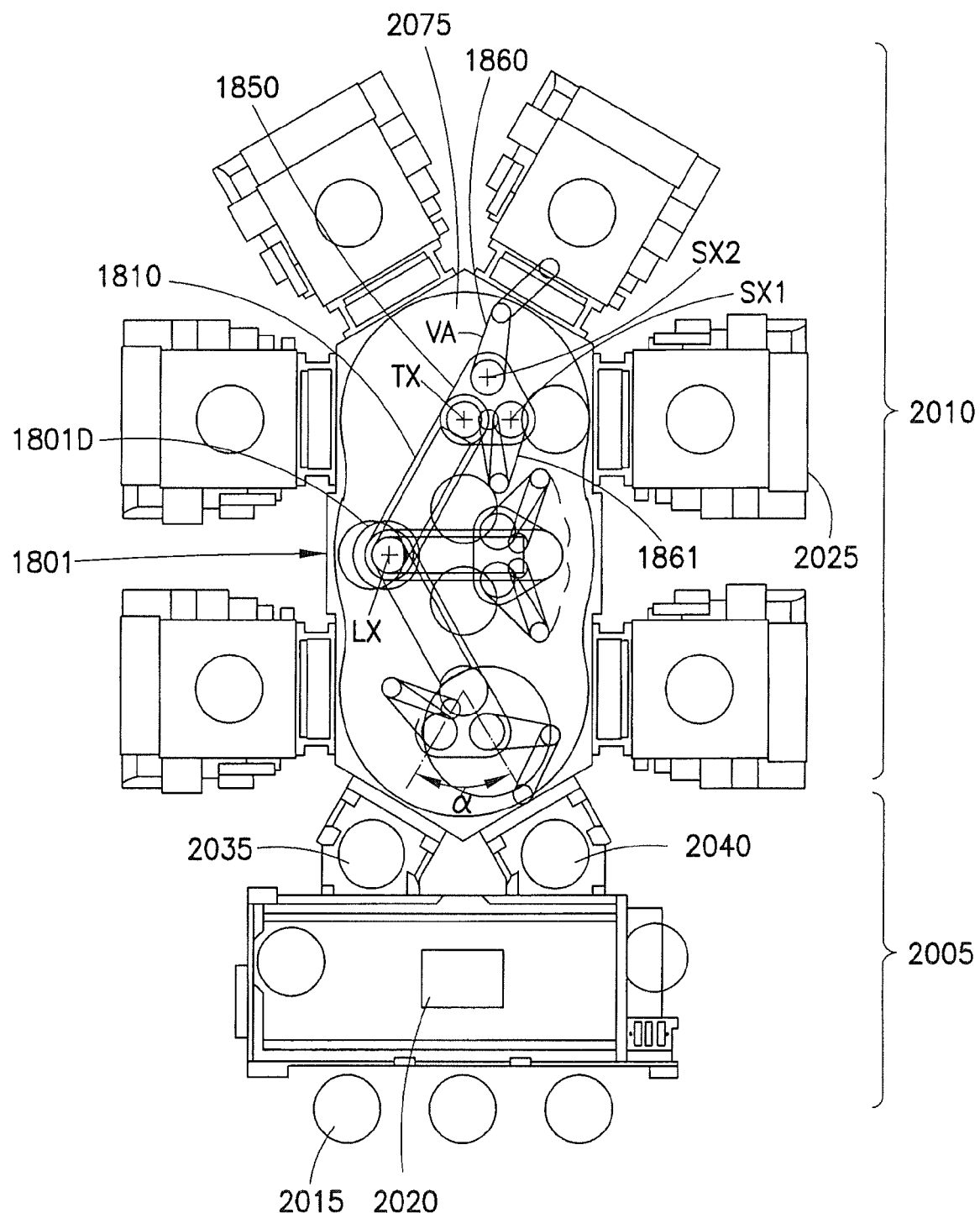
FIG. 18 is a schematic illustration of a substrate processing system in accordance with an aspect of the disclosed embodiment.

Referring to FIG. 18 the base member/robot arm configuration of FIGS. 13-17C may be mounted to a linkage arm 1810. For example, the processing tool 1800 shown in FIG. 18 (which may be substantially similar to tool 100, 2000 described above) may include an atmospherically sealed section 2010 and an atmospheric section 2005. The atmospheric section may include load ports 2015, robot 2020 and be coupled to the atmospherically sealed section 2010 through load locks 2035, 2040. The atmospherically sealed section 2010 may be in the form of a cluster type tool having processing modules 2025 arranged around a central chamber 2075. The central chamber 2075 may include a transfer apparatus 1801 for transferring substrates between the load locks 2035, 2040 and the processing modules 2025. The transfer apparatus 1801 includes the linkage arm 1810 which is mounted to a drive section 1801D at a linkage axis of rotation LX, a base member 1850 mounted to the linkage arm 1810 about a base member axis of rotation TX and arms 1860, 1861 mounted to the base member 1850 about respective shoulder axes SX1, SX2. It is noted that the base member 1850 may be substantially similar to base member 2050 or 2050' described above. The transfer apparatus 1801 may include a drive module 1801D substantially similar to those described above disposed at the link axis of rotation LX for rotationally driving at least the linkage arm 1810. In one aspect the drive module 1801D may include a coaxial shaft arrangement where one shaft drives rotation of the linkage arm 1810, one shaft drives rotation of the base member 1850 and one or more shafts drives rotation of upper arms UA of the arms 1860, 1861. Each drive shaft in the coaxial shaft arrangement may be coupled to a respective one of the linkage arm 1810, base member 1850 and upper arms UA in any suitable manner. For example, linkage arm 1810 may be directly driven by its respective drive shaft while the base member 1850 and upper arms UA are coupled to their respective drive shafts through suitable transmissions in manners substantially similar to those described above. In another aspect a single axis drive motor may be placed at each of the axis of rotation LX, TX, SX1, SX2 for rotationally driving a respective portion of the transfer apparatus 1801 in a manner substantially similar to that described above. Here rotation of the linkage arm 1810 about the axes LX allows the base member 1850 to be positioned as needed to align with the facet angles of the central chamber 2075. As may be realized the angle α between the shoulder axes SX1, SX2 may be dynamically adjustable, as described above, so that the end effectors of the arms 1860, 1861 can be aligned with the process module 2025 of load locks 2035, 2040 into which the end effector is extended into. In other aspects, additional motors may be provided to individually drive each arm link (e.g. the upper arm, forearm and end effector are individually rotatable) for accessing the process modules 2025 and load locks 2035, 2040.

Figure 19A:
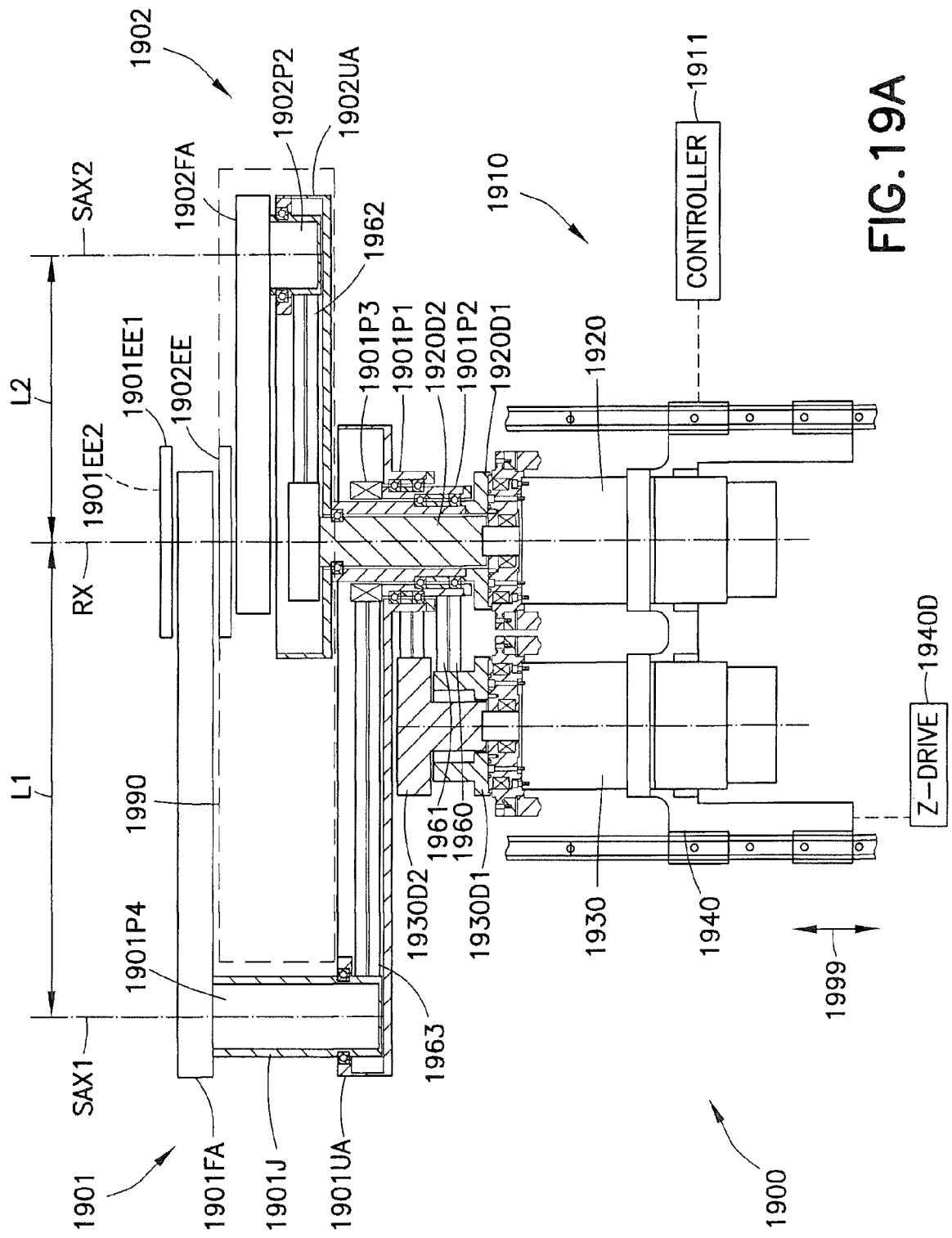
FIGS. 19A-19E are schematic illustrations of a substrate transport apparatus in accordance with an aspect of the disclosed embodiment.
Figure 19B:
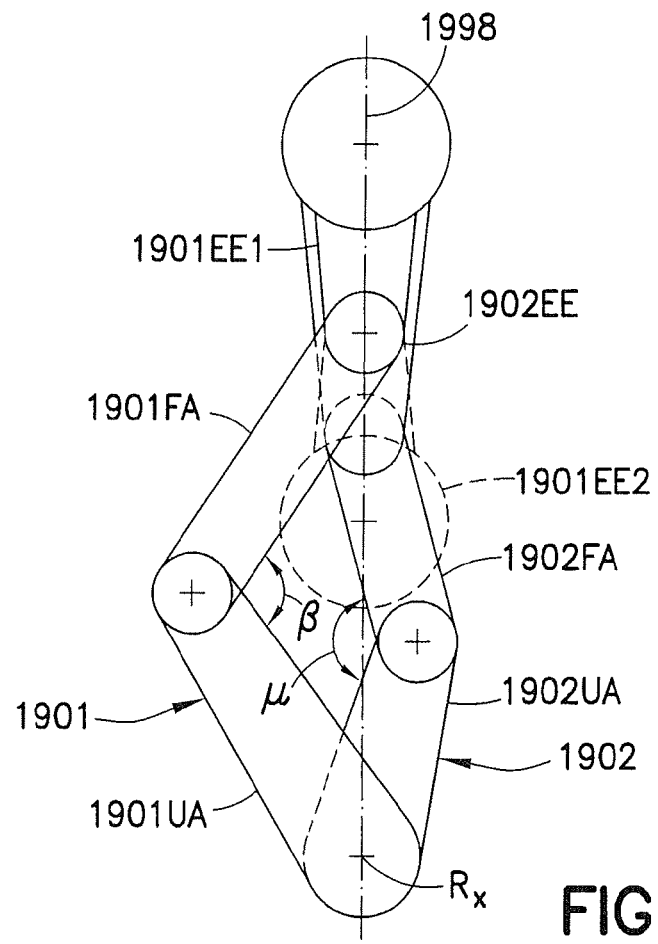
Figure 19C:
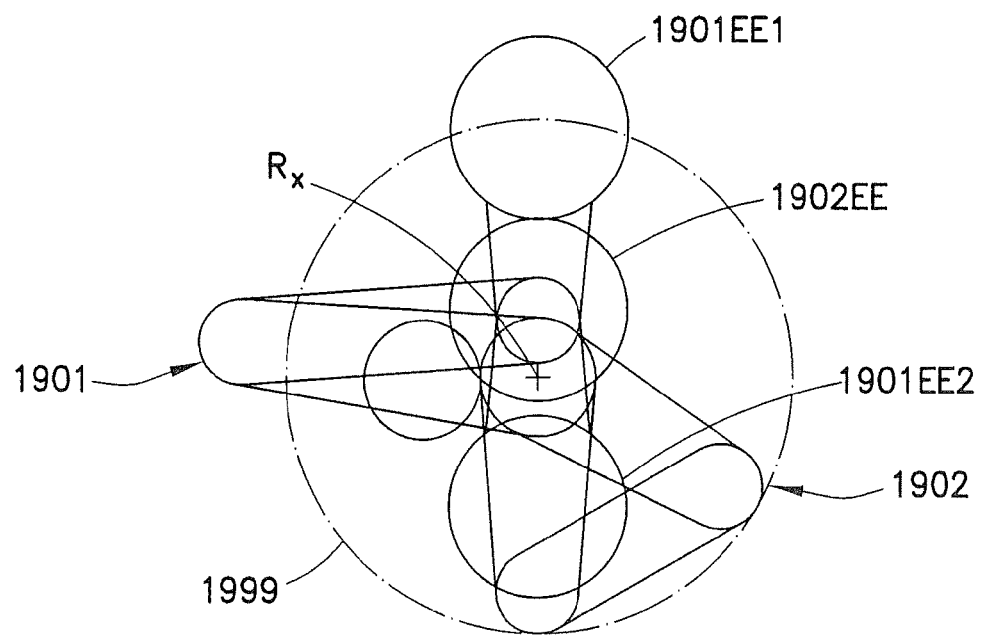
Figure 19D:
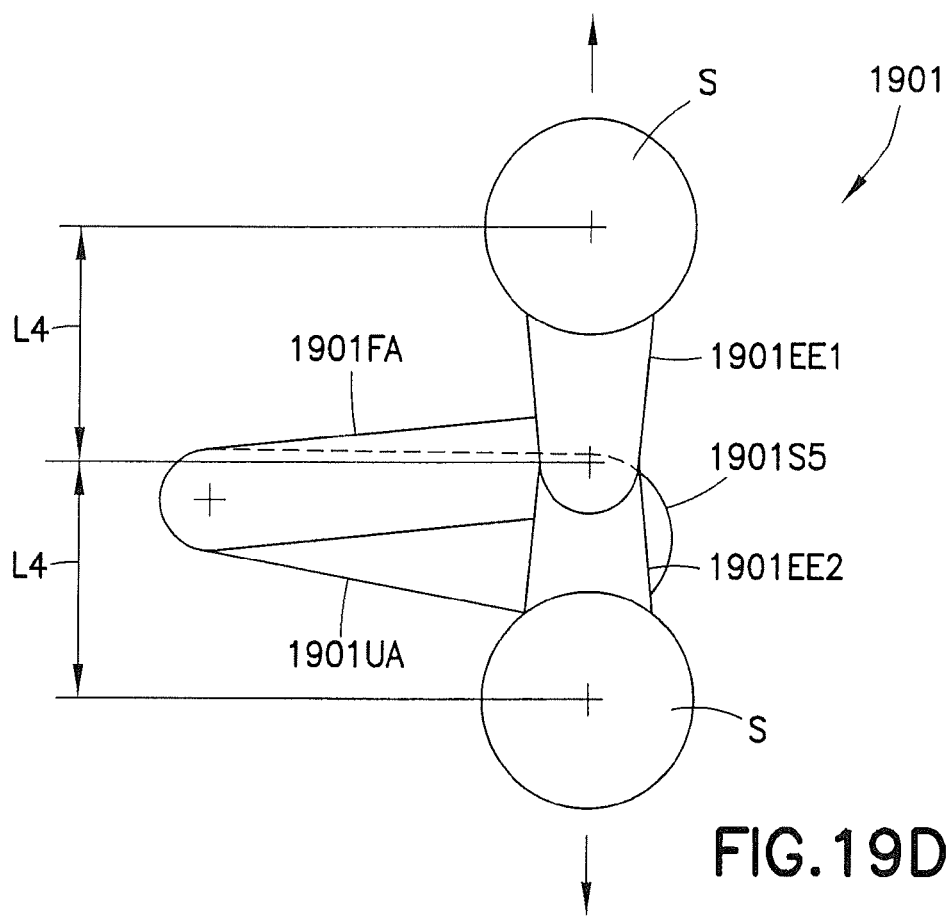
Figure 19E:
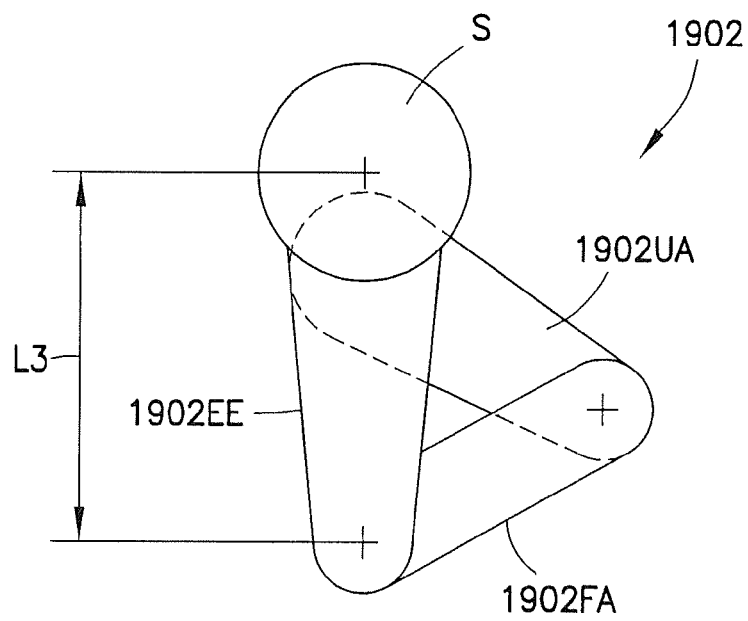

Referring to FIGS. 19A-19C in another aspect of the disclosed embodiment a dual arm transport apparatus 1900 is configured with dual SCARA arms 1901, 1902 and a drive system 1910. The drive system 1910 includes a tandem motor arrangement include two side by side motors 1920, 1930. The motors 1920, 1930 are coaxial shaft motors (e.g. the drive shafts are coaxial) that are mounted to a common lift frame 1940. In one aspect the motors 1920, 1930 may be substantially similar to the drive systems described above. In another aspect the motors 1920, 1930 may be harmonic drive motors. A Z-drive 1940D is connected to the lift frame 1940 for moving the motors 1920, 1930 and the robot arms 1901, 1902 along the Z-axis in the direction of arrow 1999. A coaxial shaft/pulley arrangement may be configured to support the arm assemblies in a manner substantially similar to that described above with respect to FIGS. 3C-3H. For example, a hollow outer shaft 1920D1 of motor 1920 may be directly connected to and support the upper arm 1902UA of arm 1902. An inner shaft 192D2 passes through the hollow outer shaft 1902D1 for coupling to pulley 1902P1 of arm 1902. Suitable bearings may be attached to the outer shaft 1920D1 and be configured to support the inner shaft 1902D2 and pulley 1901P2. Pulley 1901P2 is coupled to pulley 1901P3 of arm 1901 and may have a hollow center or aperture through which the outer shaft 1920D1 passes. Suitable bearings may be attached to pulley 1901P2 and be configured to support outer 1901P1 which is coupled directly to the upper arm 1901UA of arm 1901. The pulley 1901P1 may also have a hollow center or aperture through which the pulley 1901P2 passes for connection to the pulley 1901P3. The pulley 1901P2 may be coupled to an outer shaft 1930D1 of motor 1930 through any suitable transmission 1960, such as belts, bands, gears, etc. The pulley 1901P1 may be coupled to an inner shaft 1930D2 of the motor 1930 through any suitable transmission 1961, such as belts, bands, gears, etc. It is noted that the inner and outer shafts 1903D1, 1903D2 of the motor 1930 may have suitable pulleys mounted thereto for interfacing with respective transmissions 1960, 1961 and providing any suitable drive ratio between the drive shaft 1930D1, 1930D2 rotation and the pulley 1901P1, 1901P2 rotation.

As can be seen in FIG. 19A the arms 1901, 1902 both rotate about the common axis RX. The arms 1901, 1902 may be configured such that one of the arms 1902 has arm links 1902UA, 1902FA that are shorter in length than arm links 1901UA, 1901FA of the other arm 1901 so that arm 1902 is allowed to rotate within the elbow swing radius of arm 1901. This allows arm 1902 to rotate about axis RX indefinitely, while in a retracted configuration, regardless of the position of the arm 1901.

Arm 1901 includes upper arm 1901UA, forearm 1901FA rotatably coupled to the upper arm 1901UA by an offset joint 1901J, and at least one end effector 1901EE1, 1901EE2. As described above, the upper arm is driven directly by pulley 1901P1. The forearm 1901FA is driven by pulley 1901P3. Pulley 1901P3 is coupled through any suitable transmission 1963 to pulley 1901P4 which in turn is rotatably coupled to forearm 1901FA. The at least one end effector 1901EE1, 1901EE2 may be slaved such that as the arm 1901 extends and retracts the at least one end effector 1901EE1, 1901EE2 remains aligned with an axis of extension/retraction 1998. In this aspect the arm 1901 includes two opposing end effectors 1901EE1, 1901EE2 that are each configured to hold a substrate S. In one aspect where the end effector is slaved the arm 1901 may be configured to extend on either side of the shoulder joint 1901SJ to allow each end effector 1901EE1, 1901EE2 to transfer substrates to/from substrate holding locations. In other aspects, one or more additional drive axes may be added to motor 1930 along with a suitable transmission(s) for connecting the drive axes to the end effectors so that one or more of the end effectors can be rotated independent of the rotation of the upper arm 1901UA and forearm 1901FA. In other aspects the arm 1901 may include any suitable number of end effectors.

Arm 1902 includes upper arm 1902UA, forearm 1902FA rotatably coupled to the upper arm 1902UA, and end effector 1902EE. As described above, the upper arm is driven directly by drive shaft 1920D1. The forearm 1902FA is driven by drive shaft 1920D2 which is coupled to pulley 1902P1. Pulley 1902P1 may be connected to pulley 1902P2, which is rotatably coupled to the forearm 1902FA through any suitable transmission 1962. In one aspect, the end effector 1902EE may be slaved such that as the arm 1902 extends and retracts the end effector 1902EE remains aligned with an axis of extension/retraction 1998. It is noted that while only one axis of extension and retraction 1998 is shown in the figures it should be understood that each individually rotatable arm 1901, 1902 may have its own axis of extension and retraction. In other aspects, the arm 1902 may have more than one end effector where the multiple end effectors can be slaved or independently driven. It is noted that where the multiple end effectors are individually driven one or more additional drive axes may be added to motor 1920 along with a suitable transmission(s) for connecting the drive axes to multiple end effectors of arm 1902 so that one or more of the end effectors can be rotated independent of the rotation of the upper arm 1902UA and forearm 1902FA. It is noted that while end effectors 1901EE1, 1901EE2, 1902EE are shown as single substrate end effectors in other aspects the end effectors may be configured to hold more than one substrate either side by side or one above the other (see FIGS. 2P, 2Q).

The offset joint 1901J, upper arm 1901UA and forearm 1901FA of arm 1901 may form a containment zone 1990 for the arm 1902. For example, the offset joint 1901J may be of sufficient length or height such that the upper arm 1902UA, forearm 1902FA and end effector 1902EE of arm 1902 fit between upper arm 1901UA and forearm 1901FA of arm 1901. The arm length from joint center to joint center or the distance L1 between the common axis of rotation RX and the shoulder axis SAX1 of arm 1901 may also be greater than arm length from joint center to joint center or the distance L2 between the common axes of rotation RX and the shoulder axis SAX 2 of arm 1902 so that the arm 1902 is free to rotate indefinitely (at least with the arm 1902 in a retracted configuration) within the containment zone 1999 without interference from the arm 1901.

It is noted that the length of the end effectors 1901EE, 1902EE1, 1902EE2 can be any suitable length to allow both arms 1901, 1902 to reach each of the process modules, load locks or other substrate holding stations which the robot 1900 serves. For example, the length L3 of effector 1902EE may be greater than the length L4 of the end effectors 1901EE1, 1901EE2 of arm 1901 to compensate for the shorter length upper arm 1902UA and forearm 1902FA. In other aspects the end effector lengths L3, L4 may be substantially equal where the center of rotation RX of the arms 1901, 1902 is located sufficiently close to the substrate holding stations such that the longer arm 1901 only partially extends to transfer substrates to/from the holding stations. It is noted that when extended into the substrate holding station the angle β between the arm links 1901FA, 1901UA of arm 1901 may be less than the angle μ between arm links 1902FA, 1902UA of arm 1902 (see FIG. 19B) as, for example, a result of the difference in link length and or the length of the end effectors.

A controller 1911 may be connected to the transport apparatus 1900. The controller may be substantially similar to controller 170 described above. The controller 1911 may be configured to operate the transport apparatus such that when one arm 1901, 1902 is transferring a substrate to a substrate holding station the other arm is independently rotated and aligned (without extending the arm) with the same or a different substrate holding station to anticipate or prepare for the next substrate transfer. For example, referring to FIG. 1, if the transfer apparatus 1900 (transfer robot 130 in FIG. 1) is to transfer a substrate to process module PM6 and then pick a substrate from load lock 140 a first one of the arms 1901, 1902 may extend into process module PM6 for transferring the substrate while a second one of the arms 1901, 1902 is independently rotated so that the end effector is aligned with the load lock module 140 to allow for a substantially immediate extension of the second arm 1901, 1902 into load lock 140 once the first arm retracts from process module PM6.

In one aspect a substrate processing apparatus includes a frame, a first SCARA arm connected to the frame, the first SCARA arm includes an end effector and is configured to extend and retract along a first radial axis, a second SCARA arm connected to the frame, the second SCARA arm includes an end effector and is configured to extend and retract along a second radial axis, the first and second SCARA arms having a common shoulder axis of rotation, and a drive section coupled to the first and second arms, the drive section being configured to independently extend each of the first and second SCARA arms along a respective radial axis and rotate each of the first and second SCARA arms about the common shoulder axis of rotation where the first radial axis is angled relative to the second radial axis and the end effector of a respective arm is aligned with a respective radial axis, wherein each end effector is configured to hold at least one substrate and the end effectors are located on a common transfer plane.

In one aspect the substrate processing apparatus of claim further includes a controller connected to the drive section and configured to effect operation of the drive section to substantially prevent interference between the first and second SCARA arms during transport of the respective at least one substrate.

In one aspect the drive section comprises a four degree of freedom drive system.

In one aspect the drive section includes a coaxial drive shaft arrangement.

In one aspect the first SCARA arm includes an upper arm connected to the drive section at the common shoulder axis, a forearm connected to the upper arm at an elbow axis and the end effector is coupled to the forearm at a wrist axis, and the second SCARA arm includes an upper arm connected to the drive section at the common shoulder axis, a forearm connected to the upper arm at an elbow axis and the end effector is coupled to the forearm at a wrist axis.

In one aspect the forearms are arranged relative to each other in an opposed configuration such that the forearm of the first SCARA arm is located on an upper surface of a respective upper arm and the forearm of the second SCARA arm is located on a bottom surface of a respective upper arm.

In one aspect the drive section comprises a three degree of freedom drive system connected to the first and second SCARA arms such that an angle between an upper arm of the first SCARA arm and an upper arm of the second SCARA arm is substantially fixed when the arms are rotated about the common shoulder axis.

In one aspect each of the end effectors is mounted to a respective arm such that an angle between the end effectors substantially matches an angle between radially adjacent substrate holding stations accessible by each arm.

In one aspect the substrate processing apparatus further includes a controller connected to at least the drive section and at least one sensor connected to the controller, the controller being configured to obtain substrate detection signals from the at least one sensor and apply an offset to a position of an end effector of one of the first and second arms, wherein the offset is calculated depending on thermal expansion of at least the substrate transport apparatus.

In one aspect the first arm is configured to allow the second arm to pass between an upper arm and forearm of the first arm.

In another aspects a substrate processing apparatus includes a frame, a first SCARA arm connected to the frame, the first SCARA arm includes an upper arm, a forearm rotatably coupled to the upper arm and an end effector rotatably coupled to the forearm where the upper arm and forearm have unequal lengths, the first SCARA arm being configured to extend and retract along a first radial axis, a second SCARA arm connected to the frame, the second SCARA arm includes an upper arm, a forearm rotatably coupled to the upper arm and an end effector rotatably coupled to the forearm where the upper arm and forearm have unequal lengths, the second SCARA arm being configured to extend and retract along a second radial axis, the upper arms of the first and second SCARA arms having a common shoulder axis of rotation, and a drive section coupled to the first and second arms, the drive section being configured to independently extend each of the first and second SCARA arms along a respective radial axis and rotate each of the first and second SCARA arms about the common shoulder axis of rotation where the first radial axis is angled relative to the second radial axis and the end effector of a respective arm is aligned with a respective radial axis, wherein each end effector is configured to hold at least one substrate and the end effectors are located on a common transfer plane.

In one aspect the drive section comprises a three degree of freedom drive system connected to the first and second SCARA arms such that an angle between an upper arm of the first SCARA arm and an upper arm of the second SCARA arm is substantially fixed when the arms are rotated about the common shoulder axis.

In one aspect each of the end effectors is mounted to a respective arm such that an angle between the end effectors substantially matches an angle between radially adjacent substrate holding stations accessible by each arm.

In one aspect the substrate processing apparatus further includes a controller connected to the drive section and configured to effect operation of the drive section to substantially prevent interference between the first and second SCARA arms during transport of the respective at least one substrate.

In one aspect the drive section comprises a four degree of freedom drive system.

In accordance with another aspect of the disclosed embodiment a substrate processing apparatus is provided. The substrate processing apparatus includes a common drive section disposed in a common drive casing, a first arm coupled to the common drive section, a second arm coupled to the common drive section, where each of the first and second arms includes an end effector and the end effectors are disposed in substantially the same plane, the first and second arms being configured for independent extension, retraction and rotation where each of the first and second arms is configured so that the common drive section is capable of driving the first and second arms through more than three-hundred-sixty degrees of rotation about a respective shoulder axis, and a controller connected to the drive section and configured to control the drive section to drive the arms through more than three-hundred-sixty degrees of rotation about the respective shoulder axes and for extending and retracting the arms, the controller being configured to recognize when rotation of the arms will result in interference between the arms and position at least one of the first and second arms so that an axis of extension and retraction of at least one of the first and second arms is within a region substantially without interference with another of the first and second arms, and provide nearly simultaneous picking and placing of substrates with the first and second arms.

In accordance with an aspect of the disclosed embodiment the drive section is a four degree of freedom drive having four concentric drive shafts.

In accordance with an aspect of the disclosed embodiments the four concentric drive shafts are radially and axially supported by a nested bearing arrangement where at least a portion of one bearings is mounted to a portion of another one of the bearings.

In accordance with an aspect of the disclosed embodiment, each arm includes an upper arm link and a forearm link wherein the upper arm links are a different length than the forearm links.

In accordance with an aspect of the disclosed embodiment, the first arm is configured to allow the second arm to pass between an upper arm and forearm of the first arm.

In accordance with an aspect of the disclosed embodiment each arm includes an end effector configured to support at least one substrate.

In accordance with another aspect of the disclosed embodiment a substrate processing apparatus includes at least one transport arm, and a drive section, the drive section including a nested bearing arrangement and a coaxial drive shaft assembly where the nested bearing arrangement includes concentrically stacked bearings configured to radially and axially support the drive shaft assembly.

In one aspect the bearings are configured such that at least one inner race of one bearing is coupled to an outer race of another bearing.

In one aspect the drive section is a three degree of freedom drive system.

In one aspect the drive section is a four degree of freedom drive section.

In one aspect an outer race of an outermost bearing in the concentrically stacked bearings is coupled to a housing of the drive system and configured to support the drive shaft assembly and other bearings in the concentrically stacked bearings.

In one aspect the substrate processing apparatus further includes ferrofluidic seals disposed between the drive shafts of the drive shaft assembly for sealing an atmosphere within a housing of the drive system from an atmosphere in which the first and second arms are disposed.

In one aspect the at least one transport arm includes two transport arms each having an end effector, where the end effectors are disposed in the same plane.

In one aspect the at least one transport arm includes two transport arms each having an end effector, where the end effectors are disposed in different planes.

In another aspect of the disclosed embodiment a substrate processing apparatus includes a drive section, a substantially rigid base member coupled to and supported by the drive section about a first axis of rotation, the substantially rigid base member including a first arm section and a second arm section that are releasably coupled to each other at the first axis of rotation to form a substantially rigid link where the first and second arm sections are incapable of movement relative to one another during substrate transport, a first transport arm rotatably mounted to and supported by one of the first and second arm section of the base member about a second axis of rotation different from the first axis of rotation, the first transport arm including at least one end effector, and a second transport arm rotatably mounted to and supported by another one of the first and second arm section of the base member about a third axis of rotation different from the first and second axes of rotation, the second transport arm including at least one end effector, wherein the at least one end effector of the first arm and the at least one end effector of the second arm have a common substrate transport plane and the releasable coupling adjustably joins the first and second arm sections to each other at the common axis of rotation for changing a predetermined angle of extension and retraction between the first transport arm and the second transport arm.

In one aspect the drive section is configured to rotate the base member and the first and second transport arms as a unit about the first axis and independently extend and retract each of the first and second transport arms.

In one aspect the drive section is configured to rotate the base member and the first and second transport arms as a unit about the first axis and simultaneously extend and retract the first and second transport arms such that extension and retraction of the first transport arm is coupled to the extension and retraction of the second transport arm.

In one aspect the drive section is configured move the base member and the first and second transport arms in a direction substantially parallel to at least the first axis of rotation.

In one aspect the substrate processing apparatus further includes substrate holding stations wherein the angle between the axis of extension of the first transport arm and the axis of extension of the second transport arm is substantially the same as an angle between adjacent substrate holding stations.

In one aspect the drive section includes at least a first and second drive axis comprising the releasable coupling where when coupled the first and second drive axes are driven in the same direction at substantially the same speed and when released at least one of the first and second drive axis is driven independent of the other one of the first and second drive axis.

In one aspect the releasable coupling comprises mechanical fasteners.

In one aspect the substrate processing apparatus further includes an extension arm, wherein a first end of the extension arm is rotatably coupled to the drive section and the base member is rotatably coupled to and supported by a second end of the extension arm.

In one aspect the drive section includes a motor configured to move one of the first and second transport arm in a direction substantially parallel to a respective one of the second and third axes independently of movement of the other one of the first and second transport arm in the direction substantially parallel to the respective one of the second and third axes.

In one aspect the drive section further comprises a lift motor configured to move the base member and both the first and second transport arms as a unit in the direction substantially parallel to a respective one of the second and third axes.

In one aspect the drive section includes single axis motors disposed at each of the first, second and third axes.

In one aspect each of the first and second transport arms includes an upper arm link rotatably mounted to the base member and connected to the drive system for rotating the upper arm, a forearm link rotatably mounted to the upper arm link, and the at least one end effector is rotatably mounted to the forearm link, the at least one end effector being slaved to rotation of the upper arm link through a transmission system where the transmission system includes a pulley disposed at a respective one of the second and third axes and the pulley is fixedly coupled to the base member.

In another aspect of the disclosed embodiment a substrate processing apparatus includes a drive section, a substantially rigid base member coupled to and supported by the drive section about a first axis of rotation, a first transport arm rotatably mounted to the base member, a second transport arm rotatably mounted to the base member, wherein the base member is configured to effect movement of one of the first and second transport arm in a direction substantially perpendicular to a respective axis of extension and retraction substantially independently of movement of the other one of the first and second transport arm in the direction substantially parallel to the respective axis of extension and retraction.

In one aspect the substantially rigid base member includes a first arm section and a second arm section that are releasably coupled to each other at the first axis of rotation to form a substantially rigid link where the first and second arm sections are incapable of movement relative to one another during substrate transport.

In one aspect at least one end effector of the first arm and at least one end effector of the second arm have a common substrate transport plane and the releasable coupling adjustably joins the first and second arm sections to each other at the first axis of rotation for changing a predetermined angle of extension and retraction between the first transport arm and the second transport arm.

In one aspect the first transport arm is rotatably mounted to and supported by one of the first and second arm sections of the base member about a second axis of rotation different from the first axis of rotation, and the second transport arm is rotatably mounted to and supported by another one of the first and second arm sections of the base member about a third axis of rotation different from the first and second axes of rotation.

In another aspect of the disclosed embodiment a substrate processing apparatus includes a frame, a drive section connected to the frame, the drive section having a drive axis of rotation, a first arm including an upper arm link connected to the drive section for rotation about the drive axis of rotation, a forearm link rotatably coupled to the upper arm link about an elbow axis and an end effector rotatably coupled to the forearm link about a wrist axis, and a second arm including an upper arm link connected to the drive section for rotation about the drive axis of rotation, a forearm link rotatably coupled to the upper arm link about an elbow axis and an end effector rotatably coupled to the forearm link about a wrist axis, wherein the first arm is configured so that the second arm is rotatable about the drive axis of rotation in a retracted configuration between the upper arm and forearm of the first arm independent of a position of the first arm.

In one aspect the drive section includes a coaxial shaft arrangement configured to connect the first and second arms to the drive section.

In one aspect the coaxial shaft arrangement includes an inner shaft, an outer shaft, a first intermediary shaft and a second intermediary shaft, the inner shaft and first intermediary shaft drive the second arm and the second intermediary shaft and outer shaft drive the first arm, and the first intermediary shaft is configured to axially support the second intermediary shaft and the second intermediary shaft is configured to axially support the outer shaft.

In one aspect the drive section further comprises at least two side by side motors coupled to the coaxial shaft arrangement.

In one aspect each of the at least two side by side motors comprises a multi-degree of freedom motor.

In one aspect each of the at least two side by side motors are harmonic drives.

In one aspect the substrate processing apparatus further includes substrate holding locations connected to the frame and a controller, the controller being configured to independently rotate one of the first and second arms to align an end effector of the one of the first and second arms with a substrate holding station while the other one of the first and second arms is transferring a substrate to the same or a different substrate holding station to anticipate a subsequent substrate transfer.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
   a frame;
   a first SCARA arm connected to the frame, the first SCARA arm includes an end effector and is configured to extend and retract along a first radial axis;
   a second SCARA arm connected to the frame, the second SCARA arm includes an end effector and is configured to extend and retract along a second radial axis, the first and second SCARA arms each having a respective shoulder axis of rotation and being disposed on a common base; and
   a drive section coupled to the first and second arms, the drive section being configured to
   independently extend each of the first and second SCARA arms along a respective radial axis and rotate each of the first and second SCARA arms with respect to the common base where the first radial axis is angled relative to the second radial axis and the end effector of a respective arm is aligned with a respective radial axis, and independently move at least an arm portion of one SCARA arm of the first and second SCARA arms along a lift axis, where the lift axis is transverse to the first and second radial axes so that at least the arm portion of the one SCARA arm of the first and second SCARA arms moves along the lift axis independent of at least another arm portion of another SCARA arm of the first and second SCARA arms;

wherein each end effector is configured to hold at least one substrate.

2. The substrate processing apparatus of claim 1, wherein the first and second SCARA arms are disposed so that an extension axis of the first SCARA arm delimits an angular orientation of an extension axis of the second SCARA arm about the respective shoulder axis of the second SCARA arm.

3. The substrate processing apparatus of claim 1, wherein the end effector of the first SCARA arm and the end effector of the second SCARA arm each comprise two substrate holders.

4. The substrate processing apparatus of claim 1, further comprising a controller connected to the drive section and configured to effect operation of the drive section to substantially prevent interference between the first and second SCARA arms during transport of the respective at least one substrate.

5. The substrate processing apparatus of claim 1, wherein the drive section comprises a four degree of freedom drive system.

6. The substrate processing apparatus of claim 1, wherein the drive section includes a coaxial drive shaft arrangement.

7. The substrate processing apparatus of claim 1, wherein:
the first SCARA arm includes an upper arm connected to the drive section at the respective shoulder axis of rotation of the first SCARA arm, a forearm connected to the upper arm at an elbow axis and the end effector is coupled to the forearm at a wrist axis; and
the second SCARA arm includes an upper arm connected to the drive section at the respective shoulder axis of rotation of the second SCARA arm, a forearm connected to the upper arm at an elbow axis and the end effector is coupled to the forearm at a wrist axis.

8. The substrate processing apparatus of claim 6, wherein the forearms are arranged relative to each other in an opposed configuration such that the forearm of the first SCARA arm is located on an upper surface of a respective upper arm and the forearm of the second SCARA arm is located on a bottom surface of a respective upper arm.

9. The substrate processing apparatus of claim 1, wherein the drive section comprises a three degree of freedom drive system connected to the first and second SCARA arms such that an angle between an upper arm of the first SCARA arm and an upper arm of the second SCARA arm is substantially fixed when the arms are rotated with respect to the common base.

10. The substrate processing apparatus of claim 1, wherein each of the end effectors is mounted to a respective arm such that an angle between the end effectors substantially matches an angle between radially adjacent substrate holding stations accessible by each arm.

11. The substrate processing apparatus of claim 1, further comprising a controller connected to at least the drive section and at least one sensor connected to the controller, the controller being configured to obtain substrate detection signals from the at least one sensor and apply an offset to a position of an end effector of one of the first and second arms, wherein the offset is calculated depending on thermal expansion of at least the substrate transport apparatus.

12. The substrate processing apparatus of claim 1, wherein the first arm is configured to allow the second arm to pass between an upper arm and forearm of the first arm.

13. The substrate processing apparatus of claim 1, wherein the respective shoulder axis of rotation of the first and second SCARA arms are disposed along a common shoulder axis of rotation.

14. The substrate processing apparatus of claim 1, wherein the common base includes a first member and a second member wherein the first and second members are joined at a common end.

15. A substrate processing apparatus comprising:
a frame;
a first SCARA arm connected to the frame, the first SCARA arm includes an end effector and is configured to extend and retract along a first radial axis;
a second SCARA arm connected to the frame, the second SCARA arm includes an end effector and is configured to extend and retract along a second radial axis;
a base arm fixed at one end with respect to the frame and including at least one arm pivot link extending in a plane parallel to the first and second SCARA arms, the first SCARA arm and the second SCARA each having a respective shoulder axis of rotation disposed on a common end of the pivot link of the base arm; and
a drive section coupled to the base arm, the first arm and the second arm, where the base arm is rotatably coupled to the drive section at a base arm axis of rotation and the drive section is configured to
rotate the base arm about the base arm axis of rotation,
independently extend each of the first and second SCARA arms along a respective radial axis, and
rotate each of the first and second SCARA arms with respect to the base arm where the first radial axis is angled relative to the second radial axis and the end effector of a respective arm is aligned with a respective radial axis;
wherein each end effector is configured to hold at least one substrate and the first and second SCARA arms are disposed so that the first radial axis of the first SCARA arm positions the first SCARA arm so that the position of the first SCARA arm delimits an angular orientation of the second radial axis of the second SCARA arm about the respective shoulder axis of the second SCARA arm.

16. The substrate processing apparatus of claim 15, further comprising a controller connected to the drive section and configured to effect operation of the drive section to substantially prevent interference between the first and second SCARA arms during transport of the respective at least one substrate.

17. The substrate processing apparatus of claim 15, wherein the drive section comprises a four degree of freedom drive system.

18. The substrate processing apparatus of claim 15, wherein the drive section includes a coaxial drive shaft arrangement.

19. The substrate processing apparatus of claim 15, wherein:
the first SCARA arm includes an upper arm connected to the drive section at the respective shoulder axis of rotation, a forearm connected to the upper arm at an elbow axis and the end effector is coupled to the forearm at a wrist axis; and the second SCARA arm includes an upper arm connected to the drive section at the respective shoulder axis of rotation, a forearm connected to the upper arm at an elbow axis and the end effector is coupled to the forearm at a wrist axis.

20. The substrate processing apparatus of claim 19, wherein the forearms are arranged relative to each other in an opposed configuration such that the forearm of the first SCARA arm is located on an upper surface of a respective upper arm and the forearm of the second SCARA arm is located on a bottom surface of a respective upper arm.

21. The substrate processing apparatus of claim 15, wherein the drive section comprises a three degree of freedom drive system connected to the first and second SCARA arms such that an angle between an upper arm of the first SCARA arm and an upper arm of the second SCARA arm is substantially fixed when the arms are rotated with respect to the base arm.

22. The substrate processing apparatus of claim 15, wherein each of the end effectors is mounted to a respective arm such that an angle between the end effectors substantially matches an angle between radially adjacent substrate holding stations accessible by each arm.

23. The substrate processing apparatus of claim 15, further comprising a controller connected to at least the drive section and at least one sensor connected to the controller, the controller being configured to obtain substrate detection signals from the at least one sensor and apply an offset to a position of an end effector of one of the first and second arms, wherein the offset is calculated depending on thermal expansion of at least the substrate transport apparatus.

24. The substrate processing apparatus of claim 15, wherein the first arm is configured to allow the second arm to pass between an upper arm and forearm of the first arm.

25. The substrate processing apparatus of claim 15, wherein the respective shoulder axis of rotation of the first and second SCARA arms are disposed along a common shoulder axis of rotation.

26. The substrate processing apparatus of claim 15, wherein the drive section is further configured to independently move at least a portion of each of the first and second SCARA arms along a lift axis, where the lift axis is transverse to the first and second radial axes.

27. A substrate processing apparatus comprising:
a frame;
a first SCARA arm connected to the frame, the first SCARA arm includes an end effector and is configured to extend and retract along a first radial axis;
a second SCARA arm connected to the frame, the second SCARA arm includes an end effector and is configured to extend and retract along a second radial axis, the first and second SCARA arms each having a respective shoulder axis of rotation and being disposed on a common base;
a drive section coupled to the first and second arms, the drive section being configured to independently extend each of the first and second SCARA arms along a respective radial axis and rotate each of the first and second SCARA arms with respect to the common base where the first radial axis is angled relative to the second radial axis and the end effector of a respective arm is aligned with a respective radial axis;
a controller connected to the drive section and configured to effect operation of the drive section and recognize when rotation of the first and second SCARA arms will result in interference between the first and second SCARA arms so that an axis of extension and retraction of at least one of first and second SCARA arms is within a region substantially without interference with another of the first SCARA arm and the second SCARA arm; and
wherein each end effector is configured to hold at least one substrate.

28. The substrate processing apparatus of claim 27, wherein the drive section is further configured to independently move at least a portion of one of the first and second SCARA arms along a lift axis, where the lift axis is transverse to the first and second radial axes.

29. The substrate processing apparatus of claim 27, wherein the common base includes a first portion and a second portion that are joined at a common end and angularly adjustable relative to each other, the first SCARA arm being disposed on one of the first portion and second portion and the second SCARA arm being disposed on another one of the first portion and second portion.

* * * * *